(12) United States Patent
Widmer

(10) Patent No.: US 7,292,161 B2
(45) Date of Patent: Nov. 6, 2007

(54) NB/MB CODING APPARATUS AND METHOD USING BOTH DISPARITY INDEPENDENT AND DISPARITY DEPENDENT ENCODED VECTORS

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/140,778

(22) Filed: May 31, 2005

(65) Prior Publication Data

US 2006/0267810 A1 Nov. 30, 2006

(51) Int. Cl.
*H03M 7/00* (2006.01)

(52) U.S. Cl. .......................... 341/59; 341/58

(58) Field of Classification Search ............... 341/58, 341/59, 100, 50, 51, 94, 95, 102, 106, 158; 714/752, 753, 808, 746, 800; 375/242, 292; 360/40; 709/232; 713/168
See application file for complete search history.

(56) References Cited

U.S. PATENT DOCUMENTS

| | | | | |
|---|---|---|---|---|
| 4,486,739 | A | 12/1984 | Franaszek et al. | 341/59 |
| 4,517,552 | A | 5/1985 | Shirota et al. | |
| 4,598,326 | A * | 7/1986 | Leiner | 360/40 |
| 5,245,339 | A | 9/1993 | Cideciyan | 341/95 |
| 5,387,911 | A | 2/1995 | Gleichert et al. | |
| 5,699,062 | A | 12/1997 | Widmer | 341/58 |
| 5,740,186 | A | 4/1998 | Widmer | 714/753 |
| 5,784,387 | A | 7/1998 | Widmer | 714/752 |
| 5,825,824 | A * | 10/1998 | Lee et al. | 375/292 |
| 5,974,464 | A * | 10/1999 | Shin et al. | 709/231 |
| 6,198,413 | B1 * | 3/2001 | Widmer | 341/59 |
| 6,225,924 | B1 | 5/2001 | Epshtein et al. | 341/106 |
| 6,304,196 | B1 * | 10/2001 | Copeland et al. | 341/58 |
| 6,351,501 | B1 * | 2/2002 | Murdock | 375/292 |
| 6,362,757 | B1 * | 3/2002 | Lee et al. | 341/102 |
| 6,429,794 | B1 * | 8/2002 | Widmer et al. | 341/100 |
| 6,469,645 | B2 * | 10/2002 | Coene | 341/59 |
| 6,496,540 | B1 | 12/2002 | Widmer | 375/242 |
| 6,501,396 | B1 * | 12/2002 | Kryzak et al. | 341/59 |
| 6,574,731 | B1 * | 6/2003 | Coles et al. | 713/168 |
| 6,614,369 | B1 * | 9/2003 | Widmer | 341/59 |

(Continued)

OTHER PUBLICATIONS

Cideciyan, "Attractive Line Codes for High-Speed LANs and MANs and Their Realization," IBM, (all pages), date unknown.

(Continued)

*Primary Examiner*—Rexford Barnie
*Assistant Examiner*—Joseph Lauture
(74) *Attorney, Agent, or Firm*—Ryan, Mason & Lewis, LLP

(57) ABSTRACT

Techniques for encoding N-binary symbol (NB) source data vectors into M-binary symbol (MB) encoded vectors, M>N>0, are provided. Techniques for decoding are also provided. Exemplary coding and decoding apparatuses are presented, as is an exemplary 8B/10B encoding scheme. Encoded vectors may be disparity dependent or disparity independent. In assigning encoded vectors that have one or more individual binary symbol changes compared with their source data vectors, preference can be given to encoded vectors that are balanced and disparity independent. Whole-vector complementation and individual changes of one or more binary symbols can advantageously be performed substantially in parallel.

29 Claims, 58 Drawing Sheets

U.S. PATENT DOCUMENTS

| | | | |
|---|---|---|---|
| 6,876,315 B1 | 4/2005 | Widmer | 341/158 |
| 6,911,921 B2* | 6/2005 | Widmer | 341/58 |
| 6,977,599 B2 | 12/2005 | Widmer | 341/59 |
| 6,978,416 B2 | 12/2005 | Widmer | 714/800 |
| 2004/0123222 A1 | 6/2004 | Widmer | 714/746 |
| 2005/0062621 A1 | 3/2005 | Widmer | 341/58 |

OTHER PUBLICATIONS

Widmer, "ANSI Fibre Channel Transmission Code," IBM, Apr. 23, 1993, pp. 1-40.

ANONYMOUS, "A laser driver circuit for high speed switching applications", Research Disclosure 431162, XP-002231278, IBM, Mar. no date 2000, pp. 575-577.

Martin, "Rate 8/10 DC Balanced Code with Local Parity," IBM Technical Disclosure Bulletin, Feb. no date 1985, pp. 5272-5279, vol. 27, No. 9.

OIF-99.120, "Proposal for a Very Short Reach (VSR) OC-192/STM-64 Interface Based on Parallel Optics," Version 2.1, Optical Internetworking Forum, Oct. no date 1999, pp. 1-12.

* cited by examiner

TRELLIS NODE NOTATION AND NUMBER OF VECTORS TO NODES FOR UP TO 10 BITS

FIG. 20

TWENTY-SEVEN BALANCED DISPARITY INDEPENDENT VECTORS BU3c'5c'7c'3t'

| Name | abcdefghij | Name | abcdefghij | Name | abcdefghij |
|------|------------|------|------------|------|------------|
| D171 | 1101010100 | D203 | 1101001100 | D241 | 1000111100 |
| D173 | 1011010100 | D205 | 1011001100 | D242 | 0100111100 |
| D174 | 0111010100 | D206 | 0111001100 | D244 | 0010111100 |
| D179 | 1100110100 | D211 | 1100101100 | D227 | 1100011100 |
| D181 | 1010110100 | D213 | 1010101100 | D229 | 1010011100 |
| D182 | 0110110100 | D214 | 0110101100 | D230 | 0110011100 |
| D185 | 1001110100 | D217 | 1001101100 | D233 | 1001011100 |
| D186 | 0101110100 | D218 | 0101101100 | D234 | 0101011100 |
| D188 | 0011110100 | D220 | 0011101100 | D236 | 0011011100 |

FIG. 21

TWENTY-SEVEN BALANCED DISPARITY INDEPENDENT VECTORS BM3c'3t'5t'7t'IJ

| Name | abcdefghij | Name | abcdefghij | Name | abcdefghij |
|------|------------|------|------------|------|------------|
| D11 | 1101000011 | D49 | 1000110011 | D81 | 1000101011 |
| D13 | 1011000011 | D50 | 0100110011 | D82 | 0100101011 |
| D14 | 0111000011 | D52 | 0010110011 | D84 | 0010101011 |
| D19 | 1100100011 | D35 | 1100010011 | D67 | 1100001011 |
| D21 | 1010100011 | D37 | 1010010011 | D69 | 1010001011 |
| D22 | 0110100011 | D38 | 0110010011 | D70 | 0110001011 |
| D25 | 1001100011 | D41 | 1001010011 | D73 | 1001001011 |
| D26 | 0101100011 | D42 | 0101010011 | D74 | 0101001011 |
| D28 | 0011100011 | D44 | 0011010011 | D76 | 0011001011 |

FIG. 22

SIXTY BALANCED DISPARITY INDEPENDENT VECTORS BB3c'3t'I

| Name | abcdefghij | Name | abcdefghij | Name | abcdefghij | Name | abcdefghij |
|---|---|---|---|---|---|---|---|
| D27 | 1101100010 | D43 | 1101010010 | D75 | 1101001010 | D139 | 1101000110 |
| D29 | 1011100010 | D45 | 1011010010 | D77 | 1011001010 | D141 | 1011000110 |
| D30 | 0111100010 | D46 | 0111010010 | D78 | 0111001010 | D142 | 0111000110 |
| D51 | 1100110010 | D99 | 1100011010 | D163 | 1100010110 | | |
| D53 | 1010110010 | D101 | 1010011010 | D165 | 1010010110 | | |
| D54 | 0110110010 | D102 | 0110011010 | D166 | 0110010110 | | |
| D57 | 1001110010 | D105 | 1001011010 | D169 | 1001010110 | | |
| D58 | 0101110010 | D106 | 0101011010 | D170 | 0101010110 | | |
| D60 | 0011110010 | D108 | 0011011010 | D172 | 0011010110 | | |
| D83 | 1100101010 | D147 | 1100100110 | D195 | 1100001110 | | |
| D85 | 1010101010 | D149 | 1010100110 | D197 | 1010001110 | | |
| D86 | 0110101010 | D150 | 0110100110 | D198 | 0110001110 | | |
| D89 | 1001101010 | D153 | 1001100110 | D201 | 1001001110 | | |
| D90 | 0101101010 | D154 | 0101100110 | D202 | 0101001110 | | |
| D92 | 0011101010 | D156 | 0011100110 | D204 | 0011001110 | | |
| D113 | 1000111010 | D177 | 1000110110 | D209 | 1000101110 | D225 | 1000011110 |
| D114 | 0100111010 | D178 | 0100110110 | D210 | 0100101110 | D226 | 0100011110 |
| D116 | 0010111010 | D180 | 0010110110 | D212 | 0010101110 | D228 | 0010011110 |

FIG. 23

TWENTY-FOUR BALANCED DISPARITY DEPENDENT VECTORS

| Name | abcdefghij | Coding Class | Name | abcdefghij | Coding Class |
|---|---|---|---|---|---|
| D155P | 1101100100 | PU3u5c7u | D87P | 1110101000 | PU2m'4c'6u7c |
| D157P | 1011100100 | PU3u5c7u | D91P | 1101101000 | PU2m'4c'6u7c |
| D158P | 0111100100 | PU3u5c7u | D93P | 1011101000 | PU2m'4c'6u7c |
| D151P | 1110100100 | PU3c4u7u | D94P | 0111101000 | PU2m'4c'6u7c |
| D167P | 1110010100 | PU3c4u7u | D103P | 1110011000 | PU2m'4c'6u7c |
| D199P | 1110001100 | PU3c4u7u | D107P | 1101011000 | PU2m'4c'6u7c |
| D23P | 1110100001 | PB3c4uJ | D109P | 1011011000 | PU2m'4c'6u7c |
| D39P | 1110010001 | PB3c4uJ | D110P | 0111011000 | PU2m'4c'6u7c |
| D71P | 1110001001 | PB3c4uJ | D115P | 1100111000 | PU2m'4c'6u7c |
| D135P | 1110000101 | PB3c4uJ | D117P | 1010111000 | PU2m'4c'6u7c |
| K124P | 0011111000 | PUK2m7c | D118P | 0110111000 | PU2m'4c'6u7c |
| | | | D121P | 1001111000 | PU2m'4c'6u7c |
| | | | D122P | 0101111000 | PU2m'4c'6u7c |

FIG. 24

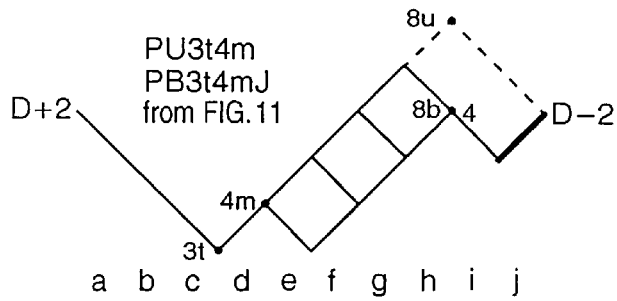

FIG. 25
FIVE BALANCED DISPARITY DEPENDENT VECTORS

| Name | abcdefghij | Coding Class |
|---|---|---|
| D120P | 0001111001 | PB3t4mJ |
| D184P | 0001110101 | PB3t4mJ |
| D216P | 0001101101 | PB3t4mJ |
| D232P | 0001011101 | PB3t4mJ |
| K248P | 0001111100 | PUK3t4m |

FIG. 26
NINETEEN VECTORS WITH A DISPARITY OF PLUS FOUR

| Name | abcdefghij | Coding Class | Name | abcdefghij | Coding Class |
|---|---|---|---|---|---|
| D215P | 1110101101 | FC4u6uJ | D249P | 1001111101 | FC2b3mJ |
| D219P | 1101101101 | FC4u6uJ | D250P | 0101111101 | FC2b3mJ |
| D221P | 1011101101 | FC4u6uJ | D243P | 1100111101 | FC3u4bJ |
| D222P | 0111101101 | FC4u6uJ | D245P | 1010111101 | FC3u4bJ |
| D231P | 1110011101 | FC4u6uJ | D246P | 0110111101 | FC3u4bJ |
| D235P | 1101011101 | FC4u6uJ | D183P | 1110110101 | FC1u4u6c7cJ |
| D237P | 1011011101 | FC4u6uJ | D187P | 1101110101 | FC1u4u6c7cJ |
| D238P | 0111011101 | FC4u6uJ | D189P | 1011110101 | FC1u4u6c7cJ |
|  |  |  | D119P | 1110111001 | FC2u4u7vJ |
| D247P | 1110111100 | FV3c4u | D123P | 1101111001 | FC2u4u7vJ |

FIG. 27

TWENTY-FIVE VECTORS WITH A DISPARITY OF MINUS FOUR

| Name | abcdefghij | Coding Class | Name | abcdefghij | Coding Class |
|---|---|---|---|---|---|
| K81P | 1000101000 | FMK3m4m5m6m7m | D97P | 1000011000 | FM4m5t6m |
| K82P | 0100101000 | FMK3m4m5m6m7m | D98P | 0100011000 | FM4m5t6m |
| K84P | 0010101000 | FMK3m4m5m6m7m | D100P | 0010011000 | FM4m5t6m |
| D88P | 0001101000 | FM3t5m6m7m | D104P | 0001011000 | FM4m5t6m |
| D145P | 1000100100 | FM4m5m7t | D161P | 1000010100 | FM4m5t6m |
| D146P | 0100100100 | FM4m5m7t | D162P | 0100010100 | FM4m5t6m |
| D148P | 0010100100 | FM4m5m7t | D164P | 0010010100 | FM4m5t6m |
| D152P | 0001100100 | FM4m5m7t | D168P | 0001010100 | FM4m5t6m |
| D137P | 1001000100 | FM3m4b7t | D194P | 0100001100 | FM1m4m6t |
| D138P | 0101000100 | FM3m4b7t | D196P | 0010001100 | FM1m4m6t |
| D140P | 0011000100 | FM3m4b7t | D200P | 0001001100 | FM1m4m6t |
| D133P | 1010000100 | FM2b3u7t | K131P | 1100000100 | FMK2u7t |
| D134P | 0110000100 | FM2b3u7t | | | |

SIXTEEN VECTORS WITH A DISPARITY OF MINUS FOUR

| Name | abcdefghij | Coding Class | Name | abcdefghij | Coding Class |
|---|---|---|---|---|---|
| D17P | 1000100001 | FT4m6mJ | C9P | 1001000001 | FTK3m4bJ (Comma) |
| D18P | 0100100001 | FT4m6mJ | D10P | 0101000001 | FTK'3m4bJ |
| D20P | 0010100001 | FT4m6mJ | D12P | 0011000001 | FTK'3m4bJ |
| D24P | 0001100001 | FT4m6mJ | D66P | 0100001001 | FT1m4m6t7tJ |
| D33P | 1000010001 | FT4m6mJ | D68P | 0010001001 | FT1m4m6t7tJ |
| D34P | 0100010001 | FT4m6mJ | D72P | 0001001001 | FT1m4m6t7tJ |
| D36P | 0010010001 | FT4m6mJ | D132P | 0010000101 | FT2m4m7qJ |
| D40P | 0001010001 | FT4m6mJ | D136P | 0001000101 | FT2m4m7qJ |

FIG. 33

SIXTY BALANCED, DISPARITY INDEPENDENT ENCODED VECTORS ENDING WITH ij = 01

| Name | ABCDEFGH | Coding Class | abcdefghij | Name | ABCDEFGH | Coding Class | abcdefghij |
|---|---|---|---|---|---|---|---|
| D80 | 00001010 | BT4tABJ | 1100101001 | D175 | 11110101 | BC4cABJ | 0011010101 |
| D96 | 00000110 | BT4tABJ | 1100011001 | D159 | 11111001 | BC4cABJ | 0011100101 |
| D144 | 00001001 | BT4tABJ | 1100100101 | D111 | 11110110 | BC4cABJ | 0011011001 |
| D160 | 00000101 | BT4tABJ | 1100010101 | D95 | 11111010 | BC4cABJ | 0011101001 |
| D224 | 00000111 | BM4tCJ | 0010011101 | D31 | 11111000 | BU4cCJ | 1101100001 |
| D208 | 00001011 | BM4tCJ | 0010101101 | D47 | 11110100 | BU4cCJ | 1101010001 |
| D176 | 00001101 | BM4tCJ | 0010110101 | D79 | 11110010 | BU4cCJ | 1101001001 |
| D112 | 00001110 | BM4tCJ | 0010111001 | D143 | 11110001 | BU4cCJ | 1101000101 |
| D128 | 00000001 | BQ4tACDJ | 1011000101 | D127 | 11111110 | BV4cACDJ | 0100111001 |
| D64 | 00000010 | BQ4tACDJ | 1011001001 | D191 | 11111101 | BV4cACDJ | 0100110101 |
| D32 | 00000100 | BQ4tACDJ | 1011010001 | D223 | 11111011 | BV4cACDJ | 0100101101 |
| D16 | 00001000 | BQ4tACDJ | 1011100001 | D239 | 11110111 | BV4cACDJ | 0100011101 |
| D48 | 00001100 | BT4tADJ | 1001110001 | D207 | 11110011 | BC4cADJ | 0110001101 |
| D192 | 00000011 | BT4tBDJ | 0101001101 | D63 | 11111100 | BC4cBDJ | 1010110001 |
| D4 | 00100000 | BQ2m3mBDFJ | 0111010001 | D251 | 11011111 | BV2u3uBDFJ | 1000101101 |
| D3 | 11000000 | BT2uEFJ | 1100110001 | D252 | 00111111 | BC1m4bEFJ | 0011001101 |
| D130 | 01000001 | BT1m2b7qDEJ | 0101100101 | D125 | 10111110 | BC2b7vDEJ | 1010011001 |
| D129 | 10000001 | BT1u6tDEJ | 1001100101 | D126 | 01111110 | BC2b7vDEJ | 0110011001 |
| D0 | 00000000 | BSBCEGJ | 0110101001 | D255 | 11111111 | BHBCEGJ | 1001010101 |
| D65 | 10000010 | BT1u6tCEJ | 1010101001 | D190 | 01111101 | BC1m6c7cCEJ | 0101010101 |
| D2 | 01000000 | BQ1m2bCDHJ | 0111000101 | D253 | 10111111 | BV2bCDHJ | 1000111001 |
| D1 | 10000000 | BQ1uDFGJ | 1001011001 | D254 | 01111111 | BV2bDFGJ | 0110100101 |
| D131 | 11000001 | BMK'2u7tGJ | 1100001101 | D124 | 00111110 | BUK'2m7cGJ | 0011110001 |
| D15 | 11110000 | BB4cAGJ | 0111001001 | D240 | 00001111 | BB4tAGJ | 1000110101 |
| D193 | 10000011 | BM1u6tFJ | 1000011101 | D62 | 01111100 | BU1m6cFJ | 0111100001 |
| D7 | 11100000 | BM3cBFHJ | 1010010101 | D248 | 00011111 | BUK'3tBFHJ | 0101101001 |
|  |  |  |  | D55 | 11101100 | BU2u4u6cAJ | 0110110001 |
|  |  |  |  | D59 | 11011100 | BU2u4u6cAJ | 0101110001 |
| D5 | 10100000 | BT2b3uGHJ | 1010001101 |  |  |  |  |
| D9 | 10010000 | BTK'1u3m4bGHJ | 1001001101 |  |  |  |  |
|  |  |  |  | D61 | 10111100 | BU1u2b6cDFHJ | 1010100101 |
|  |  |  |  | D56 | 00011100 | BM3t6bAFGJ | 1001101001 |
| D8 | 00010000 | BQ3t4mBFGJ | 0101011001 |  |  |  |  |
| D6 | 01100000 | BT2b3uFHJ | 0110010101 |  |  |  |  |

FIG. 34A

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D0 | 00000000 x | BSBCEGJ | 0110101001 | ± | 0 | | |
| D1 | 10000000 x | BQ1uDFGJ | 1001011001 | ± | 0 | | |
| D2 | 01000000 x | BQ1m2bCDHJ | 0111000101 | ± | 0 | | |
| D3 | 11000000 x | BT2uEFJ | 1100110001 | ± | 0 | | |
| D4 | 00100000 x | BQ2m3mBDFJ | 0111010001 | ± | 0 | | |
| D5 | 10100000 x | BT2b3uGHJ | 1010001101 | ± | 0 | | |
| D6 | 01100000 x | BT2b3uFHJ | 0110010101 | ± | 0 | | |
| D7 | 11100000 x | BM3cBFHJ | 1010010101 | ± | 0 | | |
| D8 | 00010000 x | BQ3t4mBFGJ | 0101011001 | ± | 0 | | |
| D9 | 10010000 0 | BTK'1u3m4bGHJ | 1001001101 | ± | 0 | | |
| D10P | 01010000 x | FT3m4bJ | 0101000001 | + | −4 | D10A | 1010111110 |
| D11 | 11010000 x | BM3c'3t'5t'7t'IJ | 1101000011 | ± | 0 | | |
| D12 | 00110000 x | FT3m4bJ | 0011000001 | + | −4 | D12A | 1100111110 |
| D13 | 10110000 x | BM3c'3t'5t'7t'IJ | 1011000011 | ± | 0 | | |
| D14 | 01110000 x | BM3c'3t'5t'7t'IJ | 0111000011 | ± | 0 | | |
| D15 | 11110000 x | BB4cAGJ | 0111001001 | ± | 0 | | |
| D16 | 00001000 x | BQ4t6tACDJ | 1011100001 | ± | 0 | | |
| D17P | 10001000 x | FT4m6mJ | 1000100001 | + | −4 | D17A | 0111011110 |
| D18P | 01001000 x | FT4m6mJ | 0100100001 | + | −4 | D18A | 1011011110 |
| D19 | 11001000 x | BM3c'3t'5t'7t'IJ | 1100100011 | ± | 0 | | |
| D20P | 00101000 x | FT4m6mJ | 0010100001 | + | −4 | D20A | 1101011110 |
| D21 | 10101000 x | BM3c'3t'5t'7t'IJ | 1010100011 | ± | 0 | | |
| D22 | 01101000 x | BM3c'3t'5t'7t'IJ | 0110100011 | ± | 0 | | |
| D23P | 11101000 x | PB3c4uJ | 1110100001 | − | 0 | D23A | 0001011110 |
| D24P | 00011000 x | FT4m6mJ | 0001100001 | + | −4 | D24A | 1110011110 |
| D25 | 10011000 x | BM3c'3t'5t'7t'IJ | 1001100011 | ± | 0 | | |
| D26 | 01011000 x | BM3c'3t'5t'7t'IJ | 0101100011 | ± | 0 | | |
| D27 | 11011000 x | BB3c'3t'I | 1101100010 | ± | 0 | | |
| D28 | 00111000 x | BM3c'3t'5t'7t'IJ | 0011100011 | ± | 0 | | |
| D29 | 10111000 x | BB3c'3t'I | 1011100010 | ± | 0 | | |
| D30 | 01111000 x | BB3c'3t'I | 0111100010 | ± | 0 | | |
| D31 | 11111000 x | BU4cCJ | 1101100001 | ± | 0 | | |
| D32 | 00000100 x | BQ4t6tACDJ | 1011010001 | ± | 0 | | |

FIG. 34B

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D33P | 10000100 x | FT4m6mJ | 1000010001 | + | −4 | D33A | 0111101110 |
| D34P | 01000100 x | FT4m6mJ | 0100010001 | + | −4 | D34A | 1011101110 |
| D35 | 11000100 x | BM3c'3t'5t'7t'IJ | 1100010011 | ± | 0 | | |
| D36P | 00100100 x | FT4m6mJ | 0010010001 | + | −4 | D36A | 1101101110 |
| D37 | 10100100 x | BM3c'3t'5t'7t'IJ | 1010010011 | ± | 0 | | |
| D38 | 01100100 x | BM3c'3t'5t'7t'IJ | 0110010011 | ± | 0 | | |
| D39P | 11100100 x | PB3c4uJ | 1110010001 | − | 0 | D39A | 0001101110 |
| D40P | 00010100 x | FT4m6mJ | 0001010001 | + | −4 | D40A | 1110101110 |
| D41 | 10010100 x | BM3c'3t'5t'7t'IJ | 1001010011 | ± | 0 | | |
| D42 | 01010100 x | BM3c'3t'5t'7t'IJ | 0101010011 | ± | 0 | | |
| D43 | 11010100 x | BB3c'3t'I | 1101010010 | ± | 0 | | |
| D44 | 00110100 x | BM3c'3t'5t'7t'IJ | 0011010011 | ± | 0 | | |
| D45 | 10110100 x | BB3c'3t'I | 1011010010 | ± | 0 | | |
| D46 | 01110100 x | BB3c'3t'I | 0111010010 | ± | 0 | | |
| D47 | 11110100 x | BU4cCJ | 1101010001 | ± | 0 | | |
| D48 | 00001100 x | BT4tADJ | 1001110001 | ± | 0 | | |
| D49 | 10001100 x | BM3c'3t'5t'7t'IJ | 1000110011 | ± | 0 | | |
| D50 | 01001100 x | BM3c'3t'5t'7t'IJ | 0100110011 | ± | 0 | | |
| D51 | 11001100 x | BB3c'3t'I | 1100110010 | ± | 0 | | |
| D52 | 00101100 x | BM3c'3t'5t'7t'IJ | 0010110011 | ± | 0 | | |
| D53 | 10101100 x | BB3c'3t'I | 1010110010 | ± | 0 | | |
| D54 | 01101100 x | BB3c'3t'I | 0110110010 | ± | 0 | | |
| D55 | 11101100 x | BU1u4uAJ | 0110110001 | ± | 0 | | |
| D56 | 00011100 x | BM3t6bAFGJ | 1001101001 | ± | 0 | | |
| D57 | 10011100 x | BB3c'3t'I | 1001110010 | ± | 0 | | |
| D58 | 01011100 x | BB3c'3t'I | 0101110010 | ± | 0 | | |
| D59 | 11011100 x | BU1u4uAJ | 0101110001 | ± | 0 | | |
| D60 | 00111100 x | BB3c'3t'I | 0011110010 | ± | 0 | | |
| D61 | 10111100 x | BU1u4uDFHJ | 1010100101 | ± | 0 | | |
| D62 | 01111100 x | BU1m6cFJ | 0111100001 | ± | 0 | | |
| D63 | 11111100 x | BC4cBDJ | 1010110001 | ± | 0 | | |
| D64 | 00000010 x | BQ6qACDJ | 1011001001 | ± | 0 | | |
| D65 | 10000010 x | BT1u6tCEJ | 1010101001 | ± | 0 | | |
| D66P | 01000010 x | FT1m4m6t7tJ | 0100001001 | + | −4 | D66A | 1011110110 |
| D67 | 11000010 x | BM3c'3t'5t'7t'IJ | 1100001011 | ± | 0 | | |
| D68P | 00100010 x | FT1m4m6t7tJ | 0010001001 | + | −4 | D68A | 1101110110 |
| D69 | 10100010 x | BM3c'3t'5t'7t'IJ | 1010001011 | ± | 0 | | |
| D70 | 01100010 x | BM3c'3t'5t'7t'IJ | 0110001011 | ± | 0 | | |
| D71P | 11100010 x | PB3c4uJ | 1110001001 | − | 0 | D71A | 0001110110 |
| D72P | 00010010 x | FT1m4m6t7tJ | 0001001001 | + | −4 | D72A | 1110110110 |

FIG. 34C

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D73 | 10010010 x | BM3c'3t'5t'7t'IJ | 1001001011 | ± | 0 | | |
| D74 | 01010010 x | BM3c'3t'5t'7t'IJ | 0101001011 | ± | 0 | | |
| D75 | 11010010 x | BB3c'3t'I | 1101001010 | ± | 0 | | |
| D76 | 00110010 x | BM3c'3t'5t'7t'IJ | 0011001011 | ± | 0 | | |
| D77 | 10110010 x | BB3c'3t'I | 1011001010 | ± | 0 | | |
| D78 | 01110010 x | BB3c'3t'I | 0111001010 | ± | 0 | | |
| D79 | 11110010 x | BU4cCJ | 1101001001 | ± | 0 | | |
| D80 | 00001010 x | BT4tABJ | 1100101001 | ± | 0 | | |
| D81 | 10001010 0 | BMK'3c'3t'5t'7t' | 1000101011 | ± | 0 | | |
| D82 | 01001010 0 | BMK'3c'3t'5t'7t' | 0100101011 | ± | 0 | | |
| D83 | 11001010 x | BB3c'3t'I | 1100101010 | ± | 0 | | |
| D84 | 00101010 0 | BMK'3c'3t'5t'7t' | 0010101011 | ± | 0 | | |
| D85 | 10101010 x | BB3c'3t'I | 1010101010 | ± | 0 | | |
| D86 | 01101010 x | BB3c'3t'I | 0110101010 | ± | 0 | | |
| D87P | 11101010 x | PU2m'4c'6u7c | 1110101000 | − | 0 | D87A | 0001010111 |
| D88P | 00011010 x | FM3t5m6m7m | 0001101000 | + | −4 | D88A | 1110010111 |
| D89 | 10011010 x | BB3c'3t'I | 1001101010 | ± | 0 | | |
| D90 | 01011010 x | BB3c'3t'I | 0101101010 | ± | 0 | | |
| D91P | 11011010 x | PU2m'4c'6u7c | 1101101000 | − | 0 | D91A | 0010010111 |
| D92 | 00111010 x | BB3c'3t'I | 0011101010 | ± | 0 | | |
| D93P | 10111010 x | PU2m'4c'6u7c | 1011101000 | − | 0 | D93A | 0100010111 |
| D94P | 01111010 x | PU2m'4c'6u7c | 0111101000 | − | 0 | D94A | 1000010111 |
| D95 | 11111010 x | BC4cABJ | 0011101001 | ± | 0 | | |
| D96 | 00000110 x | BT4tABJ | 1100011001 | ± | 0 | | |
| D97P | 10000110 x | FM4m5t6m | 1000011000 | + | −4 | D97A | 0111100111 |
| D98P | 01000110 x | FM4m5t6m | 0100011000 | + | −4 | D98A | 1011100111 |
| D99 | 11000110 x | BB3c'3t'I | 1100011010 | ± | 0 | | |
| D100P | 00100110 x | FM4m5t6m | 0010011000 | + | −4 | D100A | 1101100111 |
| D101 | 10100110 x | BB3c'3t'I | 1010011010 | ± | 0 | | |
| D102 | 01100110 x | BB3c'3t'I | 0110011010 | ± | 0 | | |
| D103P | 11100110 x | PU2m'4c'6u7c | 1110011000 | − | 0 | D103A | 0001100111 |
| D104P | 00010110 x | FM4m5t6m | 0001011000 | + | −4 | D104A | 1110100111 |
| D105 | 10010110 x | BB3c'3t'I | 1001011010 | ± | 0 | | |
| D106 | 01010110 x | BB3c'3t'I | 0101011010 | ± | 0 | | |
| D107P | 11010110 x | PU2m'4c'6u7c | 1101011000 | − | 0 | D107A | 0010100111 |
| D108 | 00110110 x | BB3c'3t'I | 0011011010 | ± | 0 | | |
| D109P | 10110110 x | PU2m'4c'6u7c | 1011011000 | − | 0 | D109A | 0100100111 |
| D110P | 01110110 x | PU2m'4c'6u7c | 0111011000 | − | 0 | D110A | 1000100111 |
| D111 | 11110110 x | BC4cABJ | 0011011001 | ± | 0 | | |
| D112 | 00001110 x | BM4tCJ | 0010111001 | ± | 0 | | |

FIG. 34D

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D113 | 10001110 x | BB3c'3t'l | 1000111010 | ± | 0 | | |
| D114 | 01001110 x | BB3c'3t'l | 0100111010 | ± | 0 | | |
| D115P | 11001110 x | PU2m'4c'6u7c | 1100111000 | − | 0 | D115A | 0011000111 |
| D116 | 00101110 x | BB3c'3t'l | 0010111010 | ± | 0 | | |
| D117P | 10101110 x | PU2m'4c'6u7c | 1010111000 | − | 0 | D117A | 0101000111 |
| D118P | 01101110 x | PU2m'4c'6u7c | 0110111000 | − | 0 | D118A | 1001000111 |
| D119P | 11101110 x | FC2u4u7vJ | 1110111001 | − | +4 | D119A | 0001000110 |
| D120P | 00011110 x | PB3t4mJ | 0001111001 | + | 0 | D120A | 1110000110 |
| D121P | 10011110 x | PU2m'4c'6u7c | 1001111000 | − | 0 | D121A | 0110000111 |
| D122P | 01011110 x | PU2m'4c'6u7c | 0101111000 | − | 0 | D122A | 1010000111 |
| D123P | 11011110 x | FC2u4u7vJ | 1101111001 | − | +4 | D123A | 0010000110 |
| D124 | 00111110 0 | BUK'2m7cGJ | 0011110001 | ± | 0 | | |
| D125 | 10111110 x | BC2b7vDEJ | 1010011001 | ± | 0 | | |
| D126 | 01111110 x | BC2b7vDEJ | 0110011001 | ± | 0 | | |
| D127 | 11111110 x | BV4cACDJ | 0100111001 | ± | 0 | | |
| D128 | 00000001 x | BQ6qACDJ | 1011000101 | ± | 0 | | |
| D129 | 10000001 x | BT1u6tDEJ | 1001100101 | ± | 0 | | |
| D130 | 01000001 x | BT1m2b7qDEJ | 0101100101 | ± | 0 | | |
| D131 | 11000001 0 | BMK'2u7tGJ | 1100001101 | ± | 0 | | |
| D132P | 00100001 x | FT2m4m7qJ | 0010000101 | + | −4 | D132A | 1101111010 |
| D133P | 10100001 x | FM2b3u7t | 1010000100 | + | −4 | D133A | 0101111011 |
| D134P | 01100001 x | FM2b3u7t | 0110000100 | + | −4 | D134A | 1001111011 |
| D135P | 11100001 x | PB3c4uJ | 1110000101 | − | 0 | D135A | 0001111010 |
| D136P | 00010001 x | FT2m4m7qJ | 0001000101 | + | −4 | D136A | 1110111010 |
| D137P | 10010001 x | FM3m4b7t | 1001000100 | + | −4 | D137A | 0110111011 |
| D138P | 01010001 x | FM3m4b7t | 0101000100 | + | −4 | D138A | 1010111011 |
| D139 | 11010001 x | BB3c'3t'l | 1101000110 | ± | 0 | | |
| D140P | 00110001 x | FM3m4b7t | 0011000100 | + | −4 | D140A | 1100111011 |
| D141 | 10110001 x | BB3c'3t'l | 1011000110 | ± | 0 | | |
| D142 | 01110001 x | BB3c'3t'l | 0111000110 | ± | 0 | | |
| D143 | 11110001 x | BU4cCJ | 1101000101 | ± | 0 | | |
| D144 | 00001001 x | BT4tABJ | 1100100101 | ± | 0 | | |
| D145P | 10001001 x | FM4m5m7t | 1000100100 | + | −4 | D145A | 0111011011 |
| D146P | 01001001 x | FM4m5m7t | 0100100100 | + | −4 | D146A | 1011011011 |
| D147 | 11001001 x | BB3c'3t'l | 1100100110 | ± | 0 | | |
| D148P | 00101001 x | FM4m5m7t | 0010100100 | + | −4 | D148A | 1101011011 |
| D149 | 10101001 x | BB3c'3t'l | 1010100110 | ± | 0 | | |
| D150 | 01101001 x | BB3c'3t'l | 0110100110 | ± | 0 | | |
| D151P | 11101001 x | PU3c4u7u | 1110100100 | − | 0 | D151A | 0001011011 |
| D152P | 00011001 x | FM4m5m7t | 0001100100 | + | −4 | D152A | 1110011011 |

FIG. 34E

8P/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D153 | 10011001 x | BB3c'3t'l | 1001100110 | ± | 0 | | |
| D154 | 01011001 x | BB3c'3t'l | 0101100110 | ± | 0 | | |
| D155P | 11011001 x | PU3u5c7u | 1101100100 | − | 0 | D155A | 0010011011 |
| D156 | 00111001 x | BB3c'3t'l | 0011100110 | ± | 0 | | |
| D157P | 10111001 x | PU3u5c7u | 1011100100 | − | 0 | D157A | 0100011011 |
| D158P | 01111001 x | PU3u5c7u | 0111100100 | − | 0 | D158A | 1000011011 |
| D159 | 11111001 x | BC4cABJ | 0011100101 | ± | 0 | | |
| D160 | 00000101 x | BT4tABJ | 1100010101 | ± | 0 | | |
| D161P | 10000101 x | FM4m5t6m | 1000010100 | + | −4 | D161A | 0111101011 |
| D162P | 01000101 x | FM4m5t6m | 0100010100 | + | −4 | D162A | 1011101011 |
| D163 | 11000101 x | BB3c'3t'l | 1100010110 | ± | 0 | | |
| D164P | 00100101 x | FM4m5t6m | 0010010100 | + | −4 | D164A | 1101101011 |
| D165 | 10100101 x | BB3c'3t'l | 1010010110 | ± | 0 | | |
| D166 | 01100101 x | BB3c'3t'l | 0110010110 | ± | 0 | | |
| D167P | 11100101 x | PU3c4u7u | 1110010100 | − | 0 | D167A | 0001101011 |
| D168P | 00010101 x | FM4m5t6m | 0001010100 | + | −4 | D168A | 1110101011 |
| D169 | 10010101 x | BB3c'3t'l | 1001010110 | ± | 0 | | |
| D170 | 01010101 x | BB3c'3t'l | 0101010110 | ± | 0 | | |
| D171 | 11010101 x | BU3c'5c'7c'3t' | 1101010100 | ± | 0 | | |
| D172 | 00110101 x | BB3c'3t'l | 0011010110 | ± | 0 | | |
| D173 | 10110101 x | BU3c'5c'7c'3t' | 1011010100 | ± | 0 | | |
| D174 | 01110101 x | BU3c'5c'7c'3t' | 0111010100 | ± | 0 | | |
| D175 | 11110101 x | BC4cABJ | 0011010101 | ± | 0 | | |
| D176 | 00001101 x | BM4tCJ | 0010110101 | ± | 0 | | |
| D177 | 10001101 x | BB3c'3t'l | 1000110110 | ± | 0 | | |
| D178 | 01001101 x | BB3c'3t'l | 0100110110 | ± | 0 | | |
| D179 | 11001101 x | BU3c'5c'7c'3t' | 1100110100 | ± | 0 | | |
| D180 | 00101101 x | BB3c'3t'l | 0010110110 | ± | 0 | | |
| D181 | 10101101 x | BU3c'5c'7c'3t' | 1010110100 | ± | 0 | | |
| D182 | 01101101 x | BU3c'5c'7c'3t' | 0110110100 | ± | 0 | | |
| D183P | 11101101 x | FC1u4u6c7cJ | 1110110101 | − | +4 | D183A | 0001001010 |
| D184P | 00011101 x | PB3t4mJ | 0001110101 | + | 0 | D184A | 1110001010 |
| D185 | 10011101 x | BU3c'5c'7c'3t' | 1001110100 | ± | 0 | | |
| D186 | 01011101 x | BU3c'5c'7c'3t' | 0101110100 | ± | 0 | | |
| D187P | 11011101 x | FC1u4u6c7cJ | 1101110101 | − | +4 | D187A | 0010001010 |
| D188 | 00111101 x | BU3c'5c'7c'3t' | 0011110100 | ± | 0 | | |
| D189P | 10111101 x | FC1u4u6c7cJ | 1011110101 | − | +4 | D189A | 0100001010 |
| D190 | 01111101 x | BC1m6c7cCEJ | 0101010101 | ± | 0 | | |
| D191 | 11111101 x | BV4cACDJ | 0100110101 | ± | 0 | | |
| D192 | 00000011 x | BT4tBDJ | 0101001101 | ± | 0 | | |

FIG. 34F

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D193 | 10000011 x | BM1u6tFJ | 1000011101 | ± | 0 | | |
| D194P | 01000011 x | FM1m4m6t | 0100001100 | + | −4 | D194A | 1011110011 |
| D195 | 11000011 x | BB3c'3t'l | 1100001110 | ± | 0 | | |
| D196P | 00100011 x | FM1m4m6t | 0010001100 | + | −4 | D196A | 1101110011 |
| D197 | 10100011 x | BB3c'3t'l | 1010001110 | ± | 0 | | |
| D198 | 01100011 x | BB3c'3t'l | 0110001110 | ± | 0 | | |
| D199P | 11100011 x | PU3c4u7u | 1110001100 | − | 0 | D199A | 0001110011 |
| D200P | 00010011 x | FM1m4m6t | 0001001100 | + | −4 | D200A | 1110110011 |
| D201 | 10010011 x | BB3c'3t'l | 1001001110 | ± | 0 | | |
| D202 | 01010011 x | BB3c'3t'l | 0101001110 | ± | 0 | | |
| D203 | 11010011 x | BU3c'5c'7c'3t' | 1101001100 | ± | 0 | | |
| D204 | 00110011 x | BB3c'3t'l | 0011001110 | ± | 0 | | |
| D205 | 10110011 x | BU3c'5c'7c'3t' | 1011001100 | ± | 0 | | |
| D206 | 01110011 x | BU3c'5c'7c'3t' | 0111001100 | ± | 0 | | |
| D207 | 11110011 x | BC4cADJ | 0110001101 | ± | 0 | | |
| D208 | 00001011 x | BM4tCJ | 0010101101 | ± | 0 | | |
| D209 | 10001011 x | BB3c'3t'l | 1000101110 | ± | 0 | | |
| D210 | 01001011 x | BB3c'3t'l | 0100101110 | ± | 0 | | |
| D211 | 11001011 x | BU3c'5c'7c'3t' | 1100101100 | ± | 0 | | |
| D212 | 00101011 x | BB3c'3t'l | 0010101110 | ± | 0 | | |
| D213 | 10101011 x | BU3c'5c'7c'3t' | 1010101100 | ± | 0 | | |
| D214 | 01101011 x | BU3c'5c'7c'3t' | 0110101100 | ± | 0 | | |
| D215P | 11101011 x | FC4u6uJ | 1110101101 | − | +4 | D215A | 0001010010 |
| D216P | 00011011 x | PB3t4mJ | 0001101101 | + | 0 | D216A | 1110010010 |
| D217 | 10011011 x | BU3c'5c'7c'3t' | 1001101100 | ± | 0 | | |
| D218 | 01011011 x | BU3c'5c'7c'3t' | 0101101100 | ± | 0 | | |
| D219P | 11011011 x | FC4u6uJ | 1101101101 | − | +4 | D219A | 0010010010 |
| D220 | 00111011 x | BU3c'5c'7c'3t' | 0011101100 | ± | 0 | | |
| D221P | 10111011 x | FC4u6uJ | 1011101101 | − | +4 | D221A | 0100010010 |
| D222P | 01111011 x | FC4u6uJ | 0111101101 | − | +4 | D222A | 1000010010 |
| D223 | 11111011 x | BV4cACDJ | 0100101101 | ± | 0 | | |
| D224 | 00000111 x | BM4tCJ | 0010011101 | ± | 0 | | |
| D225 | 10000111 x | BB3c'3t'l | 1000011110 | ± | 0 | | |
| D226 | 01000111 x | BB3c'3t'l | 0100011110 | ± | 0 | | |
| D227 | 11000111 x | BU3c'5c'7c'3t' | 1100011100 | ± | 0 | | |
| D228 | 00100111 x | BB3c'3t'l | 0010011110 | ± | 0 | | |
| D229 | 10100111 x | BU3c'5c'7c'3t' | 1010011100 | ± | 0 | | |
| D230 | 01100111 x | BU3c'5c'7c'3t' | 0110011100 | ± | 0 | | |
| D231P | 11100111 x | FC4u6uJ | 1110011101 | − | +4 | D231A | 0001100010 |
| D232P | 00010111 x | PB3t4mJ | 0001011101 | + | 0 | D232A | 1110100010 |

FIG. 34G

8B/10B-P ENCODING WITH LOCAL PARITY

| Name Primary | ABCDEFGH K | Coding Class Primary | Primary abcdefghij | Pri DR | Pri DB | Name Alternate | Alternate abcdefghij |
|---|---|---|---|---|---|---|---|
| D233 | 10010111 x | BU3c'5c'7c'3t' | 1001011100 | ± | 0 | | |
| D234 | 01010111 x | BU3c'5c'7c'3t' | 0101011100 | ± | 0 | | |
| D235P | 11010111 x | FC4u6uJ | 1101011101 | − | +4 | D235A | 0010100010 |
| D236 | 00110111 x | BU3c'5c'7c'3t' | 0011011100 | ± | 0 | | |
| D237P | 10110111 x | FC4u6uJ | 1011011101 | − | +4 | D237A | 0100100010 |
| D238P | 01110111 x | FC4u6uJ | 0111011101 | − | +4 | D238A | 1000100010 |
| D239 | 11110111 x | BV4cACDJ | 0100011101 | ± | 0 | | |
| D240 | 00001111 x | BB4tAGJ | 1000110101 | ± | 0 | | |
| D241 | 10001111 x | BU3c'5c'7c'3t' | 1000111100 | ± | 0 | | |
| D242 | 01001111 x | BU3c'5c'7c'3t' | 0100111100 | ± | 0 | | |
| D243P | 11001111 x | FCK'3u4bJ | 1100111101 | − | +4 | D243A | 0011000010 |
| D244 | 00101111 x | BU3c'5c'7c'3t' | 0010111100 | ± | 0 | | |
| D245P | 10101111 x | FCK'3u4bJ | 1010111101 | − | +4 | D245A | 0101000010 |
| D246P | 01101111 x | BC1m4bEGJ | 0110111101 | − | +4 | D246A | 1001000010 |
| D247P | 11101111 x | FV3c4u | 1110111100 | − | +4 | D247A | 0001000011 |
| D248 | 00011111 0 | BUK'3tBFHJ | 0101101001 | ± | 0 | | |
| D249P | 10011111 x | BC1u3mEFJ | 1001111101 | − | +4 | D249A | 0110000010 |
| D250P | 01011111 x | BC1m4bEHJ | 0101111101 | − | +4 | D250A | 1010000010 |
| D251 | 11011111 x | BV2u3uBDFJ | 1000101101 | ± | 0 | | |
| D252 | 00111111 x | BC1m4bEFJ | 0011001101 | ± | 0 | | |
| D253 | 10111111 x | BV2bCDHJ | 1000111001 | ± | 0 | | |
| D254 | 01111111 x | BV2bDFGJ | 0110100101 | ± | 0 | | |
| D255 | 11111111 x | BHBCEGJ | 1001010101 | ± | 0 | | |
| C9P | 10010000 1 | FTK1u3m4b | 1001000001 | + | −4 | C9A | 0110111110 |
| K81P | 10001010 1 | FMK3m4m5m6m7m | 1000101000 | + | −4 | K81A | 0111010111 |
| K82P | 01001010 1 | FMK3m4m5m6m7m | 0100101000 | + | −4 | K82A | 1011010111 |
| K84P | 00101010 1 | FMK3m4m5m6m7m | 0010101000 | + | −4 | K84A | 1101010111 |
| K124P | 00111110 1 | PUK2m7c | 0011111000 | − | 0 | K124A | 1100000111 |
| K131P | 11000001 1 | FMK2u7t | 1100000100 | + | −4 | K131A | 0011111011 |
| K248P | 00011111 1 | PUK3t | 0001111100 | + | 0 | K248A | 1110000011 |

*FIG. 35* a-bit ENCODING

| Name | ABCDEFGH K | a | Name | ABCDEFGH K | a | Coding Label |
|---|---|---|---|---|---|---|
| D80 | 00001010 x | 1 | D175 | 11110101 x | 0 | A⊕B'•B⊕C'•C⊕D'•E⊕F•G⊕H |
| D96 | 00000110 x | 1 | D159 | 11111001 x | 0 | |
| D144 | 00001001 x | 1 | D111 | 11110110 x | 0 | |
| D160 | 00000101 x | 1 | D95 | 11111010 x | 0 | |
| D128 | 00000001 x | 1 | D127 | 11111110 x | 0 | A⊕B'•B⊕C'•C⊕D'• |
| D64 | 00000010 x | 1 | D191 | 11111101 x | 0 | (D⊕E'•E⊕F'•G⊕H+ |
| D32 | 00000100 x | 1 | D223 | 11111011 x | 0 | A⊕G'•G⊕H'•E⊕F) |
| D16 | 00001000 x | 1 | D239 | 11110111 x | 0 | |
| D48 | 00001100 x | 1 | D207 | 11110011 x | 0 | A⊕B'•B⊕C'•C⊕D'• |
| D240 | 00001111 x | 1 | D15 | 11110000 x | 0 | D⊕E•E⊕F'•G⊕H' |
| | | | D55 | 11101100 x | 0 | (C⊕D•A•B+A'•B'•C'•D) |
| | | | D59 | 11011100 x | 0 | •E•F•G'•H' |
| D56 | 00011100 x | 1 | | | | |

FIG. 36 b-bit ENCODING

| Name | ABCDEFGH K | b | Name | ABCDEFGH K | b | Coding Label |
|---|---|---|---|---|---|---|
| D80 | 00001010 x | 1 | D175 | 11110101 x | 0 | $\overline{K'} \cdot A \oplus B' \cdot B \oplus C' \cdot C \oplus D' \cdot E \oplus F \cdot G \oplus H$ |
| D96 | 00000110 x | 1 | D159 | 11111001 x | 0 | |
| D144 | 00001001 x | 1 | D111 | 11110110 x | 0 | |
| D160 | 00000101 x | 1 | D95 | 11111010 x | 0 | |
| D248 | 00011111 x | 1 | D7 | 11100000 x | 0 | $K' \cdot A \oplus B' \cdot B \oplus C' \cdot$ |
| D0 | 00000000 x | 1 | D255 | 11111111 x | 0 | $D \oplus E' \cdot E \oplus F' \cdot F \oplus G' \cdot G \oplus H'$ |
| D4 | 00100000 x | 1 | D251 | 11011111 x | 0 | $A \oplus B' \cdot B \oplus E' \cdot D \oplus E' \cdot E \oplus F' \cdot G \oplus H' \cdot$ |
| *D0 | 00000000 x | 1 | *D255 | 11111111 x | 0 | $(F \oplus G' + B \oplus C')$ |
| D192 | 00000011 x | 1 | D63 | 11111100 x | 0 | |
| D8 | 00010000 x | 1 | | | | $A' \cdot B' \cdot C' \cdot E' \cdot F' \cdot G' \cdot H'$ |
| *D0 | 00000000 x | 1 | | | | |

FIG. 37 c-bit ENCODING

| Name | ABCDEFGH K | c | Name | ABCDEFGH K | c | Coding Label |
|---|---|---|---|---|---|---|
| D224 | 00000111 x | 1 | D31 | 11111000 x | 0 | $A \oplus B' \cdot B \oplus C' \cdot C \oplus D' \cdot E \oplus F \cdot G \oplus H'$ |
| D208 | 00001011 x | 1 | D47 | 11110100 x | 0 | |
| D32 | 00000100 x | 1 | D223 | 11111011 x | 0 | |
| D16 | 00001000 x | 1 | D239 | 11110111 x | 0 | |
| D176 | 00001101 x | 1 | D79 | 11110010 x | 0 | $A \oplus B' \cdot B \oplus C' \cdot C \oplus D' \cdot E \oplus F' \cdot G \oplus H$ |
| D112 | 00001110 x | 1 | D143 | 11110001 x | 0 | |
| D128 | 00000001 x | 1 | D127 | 11111110 x | 0 | |
| D64 | 00000010 x | 1 | D191 | 11111101 x | 0 | |
| D0 | 00000000 x | 1 | D255 | 11111111 x | 0 | $A \oplus B' \cdot B \oplus C' \cdot C \oplus D' \cdot$ |
| *D64 | 00000010 x | 1 | D191 | 11111101 x | 0 | $C \oplus H' \cdot D \oplus E' \cdot E \oplus F'$ |
| D2 | 01000000 x | 1 | D253 | 10111111 x | 0 | $A \oplus B \cdot A \oplus G' \cdot C \oplus D' \cdot D \oplus E' \cdot$ |
| D65 | 10000010 x | 1 | D190 | 01111101 x | 0 | $E \oplus F' \cdot C \oplus H'$ |

FIG. 38 d-bit ENCODING

| Name | ABCDEFGH K | d | Name | ABCDEFGH K | d | Coding Label |
|------|------------|---|------|------------|---|--------------|
| D128 | 00000001 x | 1 | D127 | 11111110 x | 0 | A⊕B'•B⊕C'•C⊕D'•D⊕E'•E⊕F'• |
| D64  | 00000010 x | 1 | D191 | 11111101 x | 0 | (F⊕G+G⊕H) |
| D192 | 00000011 x | 1 | D63  | 11111100 x | 0 | |
| D32  | 00000100 x | 1 | D223 | 11111011 x | 0 | A⊕B'•B⊕C'•C⊕D'•C⊕H'•G⊕H'• |
| D16  | 00001000 x | 1 | D239 | 11110111 x | 0 | (F⊕G+E⊕F) |
| D48  | 00001100 x | 1 | D207 | 11110011 x | 0 | |
| D130 | 01000001 x | 1 | D125 | 10111110 x | 0 | |
| D129 | 10000001 x | 1 | D126 | 01111110 x | 0 | A⊕B•C⊕D'•D⊕E'•E⊕F'•F⊕G' |
| D2   | 01000000 x | 1 | D253 | 10111111 x | 0 | |
| D1   | 10000000 x | 1 | D254 | 01111111 x | 0 | |
| D4   | 00100000 x | 1 | D251 | 11011111 x | 0 | A⊕G'•B⊕C•D⊕E'•E⊕F'•F⊕G'• |
| *D2  | 01000000 x | 1 | *D253 | 10111111 x | 0 | G⊕H' |
|      |            |   | D61  | 10111100 x | 0 | |
|      |            |   | *D125 | 10111110 x | 0 | A•B'•C•D•E•F•$\overline{G}$'•H' |

FIG. 39 e-bit ENCODING

| Name | ABCDEFGH K | e | Name | ABCDEFGH K | e | Coding Label |
|------|------------|---|------|------------|---|--------------|
| D0   | 00000000 x | 1 | D255 | 11111111 x | 0 | C⊕D'•D⊕E'•E⊕F'• |
| D3   | 11000000 x | 1 | D252 | 00111111 x | 0 | (A⊕B'•F⊕G'•G⊕H'+ |
| D65  | 10000010 x | 1 | D190 | 01111101 x | 0 | A⊕B•B⊕C'•G⊕H+ |
| D130 | 01000001 x | 1 | D125 | 10111110 x | 0 | A⊕B•F⊕G'•G⊕H) |
| D129 | 10000001 x | 1 | D126 | 01111110 x | 0 | |

FIG. 40 f-bit ENCODING

| Name | ABCDEFGH K | f | Name | ABCDEFGH K | f | Coding Label |
|---|---|---|---|---|---|---|
| D193 | 10000011 x | 1 | D62 | 01111100 x | 0 | A⊕B•B⊕C'•C⊕D'•D⊕E'•E⊕F'• |
| D1 | 10000000 x | 1 | D254 | 01111111 x | 0 | G⊕H' |
| D7 | 11100000 x | 1 | D248 | 00011111 x | 0 | A⊕B'•D⊕E'•E⊕F'•F⊕G'•G⊕H'• |
| D3 | 11000000 x | 1 | D252 | 00111111 x | 0 | (A⊕G+B⊕C) |
| D4 | 00100000 x | 1 | D251 | 11011111 x | 0 | |
| *D4 | 00100000 x | 1 | | | | |
| D6 | 01100000 x | 1 | | | | A'•E'•F'•G'•H'•(B'•C'•D+C•D') |
| D8 | 00010000 x | 1 | | | | |
| | | | D56 | 00011100 x | 0 | A⊕C'•B'•D•E•F•G'•H' |
| | | | D61 | 10111100 x | 0 | |

FIG. 41 g-bit ENCODING

| Name | ABCDEFGH K | g | Name | ABCDEFGH K | g | Coding Label |
|---|---|---|---|---|---|---|
| D131 | 11000001 x | 1 | D124 | 00111110 x | 0 | A⊕B'•B⊕E•E⊕F'•F⊕G'• |
| D15 | 11110000 x | 1 | D240 | 00001111 x | 0 | C⊕D'•C⊕H•K' |
| D0 | 00000000 x | 1 | D255 | 11111111 x | 0 | B⊕C'•C⊕D'•D⊕E'•E⊕F'•F⊕G'• |
| D1 | 10000000 x | 1 | D254 | 01111111 x | 0 | G⊕H' |
| *D1 | 10000000 x | 1 | | | | |
| D5 | 10100000 x | 1 | | | | (A•D'+C'•D)•B'•E'•F'•G'•H'•K' |
| D8 | 00010000 x | 1 | | | | |
| D9 | 10010000 x | 1 | | | | |
| D56 | 00011100 x | 1 | | | | A'•B'•C'•D•E•F•G'•H' |

FIG. 42
h-bit ENCODING

| Name | ABCDEFGH K | h | Name | ABCDEFGH K | h | Coding Label |
|---|---|---|---|---|---|---|
| D7 | 11100000 x | 1 | D248 | 00011111 x | 0 | A⊕C'•B⊕E•D⊕E'•E⊕F'•F⊕G'• |
| D2 | 01000000 x | 1 | D253 | 10111111 x | 0 | G⊕H' |
| D9 | 10010000 x | 1 | | | | K'•A•B'•C'•D•E'•F'•G'•H' |
| D5 | 10100000 x | 1 | | | | |
| D6 | 01100000 x | 1 | | | | (A+B)•C•D'•E'•F'•G'•H' |
| *D7 | 11100000 x | 1 | | | | |
| D61 | 10111100 x | 1 | | | | A•B'•C•D•E•F•G'•H' |

FIG. 43A
i-bit ENCODING

| Name | ABCDEFGH | Name | ABCDEFGH | Coding Label |
|---|---|---|---|---|
| D51 | 11001100 | D204 | 00110011 | |
| D60 | 00111100 | D195 | 11000011 | |
| D53 | 10101100 | D202 | 01010011 | (A⊕B'•B⊕C•C⊕D'+A⊕B•C⊕D)• |
| D54 | 01101100 | D201 | 10010011 | E⊕F'•F⊕G•G⊕H' |
| D57 | 10011100 | D198 | 01100011 | |
| D58 | 01011100 | D197 | 10100011 | |
| D147 | 11001001 | D108 | 00110110 | |
| D156 | 00111001 | D99 | 11000110 | |
| D149 | 10101001 | D106 | 01010110 | (A⊕B'•B⊕C•C⊕D'+A⊕B•C⊕D)• |
| D150 | 01101001 | D105 | 10010110 | E⊕F•F⊕G'•G⊕H |
| D153 | 10011001 | D102 | 01100110 | |
| D154 | 01011001 | D101 | 10100110 | |
| D83 | 11001010 | D172 | 00110101 | |
| D92 | 00111010 | D163 | 11000101 | |
| D85 | 10101010 | D170 | 01010101 | (A⊕B'•B⊕C•C⊕D'+A⊕B•C⊕D)• |
| D86 | 01101010 | D169 | 10010101 | E⊕F•F⊕G•G⊕H |
| D89 | 10011010 | D166 | 01100101 | |
| D90 | 01011010 | D165 | 10100101 | |
| D27 | 11011000 | D228 | 00100111 | (A⊕B'•B⊕C•C⊕D+A⊕B•C⊕D')• |
| D29 | 10111000 | D226 | 01000111 | D⊕E'•E⊕F•F⊕G'•G⊕H' |
| D30 | 01111000 | D225 | 10000111 | |

FIG. 43B i-bit ENCODING

| Name | ABCDEFGH | Name | ABCDEFGH | Coding Label |
|------|----------|------|----------|--------------|
| D43  | 11010100 | D212 | 00101011 | (A⊕B'•B⊕C•C⊕D+A⊕B•C⊕D')• |
| D45  | 10110100 | D210 | 01001011 | D⊕E•E⊕F•F⊕G•G⊕H' |
| D46  | 01110100 | D209 | 10001011 | |
| D75  | 11010010 | D180 | 00101101 | (A⊕B'•B⊕C•C⊕D+A⊕B•C⊕D')• |
| D77  | 10110010 | D178 | 01001101 | D⊕E•E⊕F'•F⊕G•G⊕H |
| D78  | 01110010 | D177 | 10001101 | |
| D139 | 11010001 | D116 | 00101110 | (A⊕B'•B⊕C•C⊕D+A⊕B•C⊕D')• |
| D141 | 10110001 | D114 | 01001110 | D⊕E•E⊕F'•F⊕G'•G⊕H |
| D142 | 01110001 | D113 | 10001110 | |
| D49  | 10001100 |      |          | |
| D50  | 01001100 |      |          | |
| D52  | 00101100 |      |          | (A•B'•C'+A'•B•C'+A'•B'•C)• |
| D81  | 10001010 |      |          | F⊕G•K'•D'•E•H' |
| D82  | 01001010 |      |          | |
| D84  | 00101010 |      |          | |
| D11  | 11010000 |      |          | |
| D13  | 10110000 |      |          | (A•B•C'+A•B'•C+A'•B•C)•D•E'•F'•G'•H' |
| D14  | 01110000 |      |          | |
| D19  | 11001000 |      |          | |
| D28  | 00111000 |      |          | |
| D21  | 10101000 |      |          | (A⊕B'•B⊕C•C⊕D'+A⊕B•C⊕D)•E•F'•G'•H' |
| D22  | 01101000 |      |          | |
| D25  | 10011000 |      |          | |
| D26  | 01011000 |      |          | |
| D35  | 11000100 |      |          | |
| D44  | 00110100 |      |          | |
| D37  | 10100100 |      |          | (A⊕B'•B⊕C•C⊕D'+A⊕B•C⊕D)•E'•F•G'•H' |
| D38  | 01100100 |      |          | |
| D41  | 10010100 |      |          | |
| D42  | 01010100 |      |          | |
| D67  | 11000010 |      |          | |
| D76  | 00110010 |      |          | |
| D69  | 10100010 |      |          | (A⊕B'•B⊕C•C⊕D'+A⊕B•C⊕D)•E'•F'•G•H' |
| D70  | 01100010 |      |          | |
| D73  | 10010010 |      |          | |
| D74  | 01010010 |      |          | |

FIG. 44A j-bit ENCODING

| Name | ABCDEFGH | Name | ABCDEFGH | Coding Label |
|------|----------|------|----------|--------------|
| D0   | 00000000 |      |          |              |
| D1   | 10000000 |      |          |              |
| D2   | 01000000 |      |          |              |
| D3   | 11000000 |      |          |              |
| D4   | 00100000 |      |          |              |
| D5   | 10100000 |      |          |              |
| D6   | 01100000 |      |          |              |
| D7   | 11100000 |      |          |              |
| D8   | 00010000 |      |          | E'•F'•G'•H'  |
| D9   | 10010000 | K=0  |          |              |
| C9   | 10010000 | K=1  |          |              |
| D10  | 01010000 |      |          |              |
| D11  | 11010000 |      |          |              |
| D12  | 00110000 |      |          |              |
| D13  | 10110000 |      |          |              |
| D14  | 01110000 |      |          |              |
| D15  | 11110000 |      |          |              |
| D66  | 01000010 | D189 | 10111101 |              |
| D68  | 00100010 | D187 | 11011101 |              |
| D65  | 10000010 | D190 | 01111101 | (A⊕G•B⊕C•D⊕E'+A⊕D•B⊕C'•C⊕H'+ |
| D72  | 00010010 | D183 | 11101101 | A⊕B'•B⊕C'•C⊕D)•E⊕F'•F⊕G•G⊕H |
| *D72 | 00010010 | *D183| 11101101 |              |
| D71  | 11100010 | D184 | 00011101 |              |
|      |          | D215 | 11101011 | E⊕F•A•B•C•D'•G•H |
|      |          | D231 | 11100111 |              |
|      |          | D243 | 11001111 |              |
|      |          | D245 | 10101111 | (A•B•C'+A•B'•C+A'•B•C)•D'•E•F•G•H |
|      |          | D246 | 01101111 |              |

FIG. 44B j-bit ENCODING

| Name | ABCDEFGH | Name | ABCDEFGH | Coding Label |
|---|---|---|---|---|
|  |  | D55 | 11101100 | (C⊕D•A•B+A⊕C'•B'•D)•E•F•G'•H' |
|  |  | D59 | 11011100 |  |
|  |  | D56 | 00011100 |  |
|  |  | D61 | 10111100 |  |
| *D0 | 00000000 | D255 | 11111111 | A⊕B'•B⊕C'•C⊕D' |
| D128 | 00000001 | D127 | 11111110 |  |
| D64 | 00000010 | D191 | 11111101 |  |
| D192 | 00000011 | D63 | 11111100 |  |
| D32 | 00000100 | D223 | 11111011 |  |
| D160 | 00000101 | D95 | 11111010 |  |
| D96 | 00000110 | D159 | 11111001 |  |
| D224 | 00000111 | D31 | 11111000 |  |
| D16 | 00001000 | D239 | 11110111 |  |
| D144 | 00001001 | D111 | 11110110 |  |
| D80 | 00001010 | D175 | 11110101 |  |
| D208 | 00001011 | D47 | 11110100 |  |
| D48 | 00001100 | D207 | 11110011 |  |
| D176 | 00001101 | D79 | 11110010 |  |
| D112 | 00001110 | D143 | 11110001 |  |
| D240 | 00001111 | *D15 | 11110000 |  |
| *D192 | 00000011 | *D63 | 11111100 | B⊕C'•C⊕D'•D⊕E'•E⊕F'•F⊕G•G⊕H' |
| D193 | 10000011 | D62 | 01111100 |  |
| *D16 | 00001000 |  |  | E⊕F•D'•G'•H' |
| D17 | 10001000 |  |  |  |
| D18 | 01001000 |  |  |  |
| D19 | 11001000 |  |  |  |
| D20 | 00101000 |  |  |  |
| D21 | 10101000 |  |  |  |
| D22 | 01101000 |  |  |  |
| D23 | 11101000 |  |  |  |
| *D32 | 00000100 |  |  |  |
| D33 | 10000100 |  |  |  |
| D34 | 01000100 |  |  |  |
| D35 | 11000100 |  |  |  |
| D36 | 00100100 |  |  |  |
| D37 | 10100100 |  |  |  |
| D38 | 01100100 |  |  |  |
| D39 | 11100100 |  |  |  |

FIG. 44C j-bit ENCODING

| Name | ABCDEFGH | Name | ABCDEFGH | Coding Label |
|---|---|---|---|---|
| *D64 | 00000010 | | | |
| *D65 | 10000010 | | | |
| *D66 | 01000010 | | | |
| D67 | 11000010 | | | D'•E'•F'•G•H' |
| *D68 | 00100010 | | | |
| D69 | 10100010 | | | |
| D70 | 01100010 | | | |
| *D71 | 11100010 | | | |
| D119 | 11101110 | D136 | 00010001 | |
| D123 | 11011110 | D132 | 00100001 | (B⊕E'•C⊕D+A⊕G•B⊕C')• |
| D120 | 00011110 | D135 | 11100001 | A⊕B'•E⊕F'•F⊕G'•G⊕H |
| *D112 | 00001110 | *D143 | 11110001 | |
| *D80 | 00001010 | | | |
| D81 | 10001010 | | | |
| D82 | 01001010 | | | |
| D84 | 00101010 | | | (A'•B'+A'•C'+B'•C')•D⊕E•K'•F'•G•H' |
| *D72 | 00010010 | | | |
| D73 | 10010010 | | | |
| D74 | 01010010 | | | |
| D76 | 00110010 | | | |
| | | D248 | 00011111 | |
| | | D249 | 10011111 | |
| | | D250 | 01011111 | |
| | | D251 | 11011111 | K'•D•E•F•G•H |
| | | *D252 | 00111111 | |
| | | *D253 | 10111111 | |
| | | *D254 | 01111111 | |
| | | *D255 | 11111111 | |
| | | D216 | 00011011 | |
| | | D219 | 11011011 | |
| | | D221 | 10111011 | |
| | | D222 | 01111011 | |
| | | *D223 | 11111011 | (A'•B'•C'+A•B•$\overline{C'}$+A•$\overline{B'}$•C+B•C)• |
| | | D232 | 00010111 | E⊕F•D•G•H |
| | | D235 | 11010111 | |
| | | D237 | 10110111 | |
| | | D238 | 01110111 | |
| | | *D239 | 11110111 | |

FIG. 44D j-bit ENCODING

| Name | ABCDEFGH | Name | ABCDEFGH | Coding Label |
|---|---|---|---|---|
| D24 | 00011000 | | | |
| D25 | 10011000 | | | |
| D26 | 01011000 | | | |
| D28 | 00111000 | | | |
| D40 | 00010100 | | | |
| D41 | 10010100 | | | $(D \cdot E \cdot F' + D \cdot E' \cdot F + D' \cdot E \cdot F) \cdot$ |
| D42 | 01010100 | | | $(A' \cdot B' + A' \cdot C' + B' \cdot C') \cdot G' \cdot H'$ |
| D44 | 00110100 | | | |
| *D48 | 00001100 | | | |
| D49 | 10001100 | | | |
| D50 | 01001100 | | | |
| D52 | 00101100 | | | |
| *D128 | 00000001 | *D127 | 11111110 | |
| D129 | 10000001 | D126 | 01111110 | |
| D130 | 01000001 | D125 | 10111110 | |
| D131 | 11000001 | D124 | 00111110 | $K' \cdot C \oplus D' \cdot D \oplus E' \cdot E \oplus F' \cdot F \oplus G'$ |
| *D0 | 00000000 | *D255 | 11111111 | |
| *D1 | 10000000 | D254 | 01111111 | |
| *D2 | 01000000 | *D253 | 10111111 | |
| *D3 | 11000000 | D252 | 00111111 | |

FIG. 45A  POSITIVE REQUIRED DISPARITY PDRE

| Name | ABCDEFGH | Coding Label |
|---|---|---|
| D66  | 01000010 | |
| D194 | 01000011 | |
| D196 | 00100011 | (D•G'•H'+D'•G)•B⊕C•A'•E'•F' |
| D68  | 00100010 | |
| D10  | 01010000 | |
| D12  | 00110000 | |
| D132 | 00100001 | |
| D133 | 10100001 | (A'+B')•C•D'•E'•F'•G'•H |
| D134 | 01100001 | |
| D24  | 00011000 | |
| D40  | 00010100 | |
| D72  | 00010010 | |
| D88  | 00011010 | |
| D104 | 00010110 | |
| D120 | 00011110 | |
| D136 | 00010001 | (E'•F'•G•H+E⊕F+G⊕H)•A'•B'•C'•D |
| D152 | 00011001 | |
| D168 | 00010101 | |
| D184 | 00011101 | |
| D200 | 00010011 | |
| D216 | 00011011 | |
| D232 | 00010111 | |
| D145 | 10001001 | |
| D146 | 01001001 | |
| D148 | 00101001 | |
| D137 | 10010001 | |
| D138 | 01010001 | |
| D140 | 00110001 | |
| D17  | 10001000 | |
| D18  | 01001000 | |
| D20  | 00101000 | (D⊕E•F'•G'•H+E⊕F•D'•G'•H'+G⊕H•D'•E'•F)• |
| D33  | 10000100 | (A•B'•C'+A'•B•C'+A'•B'•C) |
| D34  | 01000100 | |
| D36  | 00100100 | |
| D97  | 10000110 | |
| D98  | 01000110 | |
| D100 | 00100110 | |
| D161 | 10000101 | |
| D162 | 01000101 | |
| D164 | 00100101 | |

FIG. 45B

POSITIVE REQUIRED DISPARITY PDRE

| Name | ABCDEFGH | Coding Label |
|------|----------|--------------|
| C9   | 10010000 |              |
| K81  | 10001010 |              |
| K82  | 01001010 | (F'+H)•K  (from Fig. 34G) |
| K84  | 00101010 |              |
| *K131* | *11000001* |          |
| *K248* | *00011111* |          |

FIG. 46A

NEGATIVE REQUIRED DISPARITY NDRE

| Name  | ABCDEFGH | Coding Label |
|-------|----------|--------------|
| D199  | 11100011 |              |
| D215  | 11101011 | (E'+F')•A•B•C•D'•G•H |
| D231  | 11100111 |              |
| D119  | 11101110 |              |
| D123  | 11011110 | (C⊕D•H'+D'•H)•A•B•E•F•G |
| *D243 | 11001111 |              |
| D247  | 11101111 |              |
| D121  | 10011110 |              |
| D122  | 01011110 | A⊕B•C'•D•E•F•G |
| D249  | 10011111 |              |
| D250  | 01011111 |              |
| D87   | 11101010 |              |
| D103  | 11100110 |              |
| D151  | 11101001 |              |
| D167  | 11100101 | (E⊕F•G'•H'+G⊕H•E'•F'+E⊕F•G⊕H)•A•B•C•D' |
| D23   | 11101000 |              |
| D39   | 11100100 |              |
| D71   | 11100010 |              |
| D135  | 11100001 |              |

FIG. 46B

NEGATIVE REQUIRED DISPARITY NDRE

| Name | ABCDEFGH | Coding Label |
|---|---|---|
| *K124* | *00111110* | K•C•D (from Fig. 34G) |
| D235 | 11010111 | |
| D237 | 10110111 | |
| D238 | 01110111 | |
| D243 | 11001111 | |
| D245 | 10101111 | |
| D246 | 01101111 | |
| D91 | 11011010 | |
| D93 | 10111010 | |
| D94 | 01111010 | |
| D115 | 11001110 | |
| D117 | 10101110 | |
| D118 | 01101110 | (D⊕E•F•G•H+D⊕F•E•G•H'+D•E•F'•H+D•E'•F•G)• |
| D155 | 11011001 | (A•B•C'+A•B'•C+A'•B•C) |
| D157 | 10111001 | |
| D158 | 01111001 | |
| D219 | 11011011 | |
| D221 | 10111011 | |
| D222 | 01111011 | |
| *D235 | 11010111 | |
| *D237 | 10110111 | |
| *D238 | 01110111 | |
| D107 | 11010110 | |
| D109 | 10110110 | |
| D110 | 01110110 | |
| D183 | 11101101 | |
| D187 | 11011101 | (B•C•D'+B•C'•D+B'•C•D)•A•E•F•G'•H |
| D189 | 10111101 | |

FIG. 47

POSITIVE BLOCK DISPARITY PDB

| Name | ABCDEFGH | Coding Label |
|---|---|---|
| D235 | 11010111 | |
| D237 | 10110111 | |
| D238 | 01110111 | |
| D243 | 11001111 | |
| D245 | 10101111 | |
| D246 | 01101111 | $(D \oplus E \cdot F + D \cdot E \cdot F') \cdot G \cdot H \cdot$ |
| D219 | 11011011 | $(A \cdot B \cdot C' + A \cdot B' \cdot C + A' \cdot B \cdot C)$ |
| D221 | 10111011 | |
| D222 | 01111011 | |
| D183 | 11101101 | |
| D187 | 11011101 | $(B \cdot C \cdot D' + B \cdot C' \cdot D + B' \cdot C \cdot D) \cdot A \cdot E \cdot F \cdot G' \cdot H$ |
| D189 | 10111101 | |
| D215 | 11101011 | $E \oplus F \cdot A \cdot B \cdot C \cdot D' \cdot G \cdot H$ |
| D231 | 11100111 | |
| D119 | 11101110 | |
| D123 | 11011110 | $(C \oplus D \cdot H' + D' \cdot H) \cdot A \cdot B \cdot E \cdot F \cdot G$ |
| *D243 | 11001111 | |
| D247 | 11101111 | |
| D249 | 10011111 | $A \oplus B \cdot C' \cdot D \cdot E \cdot F \cdot G \cdot H$ |
| D250 | 01011111 | |

FIG. 48

NEGATIVE BLOCK DISPARITY NDB

| Name | ABCDEFGH | Coding Label |
|---|---|---|
| D66 | 01000010 | |
| D194 | 01000011 | |
| D196 | 00100011 | (D•G'•H'+D'•G)•B⊕C•A'•E'•F' |
| D68 | 00100010 | |
| D10 | 01010000 | |
| D12 | 00110000 | |
| D132 | 00100001 | |
| D133 | 10100001 | (A'+B')•C•D'•E'•F'•G'•H |
| D134 | 01100001 | |
| D24 | 00011000 | |
| D40 | 00010100 | |
| D88 | 00011010 | |
| D104 | 00010110 | {E⊕F•(G•H)'+E'•F'•(G+H)}•A'•B'•C'•D |
| D152 | 00011001 | |
| D168 | 00010101 | |
| D72 | 00010010 | |
| D136 | 00010001 | |
| D200 | 00010011 | |
| D145 | 10001001 | |
| D146 | 01001001 | |
| D148 | 00101001 | |
| D137 | 10010001 | |
| D138 | 01010001 | |
| D140 | 00110001 | |
| D17 | 10001000 | |
| D18 | 01001000 | |
| D20 | 00101000 | (D⊕E•F'•G'•H+E⊕F•D'•G'•H'+G⊕H•D'•E'•F)• |
| D33 | 10000100 | (A•B'•C'+A'•B•C'+A'•B'•C) |
| D34 | 01000100 | |
| D36 | 00100100 | |
| D97 | 10000110 | |
| D98 | 01000110 | |
| D100 | 00100110 | |
| D161 | 10000101 | |
| D162 | 01000101 | |
| D164 | 00100101 | |
| C9 | 10010000 | |
| K81 | 10001010 | |
| K82 | 01001010 | K•F'   (from FIG. 34G) |
| K84 | 00101010 | |
| K131 | 11000001 | |

FIG. 49A

204 VALID VECTORS WITH i ≠ j

| Name ij=10 | Name ij=01 | abcdefgh | Name ij=10 | Name ij=01 | abcdefgh | Valid Label |
|---|---|---|---|---|---|---|
| D12A | D243P | 11001111 | D243A | D12P | 00110000 | $(a \oplus b' \cdot b \oplus c \cdot c \oplus d' + a \oplus b \cdot c \oplus d) \cdot$ |
| D10A | D245P | 10101111 | D245A | D10P | 01010000 | $d \oplus e \cdot e \oplus f' \cdot f \oplus g \cdot g \oplus h' \cdot i \oplus j$ |
| C9A | D246P | 01101111 | D246A | C9P | 10010000 | |
| D72A | D183P | 11101101 | D183A | D72P | 00010010 | $(a \oplus b \cdot b \oplus c \cdot c \oplus d' + a \oplus b' \cdot c \oplus d) \cdot$ |
| D68A | D187P | 11011101 | D187A | D68P | 00100010 | $a \oplus e' \cdot e \oplus f' \cdot f \oplus g \cdot g \oplus h \cdot i \oplus j$ |
| D66A | D189P | 10111101 | D189A | D66P | 01000010 | |
| D232A | D23P | 11101000 | D23A | D232P | 00010111 | |
| D216A | D39P | 11100100 | D39A | D216P | 00011011 | $(d \oplus h' \cdot e \oplus f \cdot g \oplus h' + d \oplus e' \cdot e \oplus f' \cdot$ |
| D184A | D71P | 11100010 | D71A | D184P | 00011101 | $g \oplus h) \cdot a \oplus b' \cdot b \oplus c' \cdot c \oplus d \cdot i \oplus j$ |
| D120A | D135P | 11100001 | D135A | D120P | 00011110 | |
| D136A | D119P | 11101110 | D119A | D136P | 00010001 | $a \oplus b' \cdot b \oplus g' \cdot g \oplus h \cdot$ |
| D132A | D123P | 11011110 | D123A | D132P | 00100001 | $c \oplus d \cdot e \oplus f' \cdot f \oplus g' \cdot i \oplus j$ |
| | D249P | 10011111 | D249A | | 01100000 | $a \oplus b \cdot d \oplus e' \cdot g \oplus h' \cdot d \oplus i \cdot$ |
| | D250P | 01011111 | D250A | | 10100000 | $c \oplus d \cdot e \oplus f' \cdot f \oplus g' \cdot i \oplus j$ |

FIG. 49B

204 VALID VECTORS WITH i ≠ j

| Name ij=10 | Name ij=01 | abcdefgh | Name ij=10 | Name ij=01 | abcdefgh | Valid Label |
|---|---|---|---|---|---|---|
| D53 | D63 | 10101100 | D202 | D192 | 01010011 | |
| D54 | D55 | 01101100 | D201 | D9 | 10010011 | |
| D57 | D48 | 10011100 | D198 | D207 | 01100011 | |
| D58 | D59 | 01011100 | D197 | D5 | 10100011 | |
| D51 | D3 | 11001100 | D204 | D252 | 00110011 | |
| D60 | D124 | 00111100 | D195 | D131 | 11000011 | |
| D85 | D65 | 10101010 | D170 | D190 | 01010101 | |
| D86 | D0 | 01101010 | D169 | D255 | 10010101 | |
| D89 | D56 | 10011010 | D166 | D6 | 01100101 | $(a \oplus b' \cdot b \oplus c \cdot c \oplus d' + a \oplus b \cdot c \oplus d) \cdot$ |
| D90 | D248 | 01011010 | D165 | D7 | 10100101 | $(e \oplus h \cdot f \oplus g + e \oplus f \cdot g \oplus h) \cdot i \oplus j$ |
| D83 | D80 | 11001010 | D172 | D175 | 00110101 | |
| D92 | D95 | 00111010 | D163 | D160 | 11000101 | |
| D101 | D125 | 10100110 | D154 | D130 | 01011001 | |
| D102 | D126 | 01100110 | D153 | D129 | 10011001 | |
| D105 | D1 | 10010110 | D150 | D254 | 01101001 | |
| D106 | D8 | 01010110 | D149 | D61 | 10101001 | |
| D99 | D96 | 11000110 | D156 | D159 | 00111001 | |
| D108 | D111 | 00110110 | D147 | D144 | 11001001 | |
| D113 | D253 | 10001110 | D142 | D2 | 01110001 | $(a \oplus b' \cdot b \oplus c \cdot c \oplus d + a \oplus b \cdot c \oplus d') \cdot$ |
| D114 | D127 | 01001110 | D141 | D128 | 10110001 | $(d \oplus e \cdot e \oplus f' \cdot f \oplus g' \cdot g \oplus h) \cdot i \oplus j$ |
| D116 | D112 | 00101110 | D139 | D143 | 11010001 | |
| D75 | D79 | 11010010 | D180 | D176 | 00101101 | |
| D77 | D64 | 10110010 | D178 | D191 | 01001101 | |
| D78 | D15 | 01110010 | D177 | D240 | 10001101 | |
| D27 | D31 | 11011000 | D228 | D224 | 00100111 | $(a \oplus b' \cdot b \oplus c \cdot c \oplus d + a \oplus b \cdot c \oplus d') \cdot$ |
| D29 | D16 | 10111000 | D226 | D239 | 01000111 | $(d \oplus f \cdot e \oplus g + e \oplus f \cdot g \oplus h') \cdot d \oplus h \cdot$ |
| D30 | D62 | 01111000 | D225 | D193 | 10000111 | $i \oplus j$ |
| D43 | D47 | 11010100 | D212 | D208 | 00101011 | |
| D45 | D32 | 10110100 | D210 | D223 | 01001011 | |
| D46 | D4 | 01110100 | D209 | D251 | 10001011 | |
| D40A | D215P | 11101011 | D215A | D40P | 00010100 | |
| D36A | D219P | 11011011 | D219A | D36P | 00100100 | |
| D34A | D221P | 10111011 | D221A | D34P | 01000100 | |
| D33A | D222P | 01111011 | D222A | D33P | 10000100 | $(a \oplus b' \cdot b \oplus g' \cdot c \oplus d + a \oplus b \cdot c \oplus d' \cdot$ |
| D24A | D231P | 11100111 | D231A | D24P | 00011000 | $d \oplus h') \cdot e \oplus f \cdot g \oplus h' \cdot i \oplus j$ |
| D20A | D235P | 11010111 | D235A | D20P | 00101000 | |
| D18A | D237P | 10110111 | D237A | D18P | 01001000 | |
| D17A | D238P | 01110111 | D238A | D17P | 10001000 | |

FIG. 50A

148 VALID VECTORS WITH i=j

| Name | abcdefghij | Name | abcdefghij | Valid Label |
|---|---|---|---|---|
| D181 | 1010110100 | D74 | 0101001011 | |
| D182 | 0110110100 | D73 | 1001001011 | |
| D185 | 1001110100 | D70 | 0110001011 | |
| D186 | 0101110100 | D69 | 1010001011 | |
| D179 | 1100110100 | D76 | 0011001011 | |
| D188 | 0011110100 | D67 | 1100001011 | |
| D117P | 1010111000 | D117A | 0101000111 | |
| D118P | 0110111000 | D118A | 1001000111 | |
| D121P | 1001111000 | D121A | 0110000111 | |
| D122P | 0101111000 | D122A | 1010000111 | |
| D115P | 1100111000 | D115A | 0011000111 | |
| K124P | 0011111000 | K124A | 1100000111 | (a⊕b'•b⊕c•c⊕d'+a⊕b•c⊕d)• |
| D213 | 1010101100 | D42 | 0101010011 | (e⊕f'•f⊕i•g⊕h+e⊕f•g⊕h'•h⊕i)•i⊕j' |
| D214 | 0110101100 | D41 | 1001010011 | |
| D217 | 1001101100 | D38 | 0110010011 | |
| D218 | 0101101100 | D37 | 1010010011 | |
| D211 | 1100101100 | D44 | 0011010011 | |
| D220 | 0011101100 | D35 | 1100010011 | |
| D229 | 1010011100 | D26 | 0101100011 | |
| D230 | 0110011100 | D25 | 1001100011 | |
| D233 | 1001011100 | D22 | 0110100011 | |
| D234 | 0101011100 | D21 | 1010100011 | |
| D227 | 1100011100 | D28 | 0011100011 | |
| D236 | 0011011100 | D19 | 1100100011 | |
| D91P | 1101101000 | D91A | 0010010111 | |
| D93P | 1011101000 | D93A | 0100010111 | |
| D94P | 0111101000 | D94A | 1000010111 | |
| D155P | 1101100100 | D155A | 0010011011 | |
| D157P | 1011100100 | D157A | 0100011011 | |
| D158P | 0111100100 | D158A | 1000011011 | |
| D107P | 1101011000 | D107A | 0010100111 | (a⊕b'•b⊕c•c⊕d+a⊕b•c⊕d')•d⊕i•i⊕j'• |
| D109P | 1011011000 | D109A | 0100100111 | (e⊕f'•f⊕g•g⊕h'•h⊕i+e⊕f•g⊕h) |
| D110P | 0111011000 | D110A | 1000100111 | |
| D171 | 1101010100 | D84 | 0010101011 | |
| D173 | 1011010100 | D82 | 0100101011 | |
| D174 | 0111010100 | D81 | 1000101011 | |
| D203 | 1101001100 | D52 | 0010110011 | |
| D205 | 1011001100 | D50 | 0100110011 | |
| D206 | 0111001100 | D49 | 1000110011 | |

FIG. 50B

148 VALID VECTORS WITH i=j

| Name | abcdefghij | Name | abcdefghij | Valid Label |
|---|---|---|---|---|
| K81P | 1000101000 | K81A | 0111010111 | |
| K82P | 0100101000 | K82A | 1011010111 | |
| K84P | 0010101000 | K84A | 1101010111 | |
| D88P | 0001101000 | D88A | 1110010111 | |
| D145P | 1000100100 | D145A | 0111011011 | |
| D146P | 0100100100 | D146A | 1011011011 | |
| D148P | 0010100100 | D148A | 1101011011 | |
| D152P | 0001100100 | D152A | 1110011011 | $(a \oplus b \cdot c \oplus d' \cdot d \oplus i' + a \oplus b' \cdot b \oplus i' \cdot c \oplus d) \cdot$ |
| D161P | 1000010100 | D161A | 0111101011 | $e \oplus f \cdot g \oplus h \cdot i \oplus j'$ |
| D162P | 0100010100 | D162A | 1011101011 | |
| D164P | 0010010100 | D164A | 1101101011 | |
| D168P | 0001010100 | D168A | 1110101011 | |
| D97P | 1000011000 | D97A | 0111100111 | |
| D98P | 0100011000 | D98A | 1011100111 | |
| D100P | 0010011000 | D100A | 1101100111 | |
| D104P | 0001011000 | D104A | 1110100111 | |
| D241 | 1000111100 | D14 | 0111000011 | |
| D242 | 0100111100 | D13 | 1011000011 | $(a \oplus b \cdot c \oplus d' \cdot d \oplus i' + a \oplus b' \cdot b \oplus i' \cdot c \oplus d) \cdot$ |
| D244 | 0010111100 | D11 | 1101000011 | $e \oplus f' \cdot f \oplus g \cdot g \oplus h' \cdot h \oplus i \cdot i \oplus j'$ |
| K248P | 0001111100 | K248A | 1110000011 | |
| D194P | 0100001100 | D194A | 1011110011 | $(b \oplus c' \cdot c \oplus d \cdot d \oplus e + b \oplus c \cdot d \oplus e') \cdot$ |
| D196P | 0010001100 | D196A | 1101110011 | $a \oplus e' \cdot e \oplus f' \cdot f \oplus g \cdot g \oplus h' \cdot h \oplus i \cdot i \oplus j'$ |
| D200P | 0001001100 | D200A | 1110110011 | |
| D87P | 1110101000 | D87A | 0001010111 | |
| D151P | 1110100100 | D151A | 0001011011 | |
| D103P | 1110011000 | D103A | 0001100111 | $(e \oplus f' \cdot g \oplus h' \cdot h \oplus i + e \oplus f \cdot g \oplus h) \cdot$ |
| D167P | 1110010100 | D167A | 0001101011 | $a \oplus b' \cdot b \oplus c' \cdot c \oplus d \cdot d \oplus i' \cdot i \oplus j'$ |
| D199P | 1110001100 | D199A | 0001110011 | |
| D247P | 1110111100 | D247A | 0001000011 | |
| *K131P* | *1100000100* | *K131A* | *0011111011* | |
| D140P | 0011000100 | D140A | 1100111011 | |
| D133P | 1010000100 | D133A | 0101111011 | $(a \oplus b' \cdot b \oplus c \cdot c \oplus d' + a \oplus b \cdot c \oplus d) \cdot$ |
| D134P | 0110000100 | D134A | 1001111011 | $e \oplus f' \cdot f \oplus g' \cdot g \oplus h \cdot h \oplus i \cdot i \oplus j'$ |
| D137P | 1001000100 | D137A | 0110111011 | |
| D138P | 0101000100 | D138A | 1010111011 | |

FIG. 51A

89 ALTERNATE VECTORS

| Name | abcdefghij | Name | abcdefghij | Alternate Vector Label |
|---|---|---|---|---|
| D40A | 1110101110 | D215A | 0001010010 | |
| D36A | 1101101110 | D219A | 0010010010 | |
| D34A | 1011101110 | D221A | 0100010010 | |
| D33A | 0111101110 | D222A | 1000010010 | $(a \oplus b' \cdot b \oplus g' \cdot \overline{c \oplus d} + \overline{a \oplus b} \cdot c \oplus d' \cdot d \oplus h') \cdot$ |
| D24A | 1110011110 | D231A | 0001100010 | $e \oplus f \cdot g \oplus h' \cdot i \cdot j'$ |
| D20A | 1101011110 | D235A | 0010100010 | |
| D18A | 1011011110 | D237A | 0100100010 | |
| D17A | 0111011110 | D238A | 1000100010 | |
| D232A | 1110100010 | D23A | 0001011110 | |
| D216A | 1110010010 | D39A | 0001101110 | $(d \oplus h' \cdot \overline{e \oplus f} \cdot g \oplus h' + d \oplus e' \cdot e \oplus f' \cdot \overline{g \oplus h}) \cdot$ |
| D184A | 1110001010 | D71A | 0001110110 | $a \oplus b' \cdot b \oplus c' \cdot \overline{c \oplus d} \cdot i \cdot j'$ |
| D120A | 1110000110 | D135A | 0001111010 | |
| D72A | 1110110110 | D183A | 0001001010 | |
| D68A | 1101110110 | D187A | 0010001010 | $(a \oplus b \cdot b \oplus c \cdot \overline{c \oplus d}' + a \oplus b' \cdot \overline{c \oplus d}) \cdot$ |
| D66A | 1011110110 | D189A | 0100001010 | $a \oplus e' \cdot e \oplus f' \cdot f \oplus g \cdot g \oplus h \cdot i \cdot j'$ |
| D136A | 1110111010 | D119A | 0001000110 | |
| D132A | 1101111010 | D123A | 0010000110 | $a \oplus b' \cdot \overline{c \oplus d} \cdot a \oplus e' \cdot e \oplus f' \cdot f \oplus g' \cdot g \oplus h \cdot i \cdot j'$ |
| D12A | 1100111110 | D243A | 0011000010 | |
| D10A | 1010111110 | D245A | 0101000010 | $(a \oplus b' \cdot \overline{b \oplus c} \cdot c \oplus d' + \overline{a \oplus b} \cdot c \oplus d) \cdot$ |
| C9A | 0110111110 | D246A | 1001000010 | $d \oplus e \cdot e \oplus f' \cdot f \oplus g' \cdot g \oplus h' \cdot i \cdot j'$ |
| K131A | 0011111011 | D115A | 0011000111 | |
| D140A | 1100111011 | K124A | 1100000111 | |
| D133A | 0101111011 | D117A | 0101000111 | $(a \oplus b' \cdot \overline{b \oplus c} \cdot c \oplus d' + \overline{a \oplus b} \cdot c \oplus d) \cdot$ |
| D134A | 1001111011 | D118A | 1001000111 | $e \oplus f' \cdot f \oplus g' \cdot g \oplus h \cdot i \cdot j$ |
| D137A | 0110111011 | D121A | 0110000111 | |
| D138A | 1010111011 | D122A | 1010000111 | |
| | | D91A | 0010010111 | |
| | | D93A | 0100010111 | |
| | | D94A | 1000010111 | $(b \oplus c \cdot a' + a \cdot b' \cdot c') \cdot \overline{g \oplus h} \cdot d' \cdot e' \cdot f \cdot i \cdot j$ |
| | | D155A | 0010011011 | |
| | | D157A | 0100011011 | |
| | | D158A | 1000011011 | |
| | | D151A | 0001011011 | |
| | | D167A | 0001101011 | |
| | | D87A | 0001010111 | $(e \oplus f \cdot g \oplus h + \overline{e} \cdot f \cdot g' \cdot h') \cdot a' \cdot b' \cdot c' \cdot \overline{d} \cdot i \cdot j$ |
| | | *D103A | 0001100111 | |
| | | D199A | 0001110011 | |
| | | D249A | 0110000010 | |
| | | D250A | 1010000010 | $a \oplus b \cdot c \cdot d' \cdot e \cdot f' \cdot g' \cdot h' \cdot \overline{i} \cdot j'$ |

FIG. 51B

89 ALTERNATE VECTORS

| Name | abcdefghij | Name | abcdefghij | Alternate Vector Label |
|---|---|---|---|---|
| | | D103A | 0001100111 | |
| | | D107A | 0010100111 | $(c \oplus d \cdot a' \cdot b' + \overline{a \oplus b} \cdot c' \cdot d') \cdot e \cdot f' \cdot \overline{g'} \cdot h \cdot i \cdot j$ |
| | | D109A | 0100100111 | |
| | | D110A | 1000100111 | |
| | | D247A | 0001000011 | |
| | | K248A | 1110000011 | $a \oplus b' \cdot b \oplus c' \cdot \overline{c \oplus d} \cdot e' \cdot f' \cdot g' \cdot h' \cdot i \cdot j$ |
| | | D194A | 1011110011 | |
| | | D196A | 1101110011 | $(\overline{b \oplus c} \cdot d + b \cdot c \cdot d') \cdot a \cdot e \cdot f \cdot g' \cdot h' \cdot i \cdot j$ |
| | | D200A | 1110110011 | |
| | | K81A | 0111010111 | |
| | | K82A | 1011010111 | |
| | | K84A | 1101010111 | |
| | | D88A | 1110010111 | |
| | | D145A | 0111011011 | |
| | | D146A | 1011011011 | |
| | | D148A | 1101011011 | |
| | | D152A | 1110011011 | $(a \oplus b \cdot c \cdot d + \overline{c \oplus d} \cdot a \cdot b) \cdot e \oplus f \cdot g \oplus h \cdot i \cdot j$ |
| | | D161A | 0111101011 | |
| | | D162A | 1011101011 | |
| | | D164A | 1101101011 | |
| | | D168A | 1110101011 | |
| | | D97A | 0111100111 | |
| | | D98A | 1011100111 | |
| | | D100A | 1101100111 | |
| | | D104A | 1110100111 | |

FIG. 52

A-bit DECODING

| Name | abcdefghij | A | Name | abcdefghij | A | Decoding Label |
|------|------------|---|------|------------|---|----------------|
| D80  | 1100101001 | 0 | D175 | 0011010101 | 1 | a⊕b'•b⊕c•c⊕d'•e⊕f•g⊕h•i'•j |
| D96  | 1100011001 | 0 | D159 | 0011100101 | 1 | |
| D144 | 1100100101 | 0 | D111 | 0011011001 | 1 | |
| D160 | 1100010101 | 0 | D95  | 0011101001 | 1 | |
| D128 | 1011000101 | 0 | D127 | 0100111001 | 1 | (d⊕e•e⊕f'•g⊕h +b⊕g'•e⊕f•g⊕h') |
| D64  | 1011001001 | 0 | D191 | 0100110101 | 1 | • a⊕b•b⊕c•c⊕d'•i'•j |
| D32  | 1011010001 | 0 | D223 | 0100101101 | 1 | |
| D16  | 1011100001 | 0 | D239 | 0100011101 | 1 | |
| D48  | 1001110001 | 0 | D207 | 0110001101 | 1 | a⊕b•a⊕e•b⊕c'•d⊕h•e⊕f'•f⊕g•i'•j |
| D240 | 1000110101 | 0 | D15  | 0111001001 | 1 | |
|      |            |   | D55  | 0110110001 | 1 | |
|      |            |   | D59  | 0101110001 | 1 | c⊕d•a'•b•e•f•g'•h'•i'•j |
| D56  | 1001101001 | 0 |      |            |   | |
| *D64 | 1011001001 | 0 |      |            |   | c⊕e•a•b'•d•f'•g•h'•i'•j |

FIG. 53

B-bit DECODING

| Name | abcdefghij | B | Name | abcdefghij | B | Decoding Label |
|------|------------|---|------|------------|---|----------------|
| D80  | 1100101001 | 0 | D175 | 0011010101 | 1 | a⊕b'•b⊕c•c⊕d'•e⊕f•g⊕h•i'•j |
| D96  | 1100011001 | 0 | D159 | 0011100101 | 1 | |
| D144 | 1100100101 | 0 | D111 | 0011011001 | 1 | |
| D160 | 1100010101 | 0 | D95  | 0011101001 | 1 | |
| D248 | 0101101001 | 0 | D7   | 1010010101 | 1 | |
| D0   | 0110101001 | 0 | D255 | 1001010101 | 1 | a⊕b•b⊕g'•c⊕d•e⊕f•f⊕g•g⊕h•i'•j |
| D4   | 0111010001 | 0 | D251 | 1000101101 | 1 | |
| *D0  | 0110101001 | 0 | *D255| 1001010101 | 1 | (b⊕c•c⊕d•e⊕f'•g⊕h'+b⊕c'•e⊕f• |
| D192 | 0101001101 | 0 | D63  | 1010110001 | 1 | c⊕h) • a⊕b•d⊕e•f⊕g•i'•j |
| D8   | 0101011001 | 0 |      |            |   | |
| *D192| 0101001101 | 0 |      |            |   | f⊕h•a'•b•c'•d•e'•g•i'•j |

FIG. 54

C-bit DECODING

| Name | abcdefghij | C | Name | abcdefghij | C | Decoding Label |
|---|---|---|---|---|---|---|
| D176 | 0010110101 | 0 | D79 | 1101001001 | 1 | |
| D112 | 0010111001 | 0 | D143 | 1101000101 | 1 | |
| D128 | 1011000101 | 0 | D127 | 0100111001 | 1 | |
| D64 | 1011001001 | 0 | D191 | 0100110101 | 1 | $(d \oplus e \cdot e \oplus f' \cdot \overline{g \oplus h} + d \oplus h \cdot \overline{e \oplus f} \cdot g \oplus h') \cdot$ |
| D224 | 0010011101 | 0 | D31 | 1101100001 | 1 | $a \oplus d' \cdot b \oplus c \cdot i' \cdot j$ |
| D208 | 0010101101 | 0 | D47 | 1101010001 | 1 | |
| D32 | 1011010001 | 0 | D223 | 0100101101 | 1 | |
| D16 | 1011100001 | 0 | D239 | 0100011101 | 1 | |
| D0 | 0110101001 | 0 | D255 | 1001010101 | 1 | |
| D65 | 1010101001 | 0 | D190 | 0101010101 | 1 | $a \oplus b \cdot c \oplus d \cdot d \oplus e \cdot e \oplus f \cdot f \oplus g \cdot g \oplus h \cdot i' \cdot j$ |
| D2 | 0111000101 | 0 | D253 | 1000111001 | 1 | |
| *D128 | 1011000101 | 0 | *D127 | 0100111001 | 1 | $a \oplus b \cdot c \oplus d' \cdot d \oplus e \cdot e \oplus f' \cdot f \oplus g' \cdot g \oplus h \cdot i' \cdot j$ |

FIG. 55

D-bit DECODING

| Name | abcdefghij | D | Name | abcdefghij | D | Decoding Label |
|---|---|---|---|---|---|---|
| D128 | 1011000101 | 0 | D127 | 0100111001 | 1 | |
| D64 | 1011001001 | 0 | D191 | 0100110101 | 1 | $(d \oplus e \cdot e \oplus f' \cdot \overline{g \oplus h} + b \oplus g' \cdot g \oplus h' \cdot \overline{e \oplus f}) \cdot$ |
| D32 | 1011010001 | 0 | D223 | 0100101101 | 1 | $a \oplus b \cdot b \oplus c \cdot c \oplus d' \cdot i' \cdot j$ |
| D16 | 1011100001 | 0 | D239 | 0100011101 | 1 | |
| D48 | 1001110001 | 0 | D207 | 0110001101 | 1 | |
| D192 | 0101001101 | 0 | D63 | 1010110001 | 1 | $a \oplus b \cdot a \oplus e' \cdot c \oplus d \cdot e \oplus f' \cdot f \oplus g \cdot \overline{g \oplus h} \cdot i' \cdot j$ |
| D130 | 0101100101 | 0 | D125 | 1010011001 | 1 | |
| D129 | 1001100101 | 0 | D126 | 0110011001 | 1 | $a \oplus b \cdot c \oplus d \cdot d \oplus e' \cdot e \oplus f \cdot f \oplus g' \cdot \overline{g \oplus h} \cdot i' \cdot j$ |
| D2 | 0111000101 | 0 | D253 | 1000111001 | 1 | |
| D1 | 1001011001 | 0 | D254 | 0110100101 | 1 | $a \oplus b \cdot b \oplus c' \cdot b \oplus g \cdot d \oplus e \cdot f \oplus g' \cdot \overline{g \oplus h} \cdot i' \cdot j$ |
| D4 | 0111010001 | 0 | D251 | 1000101101 | 1 | |
| *D2 | 0111000101 | 0 | *D253 | 1000111001 | 1 | $a \oplus b \cdot b \oplus c' \cdot c \oplus d' \cdot d \oplus e \cdot b \oplus g \cdot \overline{f \oplus h} \cdot i' \cdot j$ |
| | | | D61 | 1010100101 | 1 | |
| | | | *D63 | 1010110001 | 1 | $\overline{f \oplus h} \cdot a \cdot b' \cdot c \cdot d' \cdot e \cdot g' \cdot i' \cdot j$ |

FIG. 56
E-bit DECODING

| Name | abcdefghij | E | Name | abcdefghij | E | Coding Label |
|---|---|---|---|---|---|---|
| D65 | 1010101001 | 0 | D190 | 0101010101 | 1 | |
| D0 | 0110101001 | 0 | D255 | 1001010101 | 1 | $a \oplus b \cdot c \oplus d \cdot d \oplus e \cdot e \oplus f \cdot f \oplus g \cdot g \oplus h \cdot i' \cdot j$ |
| D130 | 0101100101 | 0 | D125 | 1010011001 | 1 | |
| D129 | 1001100101 | 0 | D126 | 0110011001 | 1 | $a \oplus \overline{b} \cdot c \oplus d \cdot d \oplus e' \cdot e \oplus f \cdot f \oplus g \cdot g \oplus h \cdot i' \cdot j$ |
| D3 | 1100110001 | 0 | D252 | 0011001101 | 1 | $a \oplus b' \cdot \overline{b \oplus c} \cdot c \oplus d' \cdot d \oplus e \cdot \overline{a \oplus e'} \cdot e \oplus f' \cdot f \oplus g \cdot \overline{g \oplus h'} \cdot i' \cdot j$ |

FIG. 57
F-bit DECODING

| Name | abcdefghij | F | Name | abcdefghij | F | Decoding Label |
|---|---|---|---|---|---|---|
| D193 | 1000011101 | 0 | D62 | 0111100001 | 1 | |
| D1 | 1001011001 | 0 | D254 | 0110100101 | 1 | $a \oplus b \cdot b \oplus c' \cdot b \oplus g \cdot e \oplus f \cdot f \oplus g' \cdot \overline{d \oplus h} \cdot i' \cdot j$ |
| D3 | 1100110001 | 0 | D252 | 0011001101 | 1 | |
| D4 | 0111010001 | 0 | D251 | 1000101101 | 1 | $a \oplus d \cdot b \oplus g \cdot c \oplus d' \cdot \overline{d \oplus e} \cdot f \oplus g \cdot g \oplus h' \cdot i' \cdot j$ |
| *D1 | 1001011001 | 0 | *D254 | 0110100101 | 1 | |
| D6 | 0110010101 | 0 | D56 | 1001101001 | 1 | $a \oplus b \cdot c \oplus d \cdot c \oplus g \cdot e \oplus f \cdot g \oplus h \cdot i' \cdot j$ |
| D7 | 1010010101 | 0 | D248 | 0101101001 | 1 | |
| D8 | 0101011001 | 0 | D61 | 1010100101 | 1 | |

FIG. 58
G-bit DECODING

| Name | abcdefghij | G | Name | abcdefghij | G | Decoding Label |
|---|---|---|---|---|---|---|
| D131 | 1100001101 | 0 | D124 | 0011110001 | 1 | |
| D15 | 0111001001 | 0 | D240 | 1000110101 | 1 | $a \oplus c \cdot b \oplus g' \cdot c \oplus d' \cdot d \oplus h \cdot e \oplus f \cdot f \oplus g \cdot i' \cdot j$ |
| D0 | 0110101001 | 0 | D255 | 1001010101 | 1 | |
| D1 | 1001011001 | 0 | D254 | 0110100101 | 1 | $a \oplus b \cdot b \oplus c' \cdot c \oplus d \cdot d \oplus e \cdot e \oplus f \cdot g \oplus h \cdot i' \cdot j$ |
| D5 | 1010001101 | 0 | | | | |
| D9 | 1001001101 | 0 | | | | $c \oplus d \cdot a \cdot b' \cdot e' \cdot f' \cdot g \cdot h \cdot i' \cdot j$ |
| D8 | 0101011001 | 0 | | | | |
| D56 | 1001101001 | 0 | | | | $\overline{a \oplus b} \cdot a \oplus e' \cdot e \oplus f \cdot c' \cdot d \cdot g \cdot h' \cdot i' \cdot j$ |

FIG. 59
H-bit DECODING

| Name | abcdefghij | H | Name | abcdefghij | H | Decoding Label |
|---|---|---|---|---|---|---|
| D7 | 1010010101 | 0 | D248 | 0101101001 | 1 | $\overline{a \oplus b} \cdot a \oplus d \cdot c \oplus g \cdot d \oplus f \cdot e \oplus g' \cdot g \oplus h \cdot i' \cdot j$ |
| D2 | 0111000101 | 0 | D253 | 1000111001 | 1 | |
| D9 | 1001001101 | 0 | | | | |
| D5 | 1010001101 | 0 | | | | $\overline{c \oplus d} \cdot a \cdot b' \cdot e' \cdot f' \cdot g \cdot h \cdot i' \cdot j$ |
| D6 | 0110010101 | 0 | | | | |
| D61 | 1010100101 | 0 | | | | $\overline{a \oplus b} \cdot a \oplus e' \cdot e \oplus f \cdot c \cdot d' \cdot g' \cdot h \cdot i' \cdot j$ |

FIG. 60
K-bit DECODING

| Name | abcdefghij | Name | abcdefghij | K | Decoding Label |
|---|---|---|---|---|---|
| C9P | 1001000001 | C9A | 0110111110 | 1 | $a \oplus c \cdot \overline{b \oplus d} \cdot c \oplus g' \cdot d \oplus h \cdot e \oplus f \cdot$ |
| K131P | 1100000100 | K131A | 0011111011 | 1 | $f \oplus g' \cdot f \oplus i' \cdot h \oplus j$ |
| K81P | 1000101000 | K81A | 0111010111 | 1 | |
| K82P | 0100101000 | K82A | 1011010111 | 1 | $(\overline{a \oplus b'} \cdot b \oplus c \cdot c \oplus d + \overline{a \oplus b} \cdot c \oplus d') \cdot$ |
| K84P | 0010101000 | K84A | 1101010111 | 1 | $d \oplus e \cdot d \oplus i' \cdot e \oplus f \cdot f \oplus g \cdot g \oplus h \cdot i \oplus j'$ |
| K124P | 0011111000 | K124A | 1100000111 | 1 | $a \oplus b' \cdot b \oplus g \cdot \overline{c \oplus h} \cdot d \oplus e \cdot e \oplus f \cdot$ |
| K248P | 0001111100 | K248A | 1110000011 | 1 | $f \oplus g' \cdot f \oplus i \cdot i \oplus j'$ |

FIG. 61

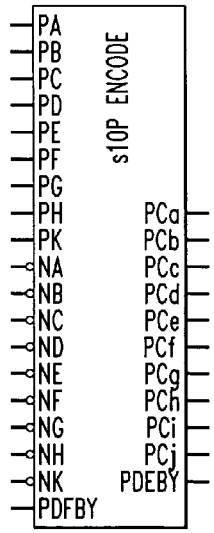

8B/10B-P BIT ENCODING obcdefgh

8B/10B-P BIT ENCODING ij

8B/10B-P DISPARITY Classifications

10B Validity Check

NB/MB CODING APPARATUS AND METHOD USING BOTH DISPARITY INDEPENDENT AND DISPARITY DEPENDENT ENCODED VECTORS

FIELD OF THE INVENTION

The present invention generally relates to communications systems and, more particularly, to an NB/MB coding apparatus and method.

BACKGROUND OF THE INVENTION

Coding is employed in communications systems for a variety of purposes. Among these are the improvement of transmission reliability, DC balance, the detection of errors, and the correction of errors. U.S. Pat. No. 5,699,062 to Widmer discloses a transmission code having local parity. The '062 patent describes a method and apparatus for converting 8-bit bytes to a set of coded 10-bit bytes such that if an error accrues in a bit location of a particular coded byte, it generates an invalid coded byte. Further, the set of coded bytes includes a comma which is confined to a single byte. The bit sequence of the comma is singular, i.e., the sequence of bits corresponding to the comma cannot be found in any byte sequence with another alignment relative to the byte boundaries. Vertical parity is used to identify the bit location of errors within a byte known to be erroneous.

The '062 patent does not provide a specific assignment of source vectors to encoded vectors. Accordingly, it would be desirable to provide a coding implementation that can be efficiently implemented in hardware.

SUMMARY OF THE INVENTION

Principles of the present invention provide techniques for implementing a coding scheme. An exemplary method, according to one aspect of the present invention, encodes N-binary symbol (NB) source data vectors into M-binary symbol (MB) encoded vectors, where M is greater than N which in turn is greater than 0. The exemplary method can include the steps of obtaining a plurality of NB source data vectors and encoding the NB source data vectors into a plurality of MB encoded vectors according to an encoding scheme. The encoding scheme can map at least a first portion of the NB source data vectors into MB encoded vectors that are disparity independent. Further, the encoding scheme can map a second portion of the NB source data vectors into MB encoded vectors that are disparity dependent. The disparity dependent encoded vectors can have primary representations and alternate representations that are complementary to the primary representations. The MB encoded vectors can have M-N binary symbols appended to them by the encoding scheme. A fraction of the MB encoded vectors can have binary symbol changes other than whole-vector complementation, as compared to corresponding ones of the NB source data vectors. The encoding scheme can be preselected to reduce and/or substantially eliminate the amount of disparity dependent encoded vectors that have binary symbol changes, other than whole-vector complementation. The reduction of the amount of disparity dependent encoded vectors that have individual binary symbol changes can be in comparison to at least some other possible NB to MB encoding schemes.

In a more specific aspect of an exemplary embodiment of the invention, N=8, M=10, and an exemplary encoding scheme substantially eliminates the amount of disparity dependent encoded vectors having binary symbol changes other than whole vector complementation. The exemplary encoding scheme can produce a DC-balanced transmission code, and the NB source data vectors that map to disparity independent encoded vectors can include at least 60 balanced source data vectors that have a leading run-length no greater than 2 and are appended with a complementary pair of appended binary symbols corresponding to the aforementioned M-N binary symbols. The MB encoded vectors that have binary symbol changes compared to the source data vectors can be those of the disparity independent encoded vectors that have 8 binary symbols identical to corresponding ones of the disparity independent encoded vectors and two binary symbols that are complements of the pair of appended binary symbols. The exemplary encoding scheme can assign a majority of the NB source data vectors corresponding to the encoded vectors that have binary symbol changes, in complementary pairs, to corresponding pairs of the disparity independent MB encoded vectors that are complementary in all binary symbol positions except the appended binary symbols. Further, the exemplary encoding scheme can assign at least 8 vectors of the source data vectors that correspond to the disparity independent encoded vectors, having a leading run of 4 followed by two pairs of complementary binary symbols, to certain ones of the MB encoded vectors that have two leading binary symbols complemented with respect to corresponding ones of the 8 vectors. The exemplary encoding scheme can also assign a majority of the source data vectors that correspond to the encoded vectors with binary symbol changes, in complementary pairs, to corresponding pairs of disparity independent encoded vectors that are complementary in all binary symbol positions except the appended binary symbols.

The exemplary encoding scheme can also assign at least 8 vectors of the source data vectors that correspond to the disparity independent encoded vectors, having a leading run of 4, followed by a single binary symbol in 4 subsequent binary symbols, where said single binary symbol matches binary symbols in the leading run of 4, to selected ones of the encoded vectors that have a third binary symbol complemented with respect to corresponding ones of the 8 vectors. The exemplary encoding scheme can still further assign a majority of the NB source data vectors corresponding to the fraction of encoded vectors having binary symbol changes, in complementary pairs, to corresponding pairs of disparity independent encoded vectors that are complementary in all binary symbol positions except the appended binary symbols. The exemplary encoding scheme can yet further assign at least 8 vectors of the source data vectors that correspond to the disparity independent encoded vectors, having a leading run of 4 followed by a single binary symbol in 4 subsequent binary symbols, where said single binary symbol does not match binary symbols in the leading run of 4, to selected ones of the encoded vectors that have first, third and fourth binary symbols complemented with respect to corresponding ones of the 8 vectors.

In further specific aspects of the present invention, according to exemplary embodiments thereof, the source data vectors that correspond to the disparity independent encoded vectors can include at least 54 source data vectors that have an overall disparity of either +2 or −2, and have a running disparity of no greater than 2 after any given binary symbol position. These vectors can be appended with binary symbols 00 for those that have an overall disparity of +2, and with binary symbols 11, for those which have an overall disparity of −2. The source data vectors that correspond to disparity dependent encoded vectors can include at least 19 source data vectors that have a disparity of +2 and that are mapped to 19 disparity dependent balanced encoded vectors that have a required negative starting disparity and are identical to the source data vectors with two zeros appended to them. The 19 source data vectors in this case can satisfy at least one of the following conditions: (a) end in binary symbols 11001, (b) start with binary symbols 1110 and end with binary symbol 1, and (c) end with binary symbols 10 and have at most 3 leading ones or at most one leading 0.

The source data vectors that correspond to the disparity dependent encoded vectors can also include at least four balanced source data vectors that start with the binary symbols 1110 and are mapped to four disparity dependent balanced encoded vectors having a required negative starting disparity. The encoded vectors can have binary symbols identical to the balanced source data vectors with the binary symbols 01 appended to them. The source data vectors that correspond to the disparity dependent encoded vectors can further include at least four balanced source data vectors that start with the binary symbols 0001 and are mapped to four disparity dependent balanced encoded vectors that have a required positive starting disparity. These encoded vectors can have binary symbols identical to the source data vectors with the binary symbol 01 appended to them. Yet further, the source data vectors that correspond to the disparity dependent encoded vectors can include at least 18 source data vectors that have a disparity of +4 and that satisfy one of the following conditions: (a) the trailing four binary symbols include a complementary pair of binary symbols followed by 11, (b) the trailing four binary symbols are 1111 and the leading four binary symbols are either two pairs of complementary binary symbols or 1100, (c) the leading binary symbol is 1 and the trailing four binary symbols are 1101, and (d) the leading two binary symbols are 1 and the trailing four binary symbols are 1110. These 18 source data vectors can be mapped to 18 encoded vectors that have a disparity of +4 and a required negative starting disparity. The encoded vectors can have binary symbols identical to the 18 source data vectors with 01 appended thereto.

Yet further, the source data vectors that correspond to the disparity-dependent encoded vectors can include at least one source data vector in the form 11101111 that is mapped to one encoded vector having a disparity of +4 and a required negative starting disparity and is in the form 111011100. Still further, the source data vectors that are mapped to disparity-dependent encoded vectors can include at least 21 vectors that have a disparity of −2 and that satisfy one of the following conditions: (a) the trailing four binary symbols include 01 followed by a pair of complementary binary symbols, (b) the trailing binary symbols are either 1001 or 11010, (c) the leading binary symbol is 0 and the trailing four binary symbols are 0011, (d) the trailing five binary symbols are 10001, and (e) the trailing six binary symbols are 100001. The 21 source data vectors can be mapped to 21 encoded vectors that have a disparity of −4 and a required positive starting disparity, and the encoded vectors can have binary symbols that are identical to the source data vectors with the binary symbols 00 appended to them.

Still further, the source data vectors that correspond to the disparity dependent encoded vectors can include at least 15 vectors that have a disparity of −4 and satisfy one of the following conditions: (a) the trailing four binary symbols include a pair of complementary binary symbols followed by the binary symbols 00, (b) the first binary symbol is 0 and the last five binary symbols are 10000, (c) the leading binary symbol is 0 and the trailing four binary symbols are 0010, and (d) the leading two binary symbols are 00 and the trailing four binary symbols are 0001. The 15 data vectors can be mapped to 15 encoded vectors that have a disparity of −4 and a required positive starting disparity, and the binary symbols of the encoded vectors can be the same as those of the source data vectors with the binary symbols 01 appended to them.

In another specific aspect of certain embodiments of the present invention, the encoding scheme can assign at least 7 NB vectors, as control vectors, to at least 7 MB disparity dependent corresponding encoded control vectors that have primary representations and alternate representations that are complementary to the primary representations. The encoded control vectors can include the 7 NB vectors plus two appended binary symbols. The primary representations of the 7 NB corresponding encoded control vectors can satisfy at least one of the following conditions:

(i) disparity equals minus four, (ii) required starting disparity is positive, (iii) third, fifth, sixth, seventh and ninth binary symbols have a value of zero and first binary symbol has a value of one, (iv) fourth and eighth binary symbols are complementary, and (v) eighth and tenth binary symbols are complementary;

(i) disparity equals minus four, (ii) required starting disparity is positive, (iii) fourth, sixth, eighth, ninth and tenth binary symbols have a value of zero and fifth and seventh binary symbols have a value of one;

(i) disparity equals zero, (ii) required starting disparity is negative, (iii) first two binary symbols and last two binary symbols have a value of zero and third, fourth, fifth, sixth and seventh binary symbols have a value of one; and (i) disparity equals zero, (ii) required starting disparity is positive, (iii) first two binary symbols and last two binary symbols have a value of zero and fourth, fifth, sixth and seventh and eighth binary symbols have a value of one.

The seven NB control vectors can also have complementary alternate vectors. In certain exemplary embodiments of the present invention, the primary representations of the disparity dependent encoded vectors can end with either of two 2-binary symbol patterns. This can help to simplify the decoding process.

In still another aspect of an exemplary embodiment of the present invention, the encoding step can include the steps of appending M-N binary symbols to the NB source data vectors to obtain augmented vectors, complementing M binary symbols of a given one of the augmented vectors to obtain one of the alternate representations of one of the MB encoded vectors and complementing less than N binary symbols of another given one of the NB source data vectors. The M binary symbols can be complemented responsive to a determination that the given encoded vector is one of the disparity dependent encoded vectors and the current running disparity does not match the required starting disparity for the particular one of the MB encoded vectors. The complementing of less than N binary symbols can be responsive, at least in part, to a determination that the given encoded vector in such case is one of the disparity independent encoded vectors. The two complementing steps can be performed substantially in parallel.

An exemplary method of decoding encoded vectors into decoded source data vectors, according to another aspect of the present invention includes the step of obtaining a plurality of MB encoded vectors encoded according to a scheme of the kind described, and then decoding the encoded vectors into a plurality of source data vectors according to decoding rules of the encoding scheme.

An exemplary embodiment of an apparatus for encoding source data vectors into encoded vectors, according, for example, to a coding scheme of the kind described, and in accordance with yet another aspect of the invention, can include a binary symbol appending module, a full vector complementing module, and a binary symbol complementing module.

An exemplary embodiment of an apparatus for decoding MB encoded vectors into NB source data vectors, in accordance with a coding scheme of the kind described, and according to still a further aspect of the present invention, can include a full vector complementing module and a binary symbol complementing module.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 20–23 present tables of various encoded vectors according to aspects of an embodiment of the present invention;

FIG. 24 shows an individual trellis diagram pertinent to certain aspects of an embodiment of the present invention;

FIGS. 25–27 are tables showing encoded vectors according to aspects of an exemplary embodiment of the present invention;

FIG. 33 is a table depicting encoded vectors according to an embodiment of the present invention;

FIGS. 34A–34G are a summary table showing source data vectors and encoded vectors, as well as control vectors, in accordance with one specific embodiment of the invention;

FIGS. 35–48 are tables depicting generation of encoded 10B vectors according to an embodiment of the present invention;

FIGS. 51A–60 present tables depicting aspects of a decoding process in accordance with an embodiment of the present invention;

FIG. 61 is a block diagram of one exemplary form of encoding circuit according to an aspect of the present invention;

DETAILED DESCRIPTION OF PREFERRED EMBODIMENTS

Figure 1:
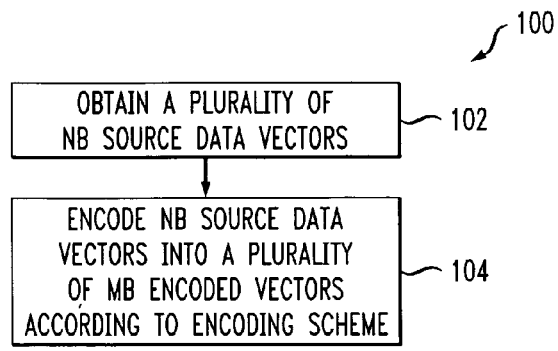
FIG. 1 is a flow chart depicting method steps of an exemplary method of encoding in accordance with one embodiment of the invention.

Attention should now be given to FIG. 1, which shows a flow chart 100 depicting method steps of an exemplary method, in accordance with one aspect of the present invention, of encoding N-binary symbol (NB) source data vectors into M-binary symbol (MB) encoded vectors, with M>N>0, including the steps of obtaining a plurality of NB source data vectors, as per block 102, and encoding the NB source data vectors into a plurality of MB encoded vectors according to an encoding scheme, as per block 104. The encoding scheme will typically include both encoding and decoding rules. In the encoding scheme, at least a first portion of the NB source data vectors are mapped into MB encoded vectors that are disparity independent. Further, at least a second portion of the NB source data vectors are mapped into MB encoded vectors that are disparity dependent and have primary representations and alternate representations that are complementary to the primary representations. The MB encoded vectors typically have M-N binary symbols appended to them by the encoding scheme. A fraction of the MB encoded vectors have binary symbol changes, other than whole-vector complementation, as compared to corresponding ones of the NB source data vectors (by way of a general example, whole vector complementation can be performed to obtain alternate representations of disparity dependent encoded vectors while binary symbol changes other than whole vector complementation can be made in connection with disparity-independent encoded vectors).

The encoding scheme can be pre-selected preselected to reduce or substantially eliminate the amount of disparity dependent encoded vectors that fall within the fraction of the MB encoded vectors that have binary symbol changes other than whole vector complementation compared to corresponding ones of the NB source data vectors. As used herein, "reducing" the amount of disparity dependent encoded vectors that fall within the fraction described contemplates a reduction compared to at least some other possible NB to MB encoding schemes. Furthermore, as used herein "substantially eliminating" the amount of disparity dependent encoded vectors that fall within the described fraction includes both a complete elimination and an elimination of a sufficient number of such disparity dependent encoded vectors falling within the described fraction such that encoding and decoding according to the encoding scheme can be implemented in hardware in a manner permitting advantageous gains due to parallel processing in at least some aspects of the encoding and decoding process.

In one exemplary encoding scheme according to the present invention, to be described in detail below, N=8, M=10, and the encoding scheme substantially eliminates the amount of disparity dependent encoded vectors that fall within the fraction of the MB encoded vectors that have binary symbol changes, other than whole-vector complementation, as compared to corresponding ones of the NB source data vectors.

Figure 2:
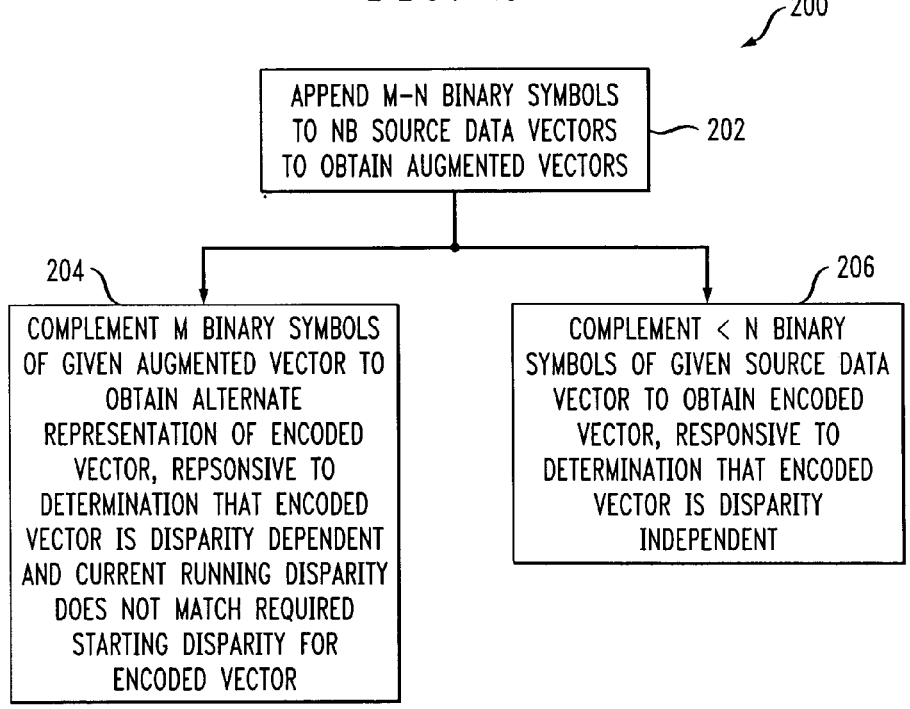
FIG. 2 is a flow chart showing one possible specific manner in which encoding can be performed.

Attention should now be given to FIG. 2, which presents a flow chart 200 showing exemplary method steps for encoding N-binary symbol (NB) source data vectors into M-binary symbol (MB) encoded vectors, with M>N>0, according to aspects of another exemplary embodiment of the present invention. At least some of the MB encoded vectors can include disparity dependent encoded vectors that have primary representations and alternate representations complementary to the primary representations. The method can include the steps of appending M-N binary symbols to the NB source data vectors to obtain augmented vectors, as per block 202, complementing M binary symbols of a given one of the augmented vectors as per block 204, and complementing less than N binary symbols of another given source data vector to obtain a corresponding portion of another given MB encoded vector, as per block 206. Blocks 204 and 206 are preferably performed substantially in parallel. As used herein, "substantially in parallel" means either entirely in parallel or with sufficient parallelism that desirable enhancements in processing associated with encoding and/or decoding can be achieved.

In the step of complementing M binary symbols of the given one of the augmented vectors, such complementing is performed to obtain one of the alternate representations of one of the MB encoded vectors that corresponds to a given one of the NB source data vectors from which the given one of the augmented vectors was obtained. The complementation of the M binary symbols is, at least in part, responsive to a determination that the one of the MB encoded vectors is one of the disparity dependent encoded vectors, and that a current running disparity does not match a required starting disparity for the one of the MB encoded vectors.

In the step of complementing less than N binary symbols of the other given one of the NB source data vectors, such complementing is carried out to obtain a corresponding portion of another given one of the MB encoded vectors that corresponds to the other given one of the NB source data vectors. The complementation of less than N binary symbols is, at least in part, responsive to a determination that the other given one of the MB encoded vectors is a disparity independent encoded vector. The method of FIG. 2 can implement an encoding scheme where, in the assignment of MB encoded vectors that have binary symbol changes compared to corresponding ones of the NB source data vectors, preference is given to MB encoded vectors that are balanced and disparity independent. As described, the complementing of less than N-binary symbols can be performed directly on the source data vectors; however, it is believed advantageous that such complementing be carried out on individual bits of the augmented vectors formed in the step illustrated in block 202. In one specific implementation of the method shown in FIG. 2, N=8, M=10, and the encoding scheme assigns substantially all of the MB encoded vectors that have binary symbol changes compared to corresponding ones of NB source data vectors to MB encoded vectors that are balanced and disparity independent. As used herein, "substantially all" includes both all and a sufficient number such that advantageous benefits associated with parallel processing, as discussed above, can be achieved.

The method steps depicted in FIG. 2 can also be adapted as sub-steps for performing the encoding step 104 depicted in FIG. 1 (using, for example, an encoding scheme as described in connection therewith). In such case, the appending step is substantially as previously described. In the step of complementing M binary symbols, the NB source data vectors from which the augmented vectors were obtained fall in the second portion of NB source data vectors as described above.

Figure 3:
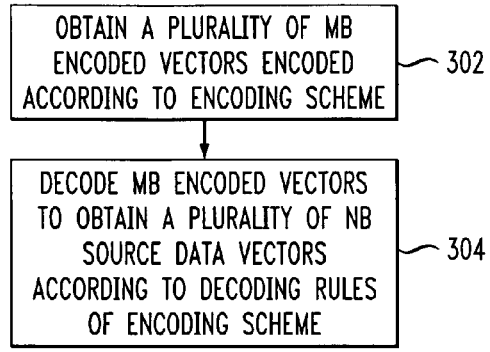
FIG. 3 is a flow chart showing method steps of an exemplary method of decoding in accordance with the present invention.

Attention should now be given to FIG. 3, which shows a flow chart 300 depicting exemplary method steps of decoding M-binary symbol (MB) encoded vectors into decoded N-binary symbol (NB) source data vectors, with M>N>0, according to another exemplary method of the present invention. The method includes the steps of obtaining a plurality of MB encoded vectors encoded according to an encoding scheme, as per block 302, and decoding the MB encoded vectors into a plurality of NB source data vectors according to decoding rules of the encoding scheme, as per block 304. The encoding scheme can be of any type in accordance with the present invention.

Figure 4:
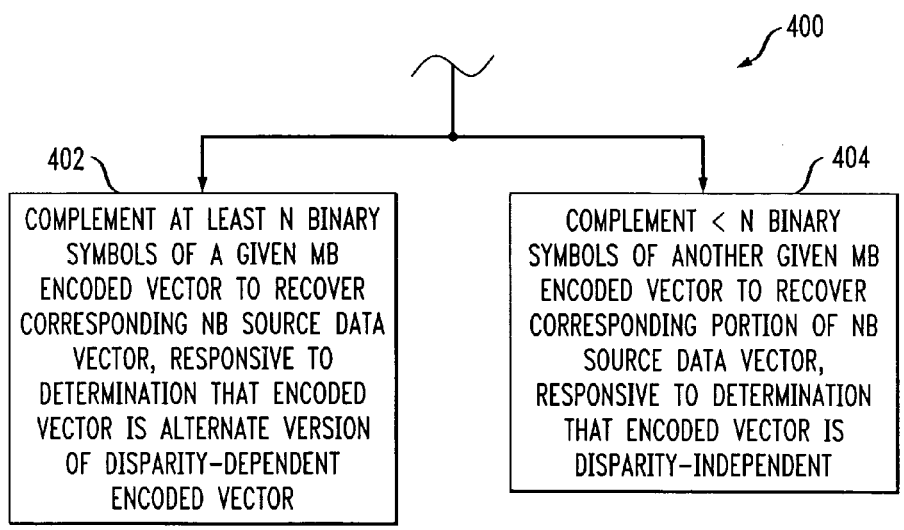
FIG. 4 is a flow chart showing one possible manner of decoding in accordance with the present invention.

Now viewing FIG. 4, a flow chart 400 is depicted illustrating method steps, of another exemplary method, according to another aspect of the present invention, for decoding M-binary symbol (MB) encoded vectors into N-binary symbol (NB) source data vectors, M>N>0, where at least some of the MB encoded vectors are disparity dependent encoded vectors that have primary representations and alternate representations complementary to the primary representations. The method can include the step, as per block 402, of complementing at least N binary symbols of a given one of the MB encoded vectors to recover a given one of the NB source data vectors that corresponds to the given one of the MB encoded vectors. The complementation of the at least N binary symbols can be responsive, at least in part, to a determination that the given one of the MB encoded vectors is one of the alternate versions of one of the disparity dependent encoded vectors. The method can also include the step of completing less than N binary symbols of another given one of the MB encoded vectors, as per block 404. Such complementing of less than N binary symbols can be performed to recover a corresponding portion of another given one of the NB source data vectors that corresponds to the other given one of the MB encoded vectors. The complementation of less than N binary symbols can be, at least in part, responsive to a determination that the other given one of the MB encoded vectors is a disparity independent encoded vector. The two complementing steps 402, 404 can be performed substantially in parallel, and can implement an encoding scheme in accordance with the present invention. In one more particular aspect of the method of FIG. 4, N=8, M=10, and the encoding scheme assigns substantially all of the MB encoded vectors that have binary symbol changes compared to corresponding ones of the NB source data vectors to MB encoded vectors that are balanced and disparity independent.

The method steps illustrated in FIG. 4 can also represent one manner in which step 304 of FIG. 3 can be performed. In such case, in the step 402, the NB source data vectors are contained within the aforementioned second portion of NB source data vectors. Further, in complementing step 404, the NB source data vectors are contained within the aforementioned first portion of NB source data vectors.

In illustrative embodiments of the invention, the encoding scheme produces a DC-balanced transmission code. Further, in illustrative embodiments of the invention, the primary representations of the disparity dependent encoded vectors end with one of two 2-binary symbol patterns. Further, in illustrative embodiments of the invention, NB control vectors and corresponding MB encoded control vectors can each have a complementary alternate vector. In an exemplary encoding scheme discussed below, there are 7 NB control vectors and 7 MB corresponding encoded control vectors, each with complementary alternate vectors.

Figure 5:
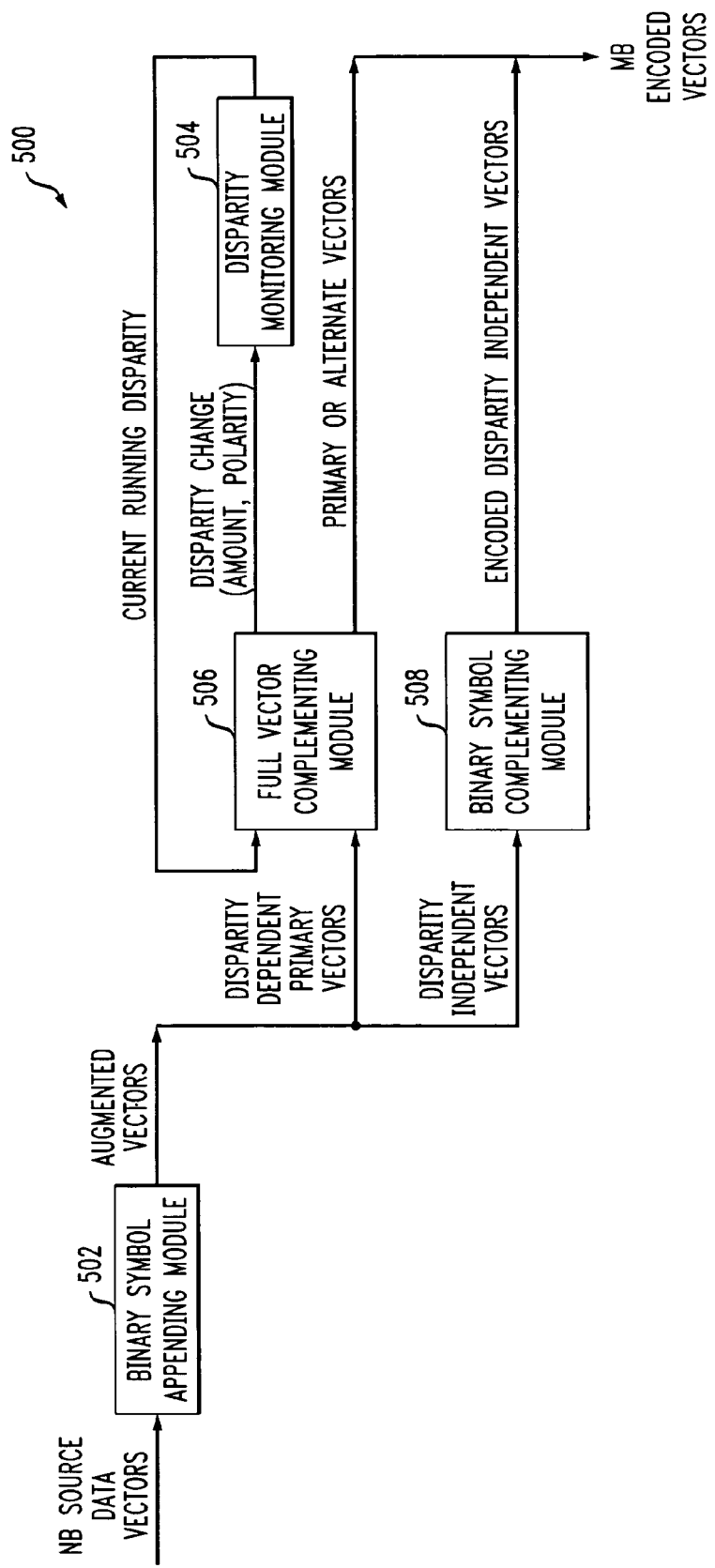
FIG. 5 shows an exemplary embodiment of an apparatus for encoding in accordance with an embodiment of the present invention.

Reference should now be had to FIG. 5, which depicts an exemplary apparatus 500 for encoding N-binary symbol (NB) source data vectors into M-binary symbol (MB) encoded vectors, according to an aspect of the present invention. M>N>0, and at least some of the MB encoded vectors are disparity dependent encoded vectors having primary representations and alternate representations complementary to the primary representations. The apparatus 500 can include a binary symbol appending module 502; optionally, a disparity monitoring module 504; a full vector complementing module 506; and a binary symbol complementing module 508. Binary symbol appending module 502 can be configured to append M-N binary symbols to the NB source data vectors so as to obtain augmented vectors. Where employed, disparity monitoring module 504 can be coupled to the full vector complementing module 506, and can be configured to determine current running disparity for use in assigning proper ones of the disparity dependent encoded vectors to given ones of the NB source data vectors.

Full vector complementing module 506 can be configured to complement M binary symbols of a given one of the augmented vectors to obtain one of the alternate representations of one of the MB encoded vectors that corresponds to a given one of the NB source data vectors from which the given one of the augmented vectors was obtained. The complementation of M binary symbols can be, at least in part, responsive to a determination that the one of the MB encoded vectors comprises one of the disparity dependent encoded vectors and that a current running disparity does not match the required starting disparity for the one of the MB encoded vectors. The binary symbol complementing module 508 can be configured to complement less than N binary symbols of another given one of the NB source data vectors to obtain a corresponding portion of another given one of the MB encoded vectors that corresponds to the other given one of the NB source data vectors. The complementation of less than N binary symbols can be performed, at least in part, responsive to a determination that the other given one of the MB encoded vectors is a disparity independent encoded vector. The binary symbol complementing module 508 and the full vector complementing module 506 can be configured to operate substantially in parallel. As used herein, "substantially in parallel" should have the same meaning as set forth above. The modules 506, 508 can be coupled to each other and can be configured to implement any of the encoding schemes described herein. It is believed preferable that the module 508 complements appropriate individual bits of the augmented vector, but any appropriate scheme for complementing one or more individual binary symbols is encompassed within the scope of the present invention. Further, note that as used herein, "coupled" should be understood broadly to include direct coupling, indirect coupling through one or more other components, sharing of one or more logic gates as discussed below, and the like. Note in addition that, in exemplary embodiments, modules 602 and 604 can "see" all vectors at their inputs but act only on those identified by their labels on the input lines, if required. In the exemplary encoding scheme discussed below (which is meant to be exemplary and not limiting), apart from the appended binary symbols, for random data, about half the source data vectors and all the control vectors remain unchanged upon encoding.

Figure 6:
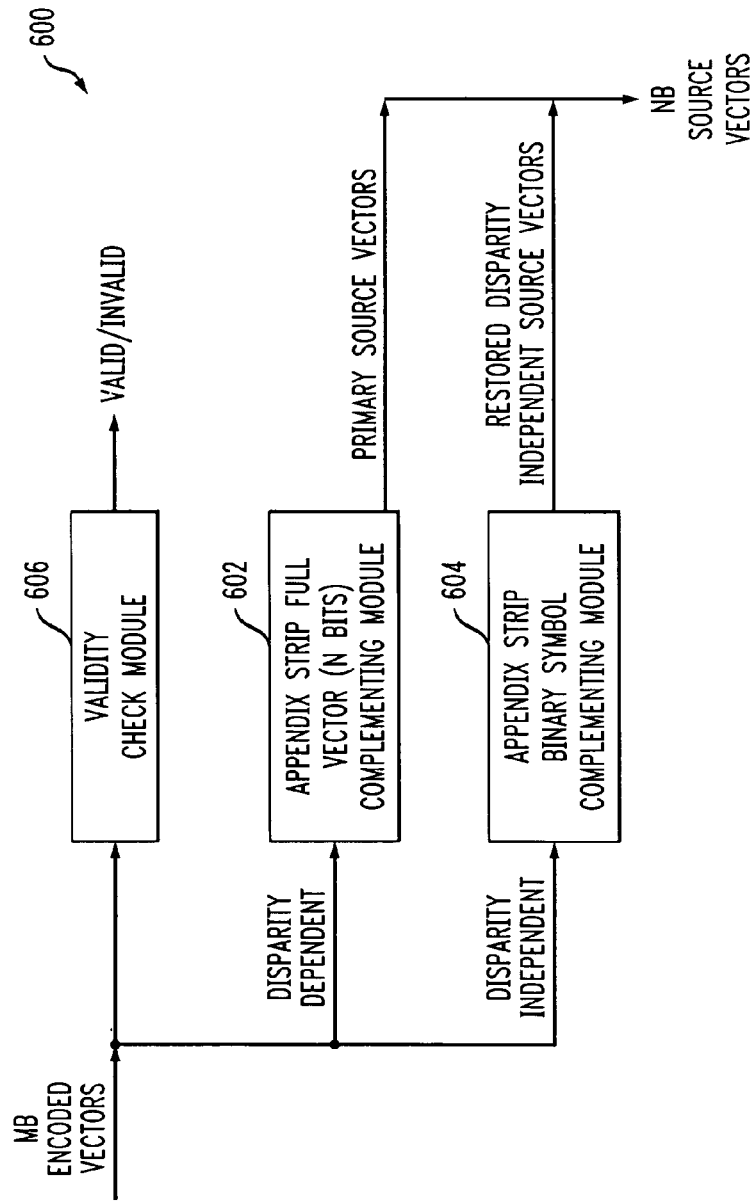
FIG. 6 shows an exemplary embodiment of an apparatus for decoding in accordance with an aspect of the present invention.

Attention should now be given to FIG. 6, which illustrates an exemplary embodiment of apparatus 600 for decoding M-binary symbol (MB) encoded vectors into N-binary symbol (NB) source data vectors, in accordance with an aspect of the present invention (M>N>0). At least some of the MB encoded vectors are disparity dependent encoded vectors that have primary representation and alternate representations complementary to the primary representations. Apparatus 600 includes a full vector complementing module 602, a binary symbol complementing module 604, and, optionally, a validity check module 606. Full vector complementing module 602 can be configured to complement at least N binary symbols of a given one of the MB encoded vectors to recover a given one of the NB source data vectors that corresponds to the given one of the MB encoded vectors. The complementation of the at least N binary symbols can be, at least in part, responsive to a determination that the given one of the MB encoded vectors is one of the alternate versions of one of the disparity dependent encoded vectors.

The binary symbol complementing binary module 604 can be coupled to the full vector complementing module 602 and can be configured to complement less than N binary symbols of another given one of the MB encoded vectors to recover a corresponding portion of another given one of the NB source data vectors corresponding to the other given one of the MB encoded vectors. The complementation of less than N binary symbols can be performed, at least in part, responsive to a determination that the other given one of the MB encoded vectors is a disparity independent encoded vector. Modules 602, 604, and (optionally) 606 can be configured to operate substantially in parallel, where "substantially in parallel" has the meaning set forth above. Modules 602, 604, and 606 can be configured to implement any encoding scheme in accordance with the present invention. For invalid vectors, modules 602 and 604 can be allowed to generate arbitrary outputs. In the exemplary embodiment depicted in FIG. 6, modules 602, 604 are also configured to strip off the appended binary symbols. Modules 602, 604, 606 can "see" the appended binary symbols at the inputs but such symbols can be dropped before complementation. Note that the full vector complementing module does not have to complement vectors that are already in their primary (as opposed to alternate) form.

Where employed, validity check module 606 can be coupled to modules 602, 604 and can be configured to obtain putative encoded vectors and to determine if given ones of the putative encoded vectors are valid MB encoded vectors. Note that this can be performed by comparing received vectors to valid vectors to determine whether they are valid, or, conversely, by determining whether they are invalid, for example, by comparing them to invalid vectors.

The methods described herein can be implemented in a number of different ways: for example, the apparatuses depicted in FIGS. 5 and 6 can be employed. Such apparatuses can in turn be implemented using a number of techniques. At present, it is believed that a logic gate implementation of the kind described below is preferable. Various changes and modifications can be made to the exemplary logic gate implementation, as noted herein.

The following is an exemplary 8B/10B encoding scheme that illustrates principles and techniques of the present invention. Note that the capital "B" in 8B/10B refers generally to "Binary Symbol," and is not limited to the more specific term "bit" (typically represented by "b"), as a distinction from codes which use symbols with more than two levels, e.g. ternary symbols with three levels, commonly referred to by the capital letter "T". Also, the number of inputs is actually nine to accommodate control characters, and the number 8 refers to the data vectors only (NB/MB schemes according to the present invention may, if desired, also have one or more extra inputs, such as control characters). The bits of the uncoded 8B data vectors are labeled with the upper case letters "ABCDEFGH" and the control input for special non-data characters is labeled with "K." The bits of the coded 10B vectors are labeled with the lower case letters "abcdefghij."

Figure 7:
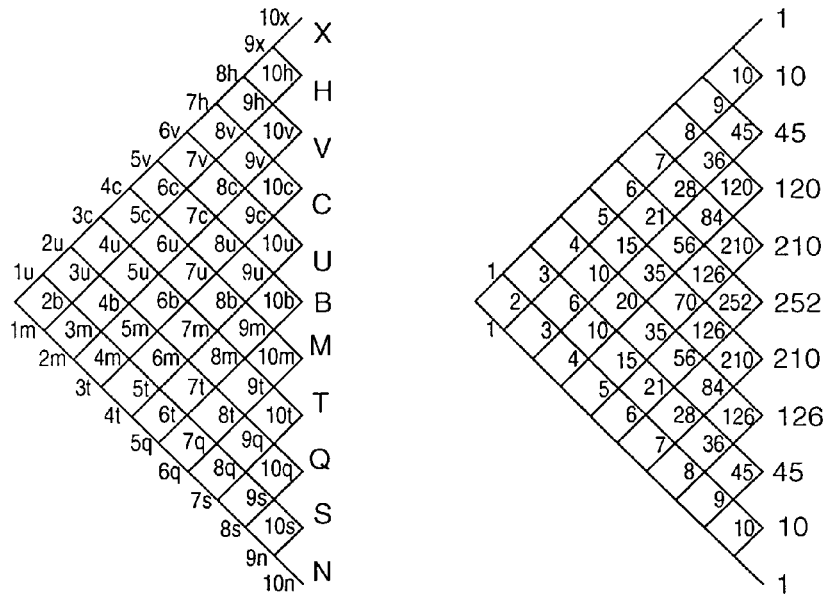
FIG. 7 depicts trellis diagrams applicable to certain exemplary embodiments of the present invention.

In the trellis diagrams such as shown in FIG. 7, an upwards sloping line for one interval represents a bit with a value of one; conversely, a slope downwards represents a zero. The horizontal coordinates on the time axis of FIG. 7 are labeled by a number in ascending order from left to right. Each unit increment represents one additional bit. The vertical coordinates which represent the running disparity are expressed by a lower case letter as follows:

b (balance) indicates a disparity of 0 u (up, uni) indicates a disparity of +1 when paired with an odd preceding number and a disparity of +2 when paired with an even preceding number m (minus) indicates a disparity of −1 when paired with an odd preceding number and a disparity of −2 when paired with an even preceding number c (cube) indicates a disparity of +3 when paired with an odd preceding number and a disparity of +4 when paired with an even preceding number t (three) indicates a disparity of −3 when paired with an odd preceding number and a disparity of −4 when paired with an even preceding number v (Roman numeral V) indicates a disparity of +5 when paired with an odd preceding number and a disparity of +6 when paired with an even preceding number q (quint) indicates a disparity of −5 when paired with an odd preceding number and a disparity of −6 when paired with an even preceding number h (hepta) indicates a disparity of +7 when paired with an odd preceding number and a disparity of +8 when paired with an even preceding number s (seven) indicates a disparity of −7 when paired with an odd preceding number and a disparity of −8 when paired with an even preceding number x (Roman numeral X) indicates a disparity of +9 when paired with an odd preceding number and a disparity of +10 when paired with an even preceding number n (nine, negative) indicates a disparity of −9 when paired with an odd preceding number and a disparity of −10 when paired with an even preceding number.

As an example, the expression "5c" in the left trellis of FIG. 7 refers to a disparity value of +3 after the end of the fifth bit (e) and the expression "6c" refers to a disparity value of +4 after the end of the sixth bit (f). FIG. 7 shows the trellis diagrams for vectors comprising up to 10 bits. The left-side trellis is used to define the vector classifications and the right-side trellis shows the number of different paths or vectors leading from the origin to each node. Note that these numbers are identical to the binomial coefficients.

The following notation is used for names attached to sets of source vectors or encoded vectors:

The first capital letter B, P, or F indicates the disparity of the coded vectors:

B indicates disparity independent balanced coded vectors.

P indicates a complementary pair of disparity dependent balanced coded vectors which are selected based on the Polarity of the running disparity.

F indicates a complementary pair of coded vectors with a disparity of four.

A second capital letter, if present, indicates the block disparity of the uncoded vector or the vertical ending coordinate in the left-side trellis of FIG. 7 using the capital version of the disparity values listed above.

A third capital letter, if present, indicates the value of the control input bit K Up to three leading capital letters may be followed by one or more sets of a number paired with a lower case letter to indicate trellis nodes through which the members of the class must go, or not go if negated. Vectors going through negated nodes, e.g. 4t', must not be part of the specified class of vectors. This notation is illustrated in the left-side trellis of FIG. 7.

The third and following capital letters, other than K, mark the uncoded bits, if any, which must be complemented to obtain the respective coded primary vector. The last two coded bits i and j are appended with a default value zero and complemented, if indicated by a classification name ending in I and/or J, respectively.

At all 10B boundaries, the running disparity can assume one of two values D=±2. Encoded vectors in this code are either balanced and disparity independent, balanced and disparity dependent, or have a disparity of ±4. If the current running disparity at a byte boundary is positive (+2), only disparity independent vectors or vectors with a required positive entry disparity may be entered and complementary rules apply for a negative running disparity. About two thirds of the source vectors are translated into a single, balanced, disparity independent, encoded vector. All other 8B vectors are translated into one of a pair of complementary 10B vectors, according to the disparity rules above. Serial transmission of the coded vectors is assumed to be in alphabetical order starting with bit "a."

The 8B/10B-P code includes a total of 263 source vectors each translated into one of 352 coded 10B vectors as illustrated by the trellis diagrams of FIGS. 8–19 and 24. All the other 672 10B vectors are invalid. The use and interpretation of trellis diagrams for this kind of application is explained in the '062 patent and is known to the skilled artisan. 174 source vectors are encoded into balanced, disparity independent vectors, 29 source vectors are encoded into balanced vectors which are disparity dependent and have complementary representations, and the remaining 60 source vectors are each encoded into one of a complementary pair of vectors with a disparity of four.

Three extra control characters have been added, as compared to the code described in the '062 patent, which can generate contiguous runs of five. It is the user's choice to include or exclude those characters. If the use of the new control characters is carefully planned, contiguous runs of five can still be avoided. The new control characters are represented by dotted lines in the trellis diagrams below and printed in italic font in the tables.

Figure 8:
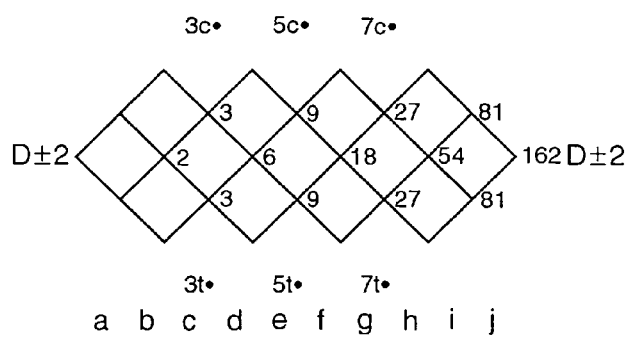
FIGS. 8–19 depict individual trellis diagrams illustrative of certain aspects of an embodiment of the present invention.
Figure 9:
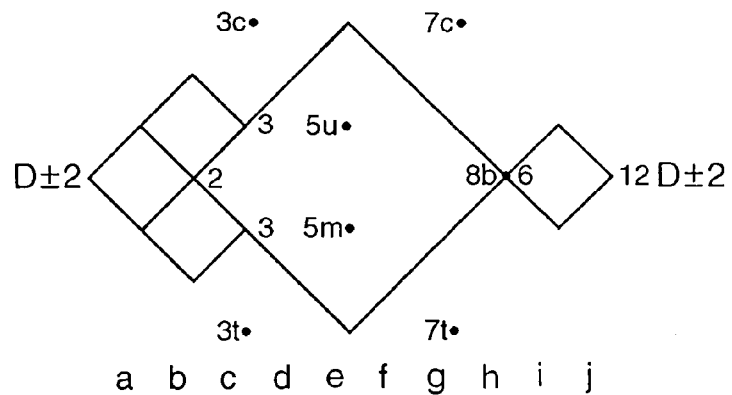

There are 174 disparity independent balanced vectors as illustrated in FIGS. 8 and 9. Balance means that the running disparities at the start and end of the vector are identical. Disparity independence means that they can be entered in a sequence of vectors regardless of the current starting disparity which can have a value of plus two or minus two at the vector boundaries.

Figure 10:
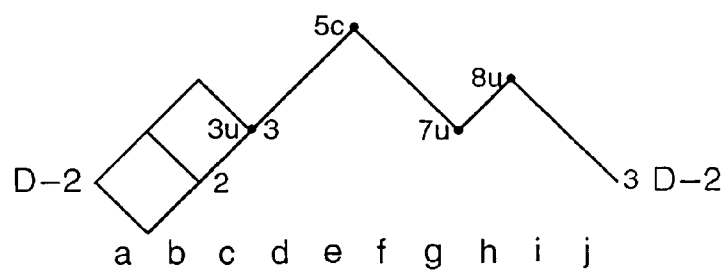

The 174 disparity independent vectors include all balanced 10B vectors with a run length of no more than two at the leading and trailing boundaries with the exception of the three disparity dependent vectors of FIG. 10 and their complements with a trailing run of two followed by a run of one and another run of two. Using the notation described above, the trellises of FIGS. 8 and 9 can be described by the expressions B3c'5c'7c'3t'5t'7t' and B3c'7c'3t'7t'8b, respectively. The latter expression includes some vectors of FIG. 8 redundantly. They can be excluded by the addition of the term 5u'5m'.

Figure 11:
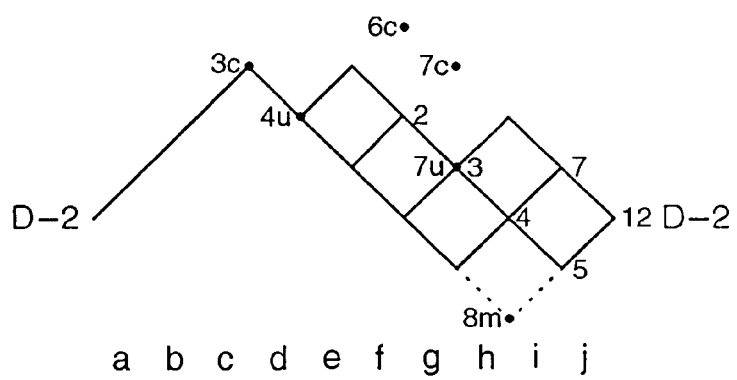
Figure 12:
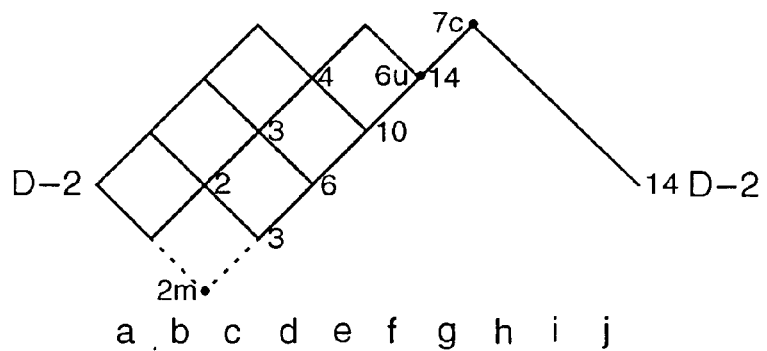

FIGS. 10 to 12 show balanced trellises with a required negative starting disparity. For a positive running disparity, their complements must be used. The three vectors of FIG. 10 can be described by the expression P3u5c7u8u and their complements by P3m5t7m8m. The eleven vectors of FIG. 11 in solid lines can be described by the expression P3c4u6c'7c'8m'. The vector P3c8m through the node 8m is assigned to the alternate version K248A of an optional control character K248P (P3t8u). This polarity selection simplifies the equations for 10-bit vector complementation. The fourteen balanced vectors of FIG. 12 can be described by the expression P4c'6u7c. The vector through the node 2m is assigned to an optional primary control character K124P.

Figure 13:
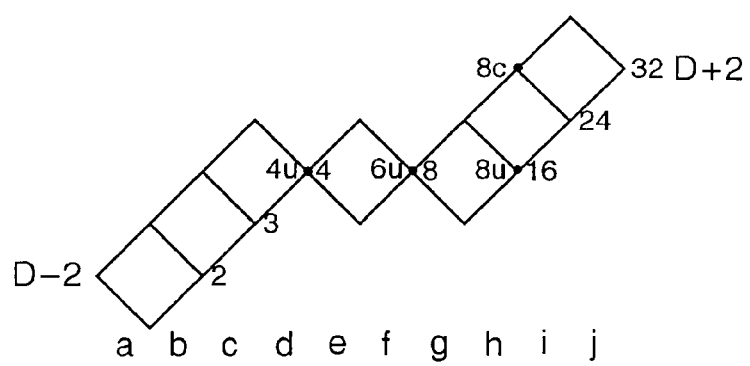
Figure 14:
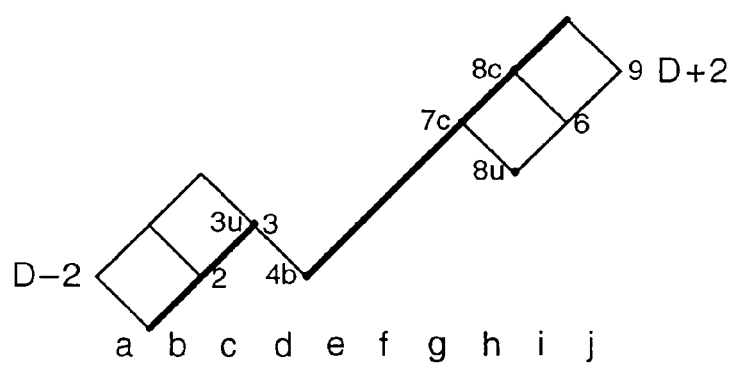
Figure 15:
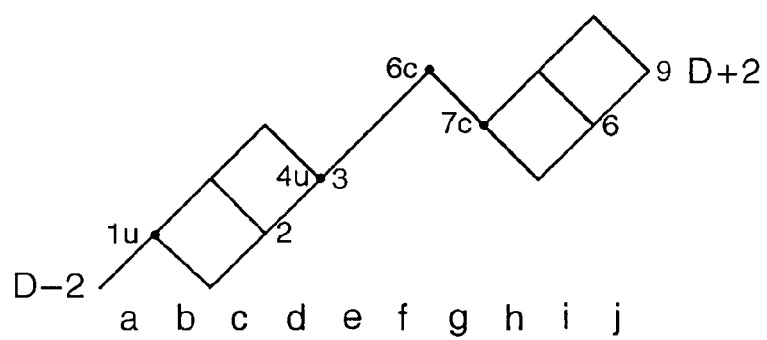
Figure 16:
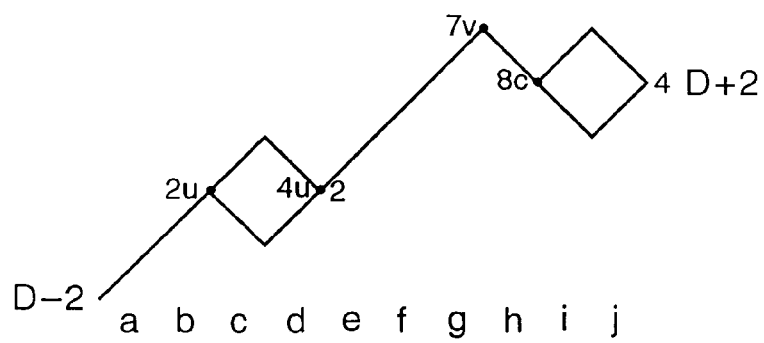

The thirty-two vectors of FIG. 13 with a disparity of plus four can be described by the expression F4u6u. Its complement is described by the expression F4m6m. The nine vectors of FIG. 14 with a disparity of plus four and a negative required entry disparity can be described by the expression F3u4b7c. Its complement is described by the expression F3m4b7t. The two bold lines represent the singular comma sequence. The nine vectors of FIG. 15 with a disparity of plus four and a negative required entry disparity can be described by the expression F1u4u6c7c. Its complement is described by the expression F1m4m6t7t. The four vectors of FIG. 16 with a disparity of plus four and a negative required entry disparity can be described by the expression F2u4u7v8c. Its complement is described by the expression F2m4m7q8t. The single vector of FIG. 17 with a disparity of plus four and a negative required entry disparity can be described by the expression F3c4u8v. Its complement is described by the expression F3t4m8q. The four vectors of FIG. 18 with a disparity of plus four and a negative required entry disparity can be described by the expression F2b3m7c9c. Its complement is described by the expression F2b3u7t9t. The single vector of FIG. 19 with a disparity of plus four and a negative required entry disparity is the alternate version K131 A of one of the optional control characters. It can be described by the expression F2m7c8u. Its complement is described by the expression F2u7t8m.

The trellis diagrams of FIGS. 8 to 19 can be used to prove the validity of the code. They show the total number of available coded vectors. Since none of the vectors of each diagram is congruent with any of the vectors of all the other diagrams, there are no duplicate vectors. The combination of any trailing and leading runs of true and complement forms with their associated running disparity at the byte boundaries shows the conformance with the run length rules. Similarly, the singularity of the comma character can be assured by the examination of all possible combinations of trailing and leading bit patterns.

The specific assignment of source vectors to coded vectors materially affects the complexity of the implementation. Preference is given to coding assignments which preserve the values of the source bits as is the case for the tables of FIGS. 20–27, where the tables of FIGS. 23–27 list the primary vectors of all the disparity dependent vectors. Disparity dependent vectors have two complementary representations which are referred to as the primary (P) and the alternate (A) vector. The coding assignments have been chosen such that all disparity dependent primary vectors end with ij=00 or 01 to simplify the decoding process. Other endings could have been chosen; it is the limitation to just two ending patterns that helps to simplify the decoding, and not necessarily the two specific patterns chosen. All source vectors which require individual bit changes for encoding are listed in the table of FIG. 28. The 60 coded vectors of the table of FIG. 28 can be identified as disparity independent, balanced vectors ending with ij=01.

Figure 28:
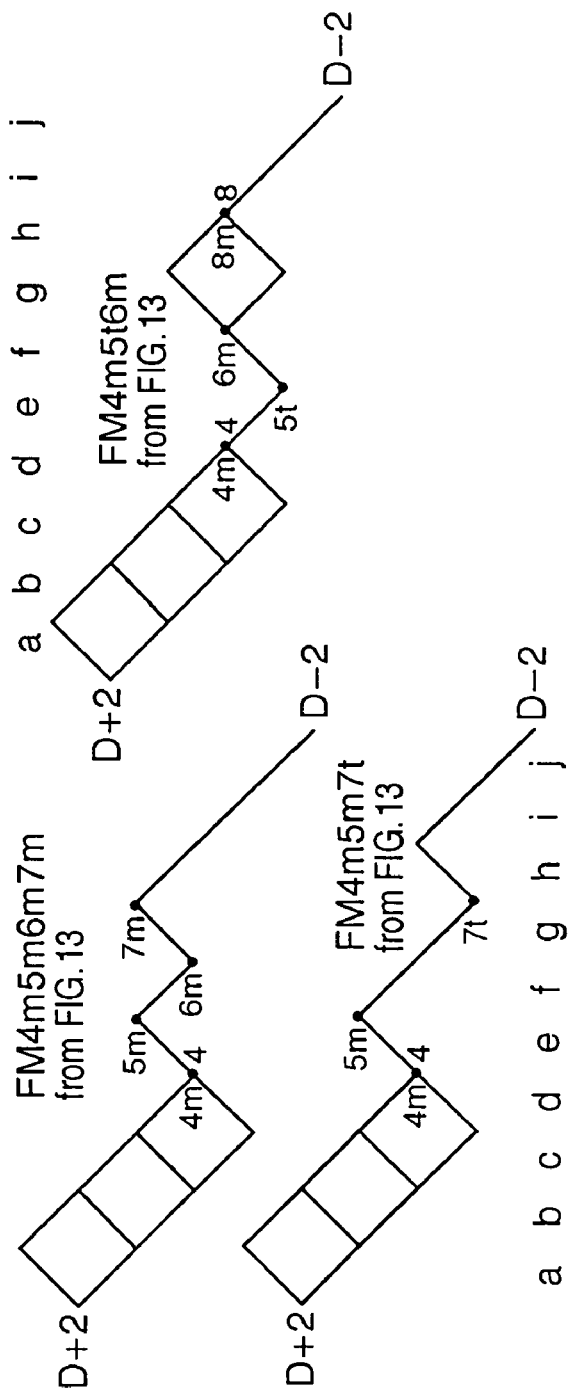
FIGS. 28–29 are trellis diagrams of certain vectors according to an illustrative embodiment of the invention.

The value of the K-bit is not listed with the source vectors of the table of FIG. 28. For most vectors, the K-bit is redundant and can assume a value of zero if present. A zero value must be included for the seven data source vectors which are otherwise identical to a control vector. For those data vectors, the letter D in the vector name is printed in bold type. The 114 disparity independent balanced vectors listed in the tables of FIGS. 20, 21, and 22 are the subset of the vectors of FIGS. 8 and 9 which end with ij=00, 11, or 10, but not those which end with 01. The 27 vectors of the table of FIG. 20 can be identified by BU3c'5c'7c'3t'. The 27 vectors of the table of FIG. 21 can be identified by BM3c'3t'5t'3t'7t'IJ. It will be appreciated that the vectors in the tables of FIGS. 20 and 21 result from 54 source data vectors having an overall disparity of one of plus 2 and minus 2, and having a running disparity of at most 2 after any given binary symbol position, that are appended with binary symbols 00, for those of the 54 source data vectors having an overall disparity of plus 2, and binary symbols 11, for those of the 54 source data vectors having an overall disparity of minus 2. The 60 vectors of the table of FIG. 22 can be identified by BB3c'3t'I. It will be appreciated that the 60 vectors are the result of taking 60 balanced source data vectors having a leading run-length no greater than 2 and appending a complementary pair of binary symbols.

The 24 balanced vectors listed in the table of FIG. 23 preserve the values of the source bits and are the subset of the vectors of FIGS. 10–12 which do not end with ij=10 or 11. They all require a negative entry disparity. The optional control character K124P is illustrated in FIG. 12. It will be appreciated that the table of FIG. 23 shows 19 vectors that result from starting with source data vectors having a disparity of plus 2 and satisfying at least one of:

ending in binary symbols 11001;

starting with binary symbols 1110 and ending with binary symbol 1; and ending with binary symbols 10 and having one of: (i) at most three leading ones, and (ii) at most one leading zero; and mapping them to 19 disparity dependent balanced encoded vectors having a required negative starting disparity (the encoded vectors have binary symbols identical to the source data vectors with two zeroes appended thereto). Further, it will be appreciated that the table of FIG. 23 shows 4 vectors resulting from balanced source data vectors starting with binary symbols 1110, the 4 balanced source data vectors being mapped to 4 disparity dependent balanced encoded vectors having a required negative starting disparity, the encoded vectors having binary symbols identical to the 4 balanced source data vectors with binary symbols 01 appended thereto.

Figure 17:
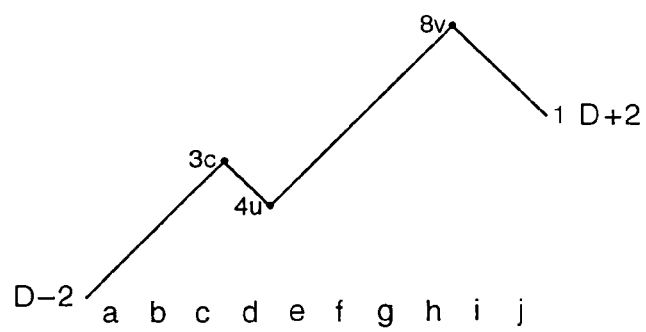

The five balanced vectors of FIG. 24 and the table of FIG. 25 require a positive entry disparity. They are the complements of those five vectors of FIG. 11 which end with ij=10 or 11. The complement is chosen so the source vectors translate with no changes into primary vectors and so all encoded vectors with changes in the source bits end with ij=01. It will be appreciated that the table of FIG. 25 shows 4 vectors resulting from 4 balanced source data vectors starting with binary symbols 0001, the 4 balanced source data vectors being mapped to 4 disparity dependent balanced encoded vectors having a required positive starting disparity, the encoded vectors having binary symbols identical to the source data vectors with binary symbols 01 appended thereto. The nineteen vectors of the table of FIG. 26 have disparity of plus four and the value of the source bits is preserved. They all require a negative entry disparity. One vector (D247P) ending with ij=00 is illustrated in FIG. 17 and the others are a subset of the vectors of FIGS. 13–16 and 18, and end with ij=01. It will be appreciated that the table of FIG. 26 includes 18 vectors that result from source data vectors having a disparity of plus 4 and satisfying one of:
  trailing 4 binary symbols comprise a complementary pair of binary symbols followed by binary symbols 11;
  trailing 4 binary symbols are 1111 and leading 4 binary symbols are one of:
    (i) two pairs of complementary binary symbols, and (ii) 1100;
  leading binary symbol is 1 and trailing 4 binary symbols are 1101; and
  leading two binary symbols are 1 and trailing 4 binary symbols are 1110;

the 18 source data vectors being mapped to 18 encoded vectors having a disparity of plus 4 and a required negative starting disparity, the encoded vectors having binary symbols identical to said 18 source data vectors with 01 appended thereto. Further, the table of FIG. 26 includes at least one vector resulting from a source data vector in the form 11101111, the one source data vector being mapped to one encoded vector having a disparity of plus 4 and a required negative starting disparity, the encoded vector having the form 1110111100.

Figures 29, 30:
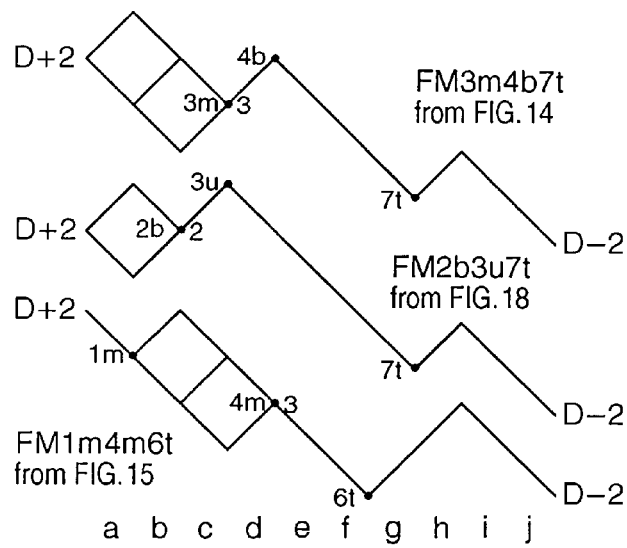
FIG. 30 is a table showing encoded vectors of an illustrative embodiment of the invention.

The twenty-five vectors of the table of FIG. 27 have a disparity of minus four and the value of the source bits is preserved. They are the complements of a subset of vectors of FIGS. 13–15 and 18 and end with ij=00. FIG. 28 is the trellis of the top 16 vectors in the table of FIG. 27 which are a complemented subset of the vectors of FIG. 13. FIG. 29 is the trellis of the bottom data vector sets which are complemented subsets of the vectors of FIGS. 14, 15, and 18, respectively. They all have a disparity of minus four and the value of the source bits is preserved. K131 is not shown. It will be appreciated that the table of FIG. 27 includes 21 vectors resulting from source vectors having a disparity of minus 2 and satisfying one of:
  trailing 4 binary symbols comprise 01 followed by a pair of complementary binary symbols;
  trailing binary symbols are one of 1001 and 11010;
  leading binary symbol is 0 and trailing 4 binary symbols are 0011;
  trailing 5 binary symbols are 10001; and
  trailing 6 binary symbols are 100001;

the 21 source data vectors being mapped to 21 encoded vectors having a disparity of minus 4 and a required positive starting disparity, the 21 encoded vectors having binary symbols identical to said 21 source data vectors with binary symbols 00 appended thereto.

Figure 31:
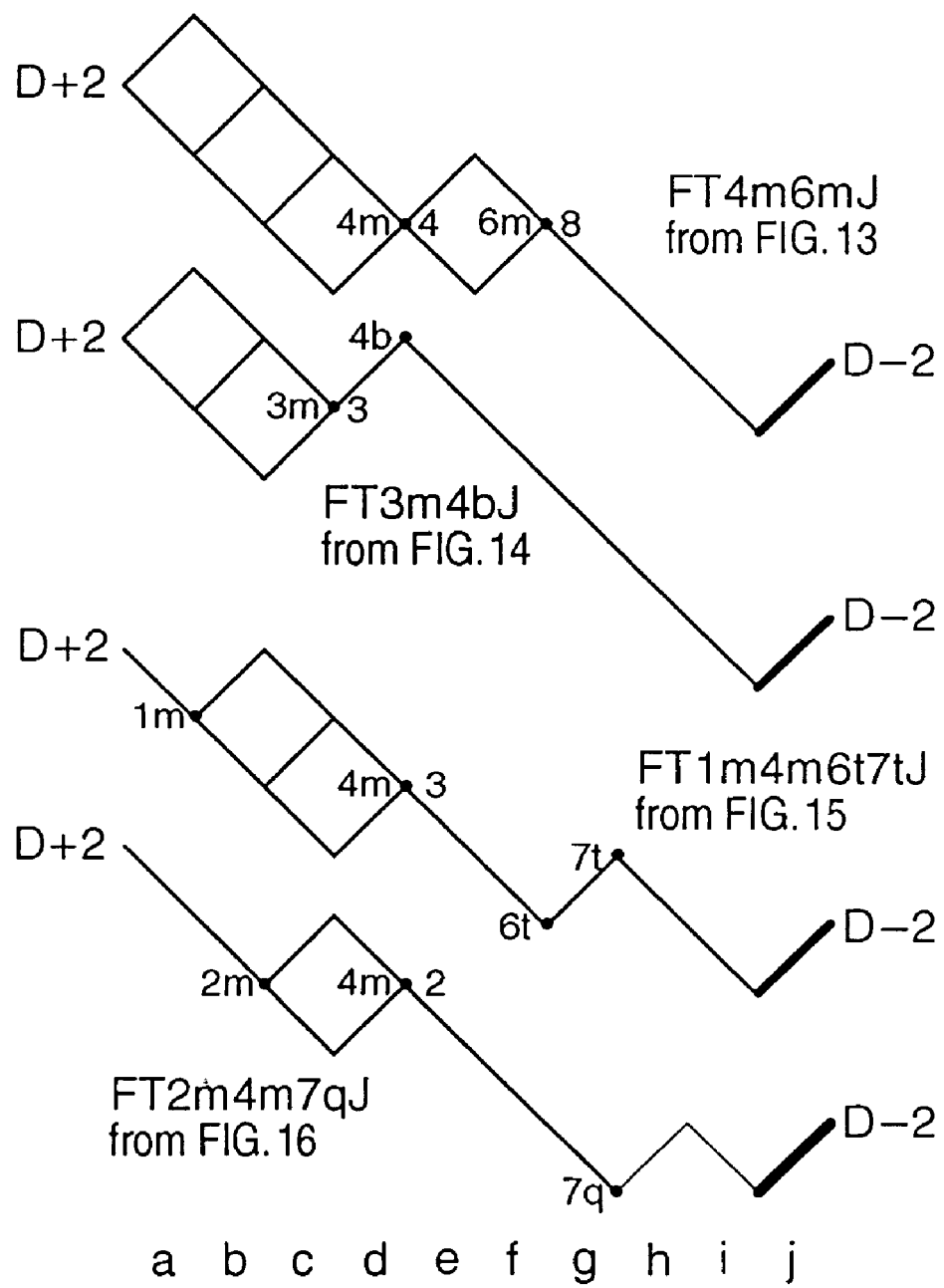
FIGS. 31–32 are trellis diagrams for vectors according to an embodiment of the present invention.

The sixteen vectors of the table of FIG. 30 have disparity of minus four and the value of the source bits is preserved. They are the complements of a subset of the vectors of FIGS. 13–16 and end with ij=01 and are illustrated with their trellises in FIG. 31. It will be appreciated that the table of FIG. 30 includes 15 vectors that result from source vectors having a disparity of minus 4 and satisfying one of:
  trailing 4 binary symbols comprise a pair of complementary binary symbols followed by binary symbols 00;
  first binary symbol is 0 and last 5 binary symbols are 10000;
  leading binary symbol is 0 and trailing 4 binary symbols are 0010; and
  leading two binary symbols are 00 and trailing 4 binary symbols are 0001;

the 15 source data vectors being mapped to 15 encoded vectors having a disparity of minus 4 and a required positive starting disparity, the 15 encoded vectors having binary symbols identical to the 15 source data vectors with binary symbols 01 appended thereto.

Figure 32:
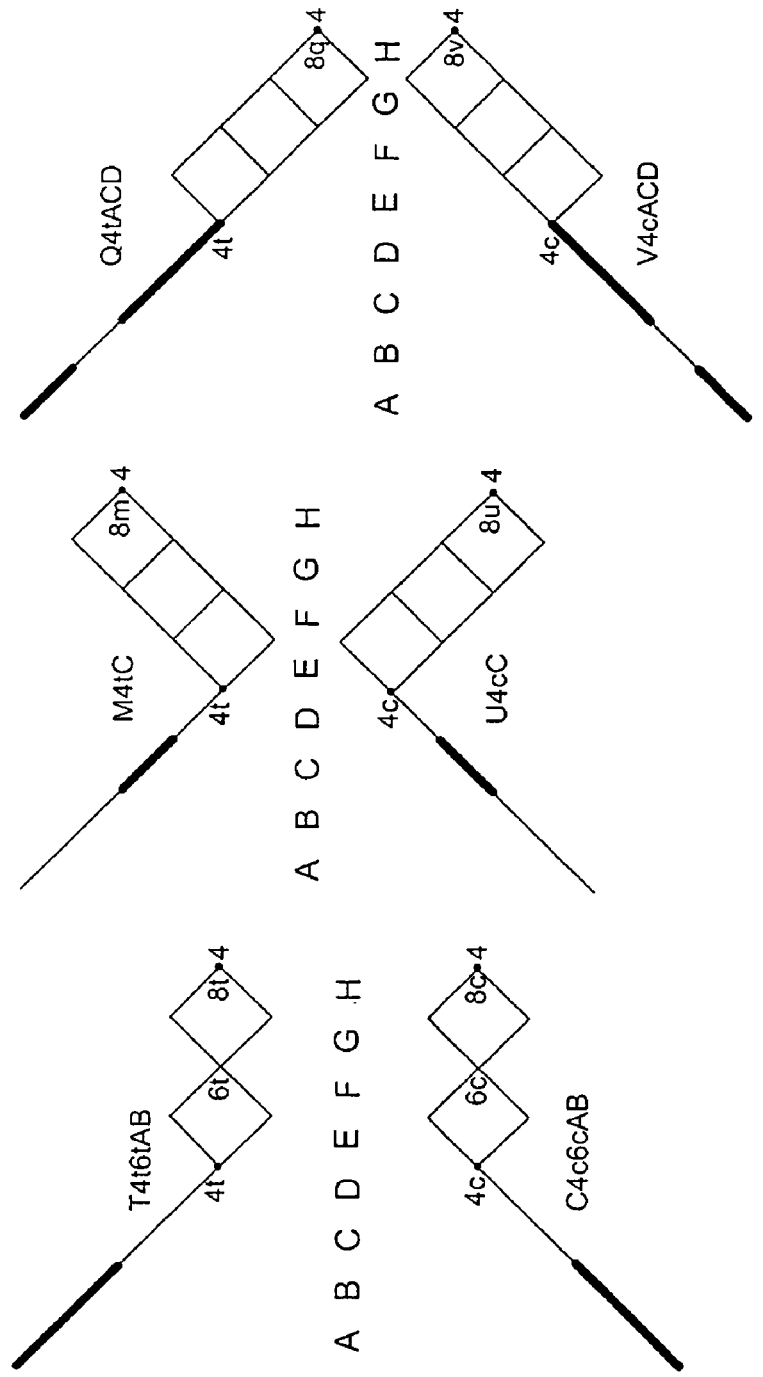

Up to this point, 203 source vectors (196 data, 7 control) have been assigned to encoded vectors as listed in the tables of FIGS. 20–23, 25–27 & 30. None of these vectors requires any change in the source bits for encoding and decoding. There remain 60 unassigned data source vectors and 60 available encoded vectors, 54 from FIG. 8 and six from FIG. 9, all balanced and disparity independent ending with ij=01. The trellis diagrams of some of the unassigned 8-bit source vectors are illustrated in FIG. 32. The bold lines indicate the bits which are complemented for encoding. Wherever possible, complementary source vector pairs are assigned to a pair of encoded vectors which are also complements and the individual bit positions complemented for encoding are identical for both coded vectors of a pair. Also, groups of several vector pairs with identical encoding rules are defined as shown for three sets of four pairs in FIG. 32. The complete set of vectors with individual source bit changes is listed in the table of FIG. 33. The appended bits i and j have an assumed default value of zero. The coded bits which are different from the source bits or the default value are printed in bold type and the vectors on the right side of the table are the complements of the left side. This arrangement contributes to circuit simplification. It will be appreciated that in the table of FIG. 33, the fraction of encoded vectors having binary symbol changes compared to corresponding source data vectors correspond to those of the disparity independent encoded vectors having 8 binary symbols identical to the corresponding ones of the disparity independent encoded vectors and 2 binary symbols that are complements of the pair of appended binary symbols. Furthermore, it will be appreciated that the exemplary encoding scheme assigns a majority of the source data vectors corresponding to the fraction of encoded vectors having binary symbol changes, in complementary pairs of the majority, to corresponding pairs of the disparity independent encoded vectors that are complementary in all binary symbol positions except the appended binary symbols. Yet further, note that in the table of FIG. 33, at least eight source data vectors, having a leading run of four followed by two pairs of complementary binary symbols, are assigned to selected encoded vectors having two leading binary symbols complemented with respect to corresponding ones of the eight vectors. Still further, note that in the table of FIG. 33, at least eight source data vectors, having a leading run of four followed by a single binary symbol in four subsequent binary symbols which matches binary symbols in the leading run of four, are assigned to selected encoded vectors having a third binary symbol complemented with respect to corresponding ones of the eight vectors. Even further, note that in the table of FIG. 33, at least eight source data vectors, having a leading ran of four followed by a single binary symbol in four subsequent binary symbols which does not match binary symbols in the leading run of four, are assigned to selected encoded vectors having a first, third and fourth binary symbol complemented with respect to corresponding ones of the eight vectors.

The table of FIGS. 34A–34G lists the selected vector assignments of the tables of FIGS. 20–23, 25–27, 30, and 33 in ascending order of vector names. The alternate vectors are also shown. The six control characters are listed at the end of the Table. An "x" entry in the K-column means that the K-bit has a value of zero but can be ignored for encoding. The column headed by "Pri DR" lists the required entry disparity for the primary vector. The column "Pri DB" lists the block disparity of the primary vector.

It may be preferable in many cases that the assignment of encoded vectors to the uncoded source vectors is done in a way such that the complexity of the encoder and/or decoder (typically, both) is minimized. It may be assumed that this will be accomplished if the number of classifications is minimized both for bit mapping and disparity control and if the number of bits changed for bit mapping is minimized as well. In the interest of logic circuit sharing, preference in this example is given to solutions with bit changes concentrated to fewer vectors over solutions with the same number of bit changes spread over more vectors. An important feature of this exemplary design is the containment of vectors with individual bit changes to a single class which is balanced and disparity independent. This makes it possible to execute individual bit changes and full vector inversion for disparity control as completely separate functions in parallel rather than serial mode in both the encoder and the decoder circuit with significant less overall circuit delay. Some assignment choices, e.g. selecting K248 rather than K7 as a control vector have been made so it is easier to recognize the alternate vectors which must be complemented.

Generally, the encoded bits retain the value of the unencoded bit (a=A, b=B, etc), but a specific source bit is complemented (a=A', b=B', etc) if and only if (iff) the respective equation is true. In the coding labels and equations, some bit values are included redundantly to allow more circuit sharing for the coding of several bits. Redundant bit values are overlined and redundant vector names are preceded by an asterisk. In the tables of FIGS. 35–48, the bit patterns common to several vectors are marked by bold type to logically classify the vectors by simple expressions listed in the column 'Coding Label'. The labels are used to write the encoding equations. In any of the Exclusive OR relationships between two groups of bits, any bit in the first and second group can be selected as the first and second input, respectively, of the XOR2 gate. The inputs have been selected to maximize commonality among the several encoding equations. The expressions in parentheses at the right edge of the equations refer to the corresponding net names in the circuit diagrams discussed below. An asterisk (*) following the net name means that other expressions are included in the net.

The "a" column has bold entries in the tables of FIGS. 33 and 34 for the vectors listed in the table of FIG. 35.

$$a = A \oplus \left\{ \begin{pmatrix} D \oplus E' \bullet E \oplus F' \bullet G \oplus H + A \oplus G' \bullet G \oplus H' \bullet E \oplus F + D \oplus E \bullet E \oplus F' \bullet G \oplus H' + \\ E \oplus F \bullet G \oplus H \end{pmatrix} \right\} \bullet$$

$$A \oplus B' \cdot B \oplus C' \cdot C \oplus D' + \qquad \text{(Pn1)}$$

$$(C \oplus D \cdot A \cdot B + A' \cdot B' \cdot C' \cdot D) \cdot E \cdot F \cdot G' \cdot H' \} \qquad \text{(Pn3)}$$

The "b" column has bold entries in the tables of FIGS. 33 and 34 for the vectors listed in the table of FIG. 36.

$$b = B \oplus \{ (D \oplus E' \cdot E \oplus F' \cdot F \oplus G' \cdot G \oplus H' + C \oplus D' \cdot E \oplus F \cdot G \oplus H) \\ \cdot A \oplus B' \cdot B \oplus C' \cdot K' + \qquad \text{(Pn7)}$$

$$A \oplus B' \cdot B \oplus E' \cdot D \oplus E' \cdot E' \cdot F' \cdot G \oplus H' \cdot (B \oplus C + F \oplus G') + \\ A' \cdot B' \cdot C' \cdot E' \cdot F' \cdot G' \cdot H' \} \qquad \text{(Pn5+Pn8)}$$

The "c" column has bold entries in the tables of FIGS. 33 and 34 for the vectors listed in the table of FIG. 37.

$$c = C \oplus \{ A \oplus B \cdot A \oplus G' \cdot C \oplus D' \cdot C \oplus H' \cdot D \oplus E' \cdot E \oplus F' + \qquad \text{(Pn12)}$$

$$(C \oplus H' \cdot D \cdot E' \cdot E \oplus F' + E \oplus F \cdot G \oplus H' + E \oplus F' \cdot G \oplus H) \\ \cdot A \oplus B' \cdot B \oplus C' \cdot C \oplus D' \} \qquad \text{(Pn11)}$$

The "d" column has bold entries in the tables of FIGS. 33 and 34 for the vectors listed in the tables of FIG. 38.

$$d = D \oplus \{ (A \oplus G' \cdot B \oplus C \cdot G \oplus H' + A \oplus B \cdot C \oplus D') \\ \cdot D \oplus E' \cdot E \cdot F' \cdot F \oplus G' + \qquad \text{(Pn20)}$$

$$(F \oplus G + G \oplus H) \cdot D \oplus E' \cdot E \oplus F' \cdot A \oplus B' \cdot B \oplus C' \cdot C \oplus D' + \qquad \text{(Pn19)}$$

$$(F \oplus G + E \oplus F) \cdot C \oplus H' \cdot G \oplus H' \cdot A \oplus B' \cdot B \oplus C' \cdot C \oplus D' + \\ A \cdot B' \cdot C \cdot D \cdot E \cdot F \cdot \overline{G}' \cdot H' \} \qquad \text{(Pn15)}$$

The "e" column has bold entries in the tables of FIGS. 33 and 34 for the vectors listed in the table of FIG. 39.

$$e = E \oplus \{ (A \oplus B' \cdot F \oplus G' \cdot G \oplus H' + A \oplus B \cdot B \oplus C' \cdot G \oplus H + \\ A \oplus B \cdot F \oplus G' \cdot G \oplus H) \cdot C \oplus D' \cdot D \oplus E' \cdot E \oplus F' \} \qquad \text{(n21)}$$

The "f" column has bold entries in the tables of FIGS. 33 and 34 for the vectors listed in the table of FIG. 40.

$$f = F \oplus \{ (A \oplus G + B \oplus C) \\ \cdot A \oplus B' \cdot D \oplus E' \cdot E \oplus F' \cdot F \oplus G' \cdot G \oplus H' + \qquad \text{(Pn22)}$$

$$A \oplus B \cdot B \oplus C' \cdot C \oplus D' \cdot D \oplus E' \cdot E \oplus F' \cdot G \oplus H' + \qquad \text{(Pn24)}$$

$$( \overline{A}' \cdot B' \cdot C' \cdot D + C \cdot D') \cdot A' \cdot E' \cdot F' \cdot G' \cdot H' + A \oplus C' \cdot B' \cdot D \cdot E \cdot F \cdot G' \cdot H' \} \qquad \text{(Pn26)}$$

The "g" column has bold entries in the tables of FIGS. 33 and 34 for the vectors listed in the table of FIG. 41.

$$g = G \oplus \{ A \oplus B' \cdot B \oplus E \cdot E \oplus F' \cdot F \oplus G' \cdot C \oplus D' \cdot C \oplus H \cdot K' + \qquad \text{(Pn98)}$$

$$B \oplus C' \cdot C \oplus D' \cdot D \oplus E' \cdot E \oplus F' \cdot F \oplus G' \cdot G \oplus H' + \qquad \text{(Pn30)}$$

$$(A \cdot D' + C' \cdot D) \cdot B' \cdot E \cdot F' \cdot G' \cdot H' \cdot K' + A' \cdot B' \cdot C' \cdot D \cdot E \cdot F \cdot G' \cdot H' \} \qquad \text{(Pn33)}$$

The "h" column has bold entries in the tables of FIGS. 33 and 34 for the vectors listed in the table of FIG. 42.

$$h = H \oplus \{ A \oplus C' \cdot B \oplus E \cdot D \oplus E' \cdot E \oplus F' \cdot F \oplus G' \cdot G \oplus H' + \qquad \text{(n36)}$$

$$A \cdot B' \cdot C \cdot D \cdot E \cdot F \cdot G' \cdot H' + \qquad \text{(Pn37*)}$$

$$[K' \cdot A \cdot B' \cdot C' \cdot D + (A+B) \cdot C \cdot D'] \cdot E' \cdot F' \cdot G' \cdot H' \} \qquad \text{(Pn35)}$$

The "i" column has bold entries in the tables of FIGS. 21 and 22 for the 87 vectors listed in the table of FIGS. 43A and 43B.

$$i = (E \oplus F' \cdot F \oplus G \cdot G \oplus H' + E \oplus F \cdot F \oplus G' \cdot G \oplus H + \\ E \oplus F \cdot F \oplus G \cdot G \oplus H) \cdot (\text{Pn42})$$

$$(A \oplus B' \cdot B \oplus C \cdot C \oplus D' + A \oplus B \cdot C \oplus D) + \qquad \text{(Pn43)}$$

$$(D \oplus E' \cdot E \oplus F \cdot F \oplus G' \cdot G \oplus H' + D \oplus E \cdot E \oplus F \cdot F \oplus G \cdot G \oplus H + \\ D \oplus E \cdot E \oplus F' \cdot F \oplus G \cdot G \oplus H + \\ D \oplus E \cdot E \oplus F' \cdot F \oplus G' \cdot G \oplus H) \cdot (A \oplus B' \cdot B \oplus C \cdot C \oplus D + \\ A \oplus B \cdot C \oplus D') + \qquad \text{(n50)}$$

$$F \oplus G \cdot K' \cdot D' \cdot E \cdot H' \cdot (A \cdot B' \cdot C' + A' \cdot B \cdot C' + A' \cdot B' \cdot C) + \qquad \text{(Pn47)}$$

$(A \cdot B \cdot C' + A \cdot B' \cdot C + A' \cdot B \cdot C) \cdot D \cdot E' \cdot F' \cdot G' \cdot H' +$ (Pn49)

$(A \oplus B' \cdot B \oplus C \cdot C \oplus D' + A \oplus B \cdot C \oplus D) \cdot$ (Pn43)

$(E \cdot F' \cdot G' H' + E' \cdot F \cdot G' \cdot H' + E' \cdot F' \cdot G \cdot H')$ (Pn45)

The "j" column has bold entries in the tables of FIGS. 21, 23, 25, 26, 30, and 33 for the 129 vectors listed in the tables of FIGS. 44A–44D.

$j = \{D \oplus E \cdot K' \cdot F' \cdot G + (D \cdot E \cdot F' + D \cdot E' \cdot F + D' \cdot E \cdot F) \cdot G'\} \cdot (A' \cdot B' + A' \cdot C' + B' \cdot C') \cdot H' +$ (n77)

$(A \oplus G \cdot B \oplus C \cdot D \cdot E + A \oplus D \cdot B \oplus C \cdot C \oplus H' + A \oplus B' \cdot B \oplus C \cdot C \oplus D) \cdot E \oplus F' \cdot F \oplus G \cdot G \oplus H$ (n76)

$+(A \cdot B \cdot C' + A \cdot B' \cdot C + A' \cdot B \cdot C) \cdot D' \cdot E \cdot F \cdot G \cdot H +$ (n74)

$(C \oplus D \cdot A \cdot B + A \oplus C' \cdot B' \cdot D) \cdot E \cdot F \cdot G' \cdot H' + (D' \cdot G + G') \cdot E' \cdot F' \cdot H' +$ (n71+n68)

$(B \oplus C' \cdot F \oplus G \cdot G \oplus H' + F \oplus G' \cdot K') \cdot C \oplus D' \cdot D \oplus E' \cdot E \oplus F' +$ (n73)

$(B \oplus E' \cdot C \oplus D + A \oplus G \cdot B \oplus C') \cdot A \oplus B' \cdot E \oplus F' \cdot F \oplus G' \cdot G \oplus H +$ (n75)

$E \oplus F \cdot A \cdot B \cdot C \cdot D' \cdot G \cdot H + E \oplus F \cdot D' \cdot G' \cdot H' + K' \cdot D \cdot E \cdot F \cdot G \cdot H + A \oplus B' \cdot B \oplus C' \cdot C \oplus D'$ (n67*)

$+(A'B' \cdot C' + A \cdot B \cdot \overline{C} + A \cdot \overline{B} \cdot C + B \cdot C) \cdot E \oplus F \cdot D \cdot G \cdot H$ (n69)

It is assumed that with K=1 only the seven valid control vectors are presented at the input to the encoder so simple control vector labels can be derived from the last seven rows of the table of FIGS. 34A–34G. A total of 46 vectors listed in the tables of FIGS. 25, 27, and 30 require a positive entry disparity (PDRE). They are listed and sorted in the table of FIGS. 45A and 45B. Redundant bits are overlined. The equation for the positive required entry disparity PDRE can be written as follows:

$PDRE = (D \oplus E \cdot F' \cdot G' \cdot H + E \oplus F \cdot D' \cdot G' H' + G \oplus H \cdot D' \cdot E' \cdot F) \cdot$ (n85)

$(A \cdot B' \cdot C' + A' \cdot B \cdot C' + A' \cdot B' \cdot C) + (D \cdot G' H' + D' \cdot G) \cdot B \oplus C \cdot A' \cdot E' \cdot F' +$ (n46+Pn88*)

$(E' \cdot F' \cdot G \cdot H + E \oplus F + G \oplus H) \cdot A' \cdot B' \cdot C' \cdot D +$ (Pn87*)

$(A' + B') \cdot C \cdot D' \cdot E' \cdot F' \cdot G' \cdot H + (F' + H) \cdot K$ (n99)

A total of 43 vectors listed in the tables of FIGS. 23 and 26 require a negative entry disparity (NDRE). They are listed and sorted in the table of FIGS. 46A and 46B. The equation for the negative required entry disparity NDRE can be written as follows:

$NDRE = (D \oplus E \cdot F' \cdot G \cdot H + D \oplus F \cdot E \cdot G \cdot H' + D \cdot E \cdot F' \cdot H + D \cdot E' \cdot F \cdot G) \cdot$ (n90)

$(A \cdot B \cdot C' + A \cdot B' \cdot C \cdot A' \cdot B \cdot C) +$ (n48)

$(B \cdot C \cdot D' + B \cdot C' \cdot D + B' \cdot C \cdot D) \cdot A \cdot E \cdot F \cdot G' H +$ (n96*)

$(E' + F') \cdot A \cdot B \cdot C \cdot D' \cdot G \cdot H +$ (n92*)

$(E \oplus F \cdot G' \cdot H' + G \oplus H \cdot E' \cdot F' + E \oplus F \cdot G \oplus H) \cdot A \cdot B \cdot C \cdot D'$ (Pn94*)

$(C \oplus D \oplus H' + D' \cdot H) \cdot A \cdot B \cdot E \cdot F \cdot G +$ (Pn95*)

$A \oplus B \cdot C' \cdot D \cdot E \cdot F \cdot G + K \cdot C \cdot D$ (Pn97*)

If the required entry disparity PDRE or NDRE does not match the running disparity RD, the alternate vector must be used. The alternate vector is generated by complementation of the primary vector. The running disparity at the vector boundaries is constrained to the two values plus or minus two. The positive or negative running disparity in front of a byte is referred to as PDFBY or NDFBY, respectively.

$$CMPLP10 = PDRE \cdot NDFBY + NDRE \cdot PDFBY$$

A total of 19 vectors listed in the table of FIG. 26 have a positive disparity of four. They are listed and sorted in the table of FIG. 47. The equation for the positive block disparity of four for encoding PDB can be written as follows:

$PDB = (D \oplus E \cdot F + D \cdot E \cdot F') \cdot (A \cdot B \cdot C' + A \cdot B' \cdot C + A' \cdot B \cdot C) \cdot G \cdot H +$ (PDB1)

$(B \cdot C \cdot D' + B \cdot C' \cdot D + B' \cdot C \cdot D) \cdot A \cdot E \cdot F \cdot G' \cdot H +$ (PDB2)

$(C \oplus D \cdot H' + D' \cdot H) \cdot A \cdot B \cdot E \cdot F \cdot G +$ (PDB3)

$E \oplus F \cdot A \cdot B \cdot C \cdot D' \cdot G \cdot H + A \oplus B \cdot C' \cdot D \cdot E \cdot F \cdot G \cdot H$ (PDB4+PDB5)

A total of 41 vectors listed in the tables of FIGS. 27 and 30 have a negative disparity of four. They are listed and sorted in the table of FIG. 48. Using the coding labels from the table, the equation for the negative block disparity of four for encoding NDB can be written as follows:

$NDB = \{E \oplus F \cdot (G \cdot H) + E' \cdot F' \cdot (G + H)\} \cdot A' \cdot B' \cdot C' \cdot D +$ (NDB1)

$(D \oplus E \cdot F' \cdot G' \cdot H + E \oplus F \cdot D' \cdot G' \cdot H' + G \oplus H \cdot D' \cdot E' \cdot F) \cdot (A \cdot B' \cdot C' + A' \cdot B \cdot C' + A' \cdot B' \cdot C) +$ (NDB2)

$(D \cdot G' \cdot H' + D' \cdot G) \cdot B \oplus C \cdot A' \cdot E' \cdot F' + (A' + B') \cdot C \cdot D' \cdot E' \cdot F' \cdot G' \cdot H + K \cdot F'$ (NDB4+NDB3)

For balanced vectors (BALBY), the starting and ending disparities are equal and complementary otherwise. Since for this code, the coded vectors are either balanced or have a disparity of plus or minus four, a vector is balanced, if neither PDB nor NDB is asserted. This approach results in less logic delay and significant logic circuit sharing compared to other possible solutions. The running disparity DEBY at the end of an encoded vector is determined as follows:

$$DEBY = (PDB + NDB)' \oplus DFBY$$

The running disparity DFBY at the start of the next byte is equal to the ending disparity DEBY of the preceding byte.

$$DFBY_{+1} = DEBY_0$$

The exemplary encoding circuitry can include a single latch (not shown) to keep track of the value of DFBY.

As noted above, any odd number of errors within a byte produces an invalid byte. A full ten-bit vector set includes among others 252 balanced vectors, 120 vectors with a disparity of plus four and 120 vectors with a disparity of minus four. The 8B/10B-P code uses 352 vectors, 232 balanced vectors and 60 complementary pairs of vectors with a disparity of four. All other 672 ten-bit vectors are invalid. The validity checks can be executed by circuits which identify either valid vectors or invalid vectors. The approach below identifies all valid vectors which are listed and sorted for easy identification in the tables of FIGS. 49 and 50. Note that every valid vector has a complement which is also valid and the respective vectors are listed side by side.

Figure 18:
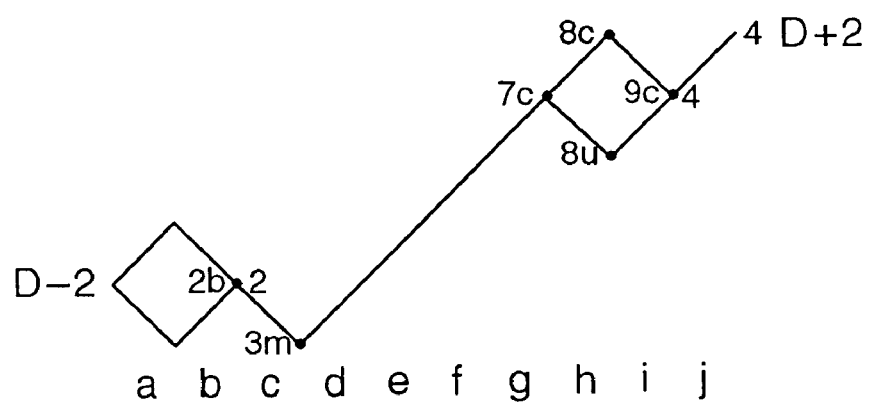
Figure 19:
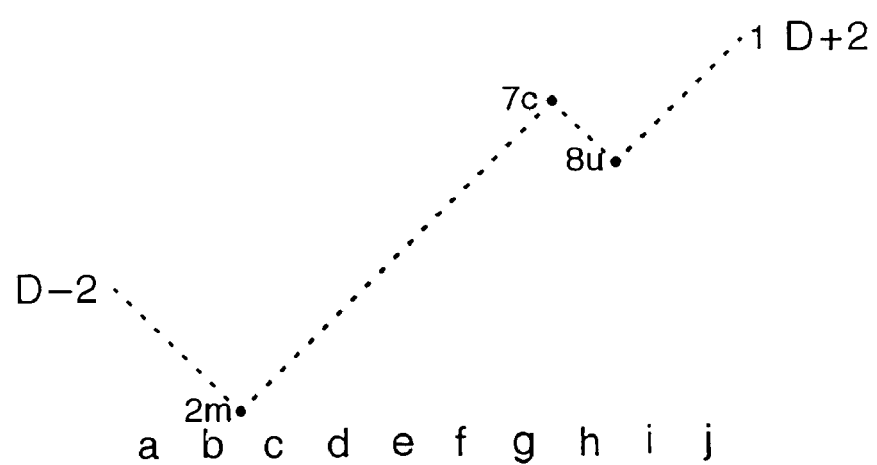

All but four of the vectors with i≠j can be paired with another valid vector which is identical in the first eight bits. The exception is illustrated in FIG. 18 and in the two rows of the table of FIGS. 50A and B with empty spaces in the ij=10 or ij=01 columns. The table of FIGS. 49A and B lists all 204 valid vectors with i≠j:

Primary vectors:
   60 from table of FIG. 22, 4 from table of FIG. 23, 4 from table of FIG. 25,
   18 from table of FIG. 26, 16 from table of FIG. 30, 60 from table of FIG. 33.

The alternate vectors are complements of vectors listed as primary vectors:
   4 from table of FIG. 23, 4 from table of FIG. 25,
   18 from table of FIG. 26, 16 from table of FIG. 30.

The 148 vectors with i=j are listed in the table of FIGS. 50A and B arranged as 74 complementary vector pairs:
Primary vectors:
   27 complementary primary vector pairs from the tables of FIGS. 20 and 21,
   20 primary vectors from the table of FIG. 23,
   1 primary vector each from the tables of FIGS. 25 and 26,
   25 primary vectors from the table of FIG. 27.
Alternate vectors:
   20 from the table of FIG. 23,
   1 each from the tables of FIGS. 25 and 26,
   25 from the table of FIG. 27.

The equation for the validity of encoded vectors is composed from the valid labels of the tables of FIGS. 49 and 50. The expressions in parentheses at the right page edge refer to the net number of the logic associated with the logic expression at the left; in the case of those annotated with an asterisk, the logic expression on the left includes an additional term, namely, $\cdot i \oplus j'$ for n0*, $\cdot i \oplus j$ for n1* and n6*, and $\cdot d \oplus i \cdot i \oplus j'$ for n8*.

$$VALID = \{(e \oplus f' \cdot f \oplus g' \cdot g \oplus h \cdot h \oplus i + e \oplus f' \cdot f \oplus i \cdot g \oplus h + e \oplus f \cdot g \oplus h' \cdot h \oplus i) \cdot i \oplus j' + \quad (n0^*)$$

$$(d \oplus e \cdot e \oplus f' \cdot f \oplus g' \cdot g \oplus h' + e \oplus h \cdot f \oplus g + e \oplus f \cdot g \oplus h) \cdot i \oplus j\} \cdot \quad (n1^*)$$

$$(a \oplus b' \cdot b \oplus c \cdot c \oplus d' + a \oplus b \cdot c \oplus d) + \quad (n4)$$

$$\{(d \oplus e \cdot e \oplus f' \cdot f \oplus g' \cdot g \oplus h + d \oplus h \cdot d \oplus f \cdot e \oplus g + d \oplus h \cdot e \oplus f \cdot g \oplus h') \cdot i \oplus j + \quad (n6^*)$$

$$(e \oplus f' \cdot f \oplus g \cdot g \oplus h' \cdot h \oplus i + e \oplus f \cdot g \oplus h) \cdot d \oplus i \cdot i \oplus j'\} \cdot \quad (n8^*)$$

$$(a \oplus b' \cdot b \oplus c \cdot c \oplus d + a \oplus b \cdot c \oplus d') + \quad (n11)$$

$$(e \oplus f' \cdot f \oplus g' \cdot g \oplus h' \cdot h \oplus i + e \oplus f \cdot g \oplus h) \cdot (a \oplus b \cdot c \oplus d' \cdot d \oplus i' + a \oplus b' \cdot b \oplus i' \cdot c \oplus d) \cdot i \oplus j' + \quad (Pn27)$$

$$(a \oplus b \cdot d \oplus e' \cdot g \oplus h' d \oplus i + a \alpha b' \cdot b \oplus g' \cdot g \oplus h) \cdot c \oplus d \cdot e \oplus f' \cdot f \oplus g' \cdot i \oplus j + \quad (Pn15, Pn29)$$

$$(b \oplus c' \cdot c \oplus d \cdot d \oplus e + b \oplus c \cdot d \oplus e') \cdot a \oplus e' \cdot e \oplus f' \cdot f \oplus g \cdot g \oplus h' \cdot h \oplus i \cdot i \oplus j' + \quad (Pn14)$$

$$(a \oplus b' \cdot b \oplus g' \cdot c \oplus d + a \oplus b \cdot c \oplus d' \cdot d \oplus h') \cdot e \oplus f \cdot g \oplus h' \cdot i \oplus j + \quad (Pn28)$$

$$(a \oplus b \cdot b \oplus c \cdot c \oplus d' + a \alpha b' \cdot c \oplus d) \cdot a \oplus e' \cdot e \oplus f' \cdot f \oplus g \cdot g \oplus h \cdot i \oplus j + \quad (Pn30)$$

$$(e \oplus f' \cdot g \oplus h' \cdot h \oplus i + e \oplus f \cdot g \oplus h) \cdot a \oplus b' \cdot b \oplus c' \cdot c \oplus d \cdot d \oplus i' \cdot i \oplus j' + \quad (Pn17)$$

$$(d \oplus e' \cdot e \oplus f' \cdot g \oplus h + d \oplus h' \cdot e \oplus f \cdot g \oplus h') \cdot a \oplus b' \cdot b \cdot c' \cdot c \oplus d \cdot i \oplus j \quad (Pn31)$$

Disparity violations are not monitored for this example because they would in most cases not significantly help the error correction procedures associated with this type of code and of course, the results of such disparity checks are usually not available until a few bytes after the error.

Decoding restores the original eight bits and the K-bit. As for encoding, there are two types of bit changes to be made:
1. Complementation of an entire vector.
2. Complementation of individual bits.

The code was built such that these two operations can be totally separated and can be executed in parallel. The two extra bits i and j are included to select the vectors for the above operations and then simply dropped.

The decoding equations can be significantly simplified if we allow arbitrary bit changes for the decoding of invalid vectors. Appropriate invalid vectors can be added to the vectors defining a logic expression. In the following, these redundant vectors are not show but the terms of logic expressions which can be eliminated by their inclusion are overlined and eliminated in the final equations for the complementation of an entire vector or the complementation of individual bits. As a first example, the bit values "a" and "b" of a pair of vectors might be 10 and 01, respectively. These bit values can be ignored for purposes of the logic expression, since the only possible other values are 00 or 11, both of which generate an invalid vector because the Huffman distance between vector classes is two. Of course only one such complementary pair of bits can be eliminated for each pair of vectors. In this context it is also useful to remember that the maximum run length is five and the runs are at most three at the leading and trailing ends of the coded 10-bit vectors and these second type violations can be included together with the first type of violations.

All disparity dependent code points have complementary representations, a primary vector and an alternate vector, identified in the tables by an appended letter P or A to the vector name, respectively. The primary or alternate versions are used to meet the disparity requirements. For decoding, all alternate vectors must be complemented. The 89 alternate vectors are the complements of the vectors listed in the tables of FIGS. 23, 25–27, and 30, and are tabulated in the table of FIGS. 51A and B. The equation for the complementation of the first eight bits of a vector is composed from the alternate vector labels of the table of FIGS. 51A and 51B.

$$COMPL8 = (a \oplus b' \cdot b \oplus g' + c \oplus d' \cdot d \oplus h') \cdot e \oplus f \cdot g \oplus h' \cdot i \cdot j' + \quad (n53)$$

$$(d \oplus h' \cdot g \oplus h' + d \oplus e' \cdot e \oplus f) \cdot a \oplus b' \cdot b \oplus c' \cdot i \cdot j' + \quad (n52)$$

$$(a \oplus b \cdot b \oplus c \cdot f \oplus g + a \oplus b' \cdot f \oplus g + a \oplus b' \cdot f \oplus g') \cdot a \oplus e' \cdot e \oplus f' \cdot g \oplus h \cdot i \cdot j' + \quad (n51)$$

$$(d \oplus e \cdot g \oplus h' \cdot j' + g \oplus h \cdot j) \cdot (a \oplus b' \cdot c \oplus d' + c \oplus d) \cdot e \oplus f' \cdot f \oplus g' \cdot i + \quad (n50)$$

$$(b \oplus c \cdot a' + a \cdot b' \cdot c') \cdot d' \cdot e' \cdot f \cdot i \cdot j + (\overline{e} \cdot f \cdot g' \cdot h' + g \oplus h) \cdot a \cdot b' \cdot c' \cdot i \cdot j + \quad (n56 + Pn59)$$

$$(a' \cdot b' + c' \cdot d') \cdot e \cdot f \cdot h \cdot i \cdot j + e' \cdot f \cdot g' \cdot h' \cdot c \cdot d' \cdot j' + \quad (Pn41 + Pn42)$$

$$\{a \oplus b' \cdot b \oplus c' \cdot e' \cdot f + a \cdot e \cdot f \cdot (b + d)\} \cdot g' \cdot h' \cdot i \cdot j + \quad (n58)$$

$$(a \cdot b + c \cdot d) \cdot e \oplus f \cdot g \oplus h \cdot i \cdot j \quad (Pn57)$$

The factors $\overline{c \oplus d}$ in the second label and $\overline{d}$ in the eighth label are redundant because $c \oplus d'$ and $d'$ both generate an invalid leading run of four.

For decoding, the bold type bit values in the encoded columns of the table of FIG. 33 have to be complemented back to their original values as indicated in the source vector columns ABCDEFGH. The decoding equations are similar to the encoding equations, except that the values of the i and j bits have to be included and the bold type values in the table of FIG. 33 are the complements of those used in the encoding equations. In the tables of FIGS. 52 through 60, the common bit patterns are marked by bold type to logically classify the vectors by simple expressions. Redundant terms are overlined.

The "a" column has bold entries in the tables of FIGS. 33 and 34 for the vectors listed in the table of FIG. 52. Using the decoding labels, the decoding equation for bit "A" can be written as follows:

$$A = a \oplus \{(d \oplus e \cdot e \oplus f' + b \oplus g' \cdot g \oplus h') \cdot a \oplus b \cdot b \oplus c \cdot c \oplus d' \cdot i' \cdot j + \quad \text{(n70)}$$

$$a \oplus b \cdot b \oplus c' \cdot a \oplus e' \cdot e \oplus f \cdot f \oplus g \cdot i' \cdot j + a \cdot b' \cdot d \cdot f' \cdot g \cdot h' \cdot i' \cdot j + \quad \text{(Pn66+Pn68)}$$

$$a \oplus b' \cdot c \oplus d' \cdot g \oplus h \cdot i' \cdot j + a' \cdot b \cdot e \cdot f \cdot g \cdot h' \cdot i' \cdot j\} \quad \text{(Pn67+Pn69)}$$

The "b" column has bold entries in the tables of FIGS. 33 and 34 for the vectors listed in the table of FIG. 53. Using the decoding labels of the table of FIG. 53, the decoding equation for bit "B" can be written as follows:

$$B = b \oplus \{(b \oplus c \cdot e \oplus f' \cdot g \oplus h' + b \oplus c' \cdot e \oplus f)$$
$$\cdot a \oplus b \cdot d \oplus e \cdot f \oplus g \cdot i' \cdot j + \quad \text{(n72)}$$

$$a \oplus b \cdot b \oplus g' \cdot e \oplus f \cdot f \oplus f \cdot g \cdot g \oplus h \cdot i' \cdot j + \quad \text{(Pn74)}$$

$$a \oplus b' \cdot c \oplus d' \cdot g \oplus h \cdot i' \cdot j + a' \cdot b \cdot c' \cdot d \cdot e' \cdot g \cdot i' \cdot j\} \quad \text{(Pn67+Pn75)}$$

The "c" column has bold entries in the tables of FIGS. 33 and 34 for the vectors listed in the table of FIG. 54. Using these decoding labels, the decoding equation for bit "C" can be written as follows:

$$C = c \oplus \{(d \oplus e \cdot e \oplus f' + d \oplus h \cdot g \oplus h') \cdot a \oplus d' \cdot b \oplus c \cdot i' \cdot j + \quad \text{(n77)}$$

$$(c \oplus d \cdot e \oplus f \cdot f \oplus g + c \oplus d' \cdot e \oplus f \cdot f \oplus g') \cdot d \oplus e \cdot g \oplus h \cdot i' \cdot j\} \quad \text{(n78)}$$

The "d" column has bold entries in the tables of FIGS. 33 and 34 for the vectors listed in the table of FIG. 55. Using these decoding labels, the decoding equation for bit "D" can be written as follows:

$$D = d \oplus \{(d \oplus e \cdot e \oplus f' + b \oplus g' \cdot g \oplus h') \cdot a \oplus b \cdot b \oplus c \cdot c \oplus d' \cdot i' \cdot j + \quad \text{(n70)}$$

$$(d \oplus e' \cdot e \oplus f \cdot f \oplus g' + a \oplus e' \cdot e \oplus f' \cdot f \oplus g) \cdot a \oplus b \cdot c \oplus d \cdot i' \cdot j + \quad \text{(n81)}$$

$$(b \oplus g \cdot f \oplus g' + c \oplus d' \cdot b \oplus g) \cdot a \oplus b \cdot b \oplus c' \cdot d \oplus e \cdot i' \cdot j + \quad \text{(n83)}$$

$$a \cdot b' \cdot c \cdot d' \cdot e \cdot g' \cdot i' \cdot j\} \quad \text{(n84)}$$

The "e" column has bold entries in the tables of FIGS. 33 and 34 for the vectors listed in the table of FIG. 56. Using these decoding labels, the decoding equation for bit "E" can be written as follows:

$$E = e \oplus \{(d \oplus e \cdot f \oplus g + d \oplus e' \cdot f \oplus g') \cdot c \oplus d \cdot e \oplus f \cdot g \oplus h \cdot i' \cdot j + \quad \text{(n86)}$$

$$a \oplus b' \cdot \overline{b \oplus c} \cdot c \oplus d' \cdot d \oplus e \cdot \overline{a \oplus e'} \cdot e \oplus f \cdot f \oplus g \cdot i' \cdot j\} \quad \text{(n87)}$$

The redundant factor $\overline{b \oplus c}$ is included to enable circuit sharing.

The "f" column has bold entries in the tables of FIGS. 33 and 34 for the vectors listed in the table of FIG. 57. Using these decoding labels, the decoding equation for bit "F" can be written as follows:

$$F = f \oplus \{a \oplus b \cdot b \oplus c' \cdot b \oplus g \cdot e \oplus f \cdot f \oplus g' \cdot i' \cdot j + \quad \text{(n90)}$$

$$a \oplus d \cdot b \oplus g \cdot c \oplus d' \cdot f \oplus g \cdot g \oplus h' \cdot i' \cdot j + \quad \text{(Pn91)}$$

$$a \oplus b \cdot c \oplus d \cdot c \oplus g \oplus e \oplus f \cdot i' \cdot j\} \quad \text{(Pn92)}$$

The "g" column has bold entries in the tables of FIGS. 33 and 34 for the vectors listed in the table of FIG. 58. Using these decoding labels, the decoding equation for bit "G" can be written as follows:

$$G = g \oplus \{b \oplus g' \cdot c \oplus d' \cdot d \oplus h \cdot e \oplus f' \cdot f \oplus g \cdot i' \cdot j + \quad \text{(Pn94)}$$

$$b \oplus c' \cdot c \oplus d \cdot d \oplus e \cdot e \oplus f \cdot g \oplus h \cdot i' \cdot j + \quad \text{(Pn95)}$$

$$a \oplus e' \cdot e \oplus f \cdot c' \cdot d \cdot g \cdot h' \cdot i' \cdot j + a \cdot b' \cdot e' \cdot f \cdot g \cdot h \cdot i' \cdot j\} \quad \text{(n96+Pn97)}$$

The "h" column has bold entries in the tables of FIGS. 33 and 34 for the vectors listed in the table of FIG. 59. Using these decoding labels, the decoding equation for bit "H" can be written as follows:

$$H = h \oplus \{a \oplus d \cdot c \oplus g \cdot d \oplus f \cdot e \oplus g' \cdot g \oplus h \cdot i' \cdot j + \quad \text{(Pn100)}$$

$$a \oplus e' \cdot e \oplus f \cdot c \cdot d' \cdot g' \cdot h \cdot i' \cdot j + a \cdot b' \cdot e' \cdot f' \cdot g \cdot h \cdot i' \cdot j\} \quad \text{(n101+Pn97)}$$

The K-bit value for all vectors of the tables of FIGS. 52–59 is zero. The seven encoded control characters which have a K-value of one are listed in the table of FIG. 60. All seven control characters have alternate representations. It will be appreciated that the table of FIG. 7 shows the results of the mapping of 7 control vectors to 7 disparity dependent encoded control vectors having primary representations and alternate representations complementary to the primary representations, the encoded control vectors including the 7 control vectors plus two appended binary symbols, the primary representations of the encoded control vectors satisfying at least one of:

(i) disparity equals minus four, (ii) required starting disparity is positive, (iii) third, fifth, sixth, seventh and ninth binary symbols have a value of zero and first binary symbol has a value of one, (iv) fourth and eighth binary symbols are complementary, and (v) eighth and tenth binary symbols are complementary;

(i) disparity equals minus four, (ii) required starting disparity is positive, (iii) fourth, sixth, eighth, ninth and tenth binary symbols have a value of zero and fifth and seventh binary symbols have a value of one;

(i) disparity equals zero, (ii) required starting disparity is negative, (iii) first two binary symbols and last two binary symbols have a value of zero and third, fourth, fifth, sixth and seventh binary symbols have a value of one; and (i) disparity equals zero, (ii) required starting disparity is positive, (iii) first two binary symbols and last two binary symbols have a value of zero and fourth, fifth, sixth and seventh and eighth binary symbols have a value of one.

The determination of the K-bit values is made directly from the primary or alternate representation rather than exclusively from the restored primary vectors in order to avoid the extra latency associated with serial operation of primary vector restoration and bit value determination. Using these decoding labels, the decoding equation for bit "K" can be written as follows:

$$K = (b \oplus c \cdot c \oplus d + c \oplus d') \cdot d \oplus e \cdot d \oplus i' \cdot e \oplus f \cdot f \oplus g \cdot g \oplus h \cdot i \oplus j' +$$
$$a \oplus c \cdot c \oplus g' \cdot d \oplus h \cdot e \oplus f' \cdot f \oplus i' \cdot h \oplus j \cdot f \oplus g' +$$
$$a \oplus b' \oplus g \cdot d \oplus e' \cdot e \oplus f' \cdot f \oplus g' \cdot f \oplus i \cdot i \oplus j' \quad \text{(PK)}$$

For the circuit implementation, it is assumed that all inputs are available in complementary form, i.e. both the +L2 and −L2 outputs of the input register latches are made available. Nevertheless, the assumption is that the −L2 outputs are slightly delayed relative to the +L2 outputs. The circuit diagrams show only NAND, NOR, INV, XOR, and XNOR gates (with one exception). The use of AND and OR gates has been avoided because of their increased delays. For the NAND and NOR gates, the upper inputs of the logic symbols usually have less delay than the lower ones. The presumed critical paths are therefore routed through the top inputs. The wire routing also assumes that XNOR delays are shorter than XOR delays.

There is some leeway in the definition of the basic logic equations and in the partitioning of the longer expressions to match the fan-in limitations of the gates. Variations in these choices lead to different ranges in circuit sharing and circuit counts and thus the exemplary circuit may not necessarily be minimum area. Another reason for variation in circuit implementation and opportunity to somewhat enhance the exemplary design is the selection of the specific redundant factors in the decoding circuits. In circuit areas which are suspected to be at the upper end of circuit delay, the circuit count has occasionally been increased to reduce delay primarily by reducing the fan-in of gates in the critical path. For delay considerations, both XOR and XNOR gates have been used at the input to generate both polarities and some of those gates can be replaced by INV circuits in the event that simulation results are available. Similarly, the circuit diagrams show no complex gates to allow maximum circuit sharing; logic processing programs can be employed that will introduce complex gates automatically where appropriate. Note that some of the logic variables of the equations are not present explicitly in the circuit diagrams. If so, they have been merged with other functions in a single gate to reduce overall circuit delay.

Figure 62A:
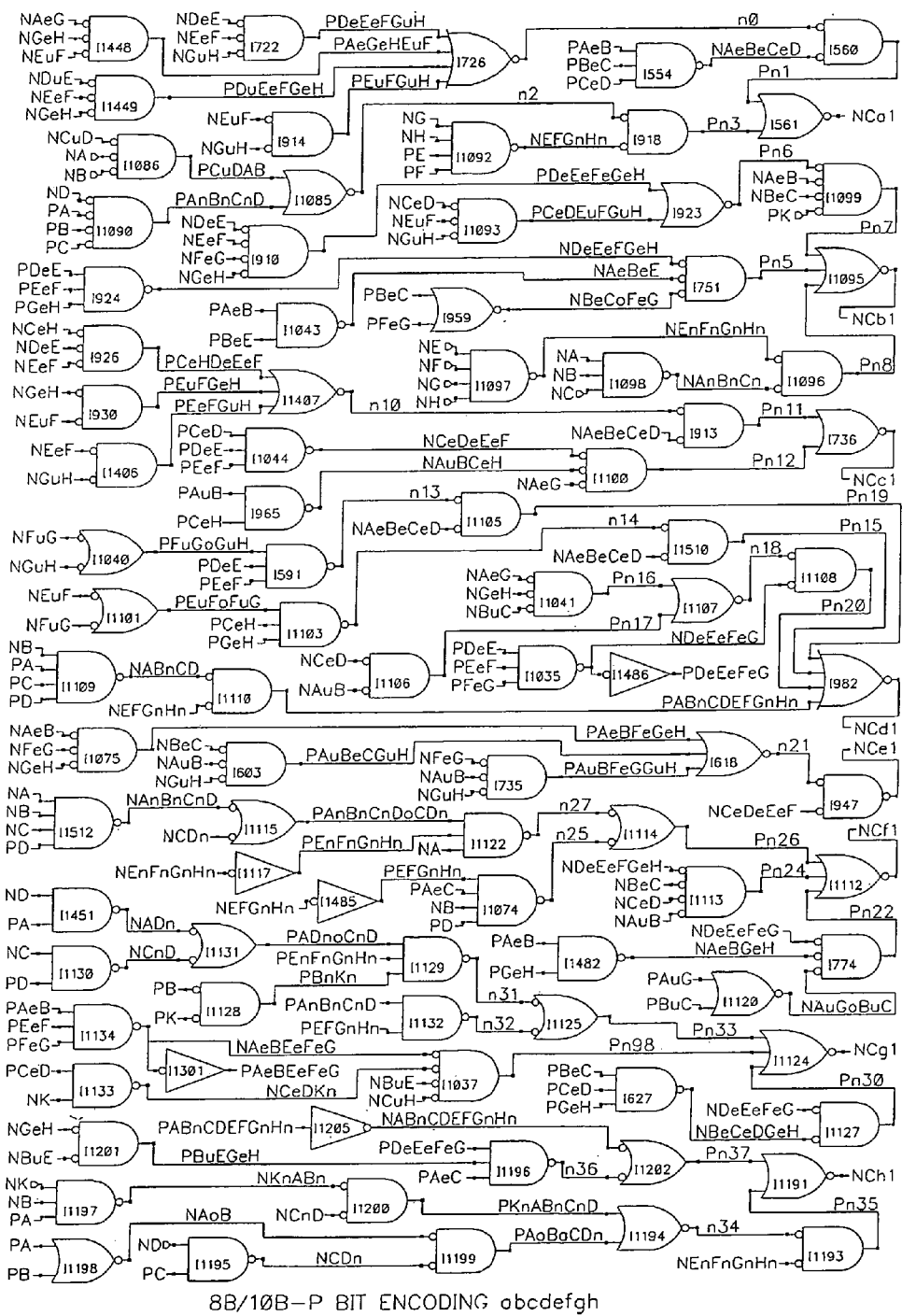
FIGS. 62A, B and C are logic gate diagrams of the encoding circuit of FIG. 61 according to one exemplary embodiment of the present invention.
Figure 62B:
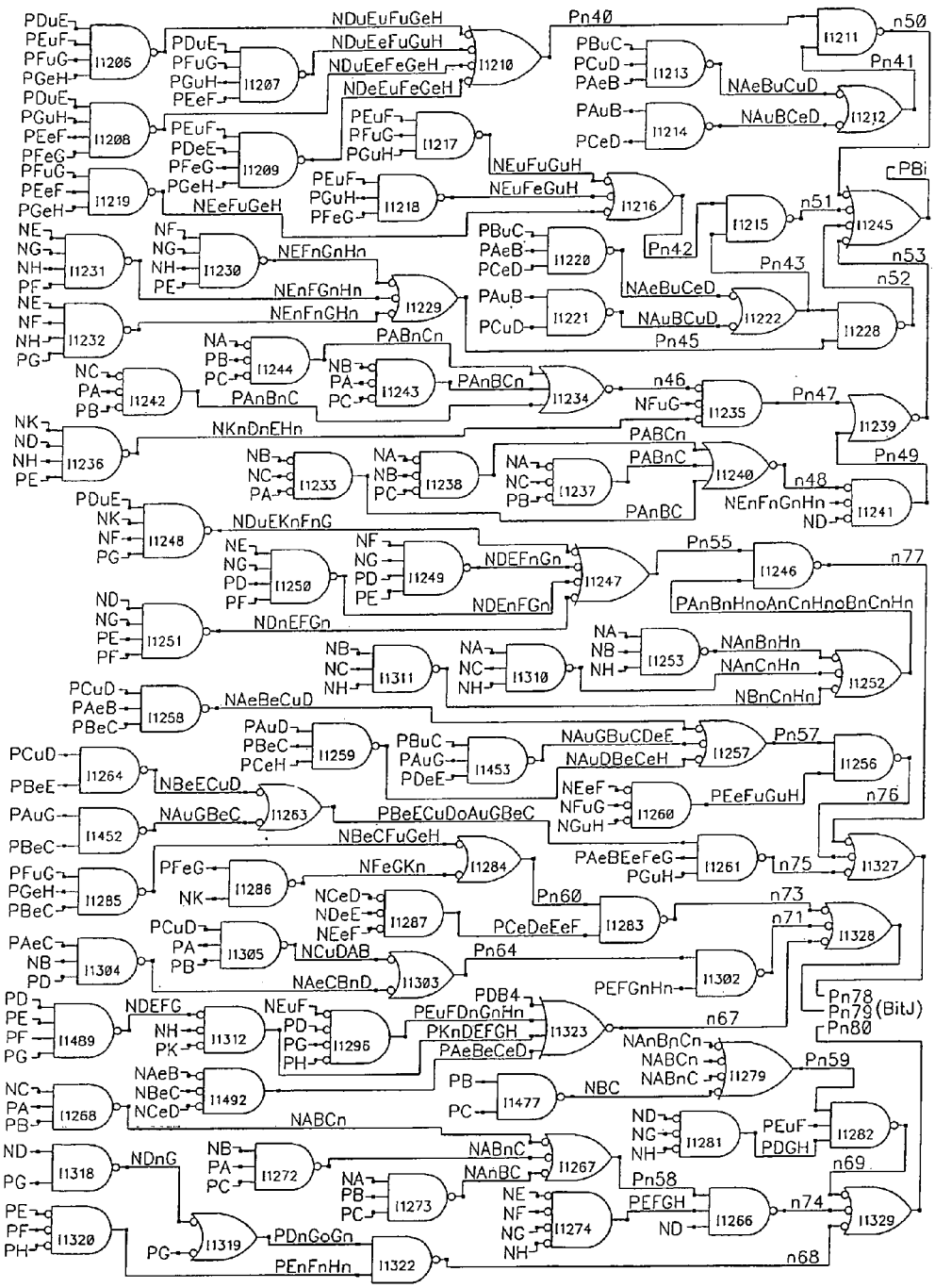
Figure 62C:
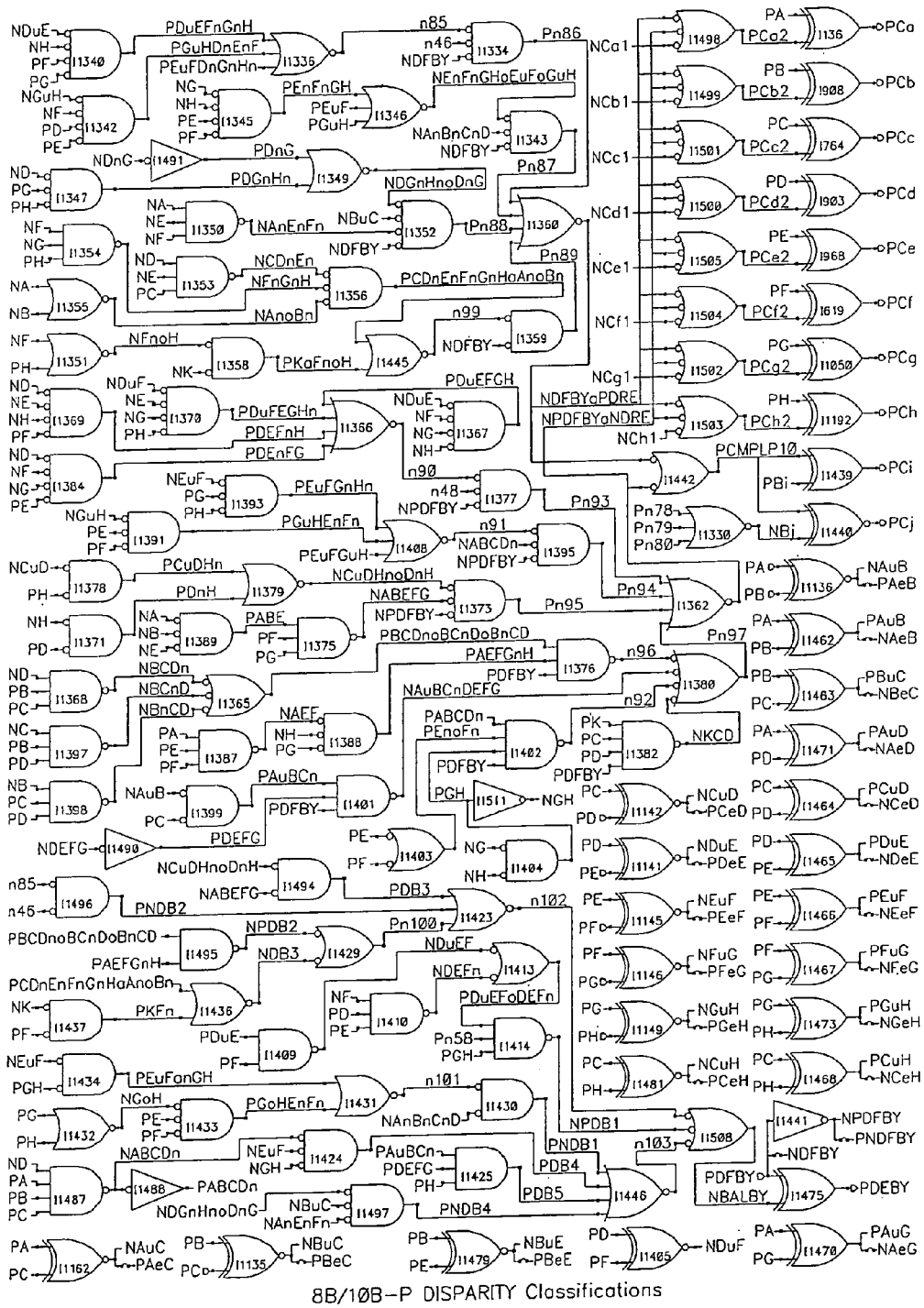

The block diagram for the encoding circuit with all inputs and outputs is shown in FIG. 61. A gate-level circuit diagram of the encoder is shown in FIGS. 62A–C which represent a single circuit with net sharing. FIG. 62A shows most of the encoding of the leading 8 bits (a through h), the encoding of the trailing i and j bits is shown in FIG. 62B, and FIG. 62C shows the implementation of the equations for the complementation of entire vectors on the upper left side and the determination whether an encoded vector is balanced on the lower left side. The upper right side shows the last two gate levels for bit encoding. The generation of the ending disparity DEBY which is equal to the starting disparity DFBY for the next byte is shown at the bottom of the right side. In between are a number of EXCLUSIVE OR (XOR) and XNOR gates which are shared across the three encoding circuit diagrams. Some of these gates can be replaced by inverters driven from the gate of opposite polarity if they are not part of any critical timing path.

The signal CMPL10 which complements all 10 bits of a coded byte is orthogonal to the other signals (Ca1, Cb1, Cc1, Cd1, Ce1, Cf1, Cg1, Ch1) which cause complementation of individual bits. In other words, both for encoding and decoding, no individual bits are changed when a full vector is complemented and vice-versa. This feature allows the merger of both types of signals in a single OR function as shown at the upper right side of FIG. 62C, greatly simplifying the circuitry preceding the output EXCLUSIVE OR function. The CMPL10 signal is not explicitly present in the circuit version shown. It is dependent on the required entry disparity and the starting disparity DFBY which is equal to the ending disparity DEBY of the preceding byte. Note that the value of DFBY is not required immediately at the start of the encoding interval because in the critical signal paths it is typically an input to a gate at the third or fourth level which facilitates pipelining of this logic path into the next cycle.

The encoder includes 298 gates and can include a flip-flop (not shown) to keep track of the disparity. No logic path exceeds 7 gates; all gates are of the inverting type with shorter delay except some XOR gates which for most power and loading levels have comparable or only slightly more delay than XNOR gates.

The circuit presented has been structured for easy forward pipelining for fast operation at the cost of a few extra gates. If a first encoding step is limited to six logic levels, all the trailing EXCLUSIVE OR functions for the coded bits and for the ending disparity can be moved into the next cycle which requires an extra 21 latches. The first encoding step can be reduced to five gating levels, if the OR functions immediately before the XOR are also moved to a second step which requires only five more latches, a total of 26 extra latches. A reduction to four gating levels in the first step requires moving the two trailing gates for bits e and i, and the three trailing gates for all other signal paths to a second step which requires 60 latches more than the nonpipelined version (9 for bits A, B, C, D, E, F, G, H, and PDFBY; 19 for the inputs of the gates generating Ca1, Cb1, Cc1, Cd1, Cf1, Cg1, and Ch1; 1 for Ce1; 21 for the inputs of the gates generating PBi, Pn78/79/80, NDFBYaPDRE, and NPDFBYaNDRE; 10 for the inputs of the gates generating n102, NPDB1, and n103).

A further delay reduction can be accomplished by itself or in combination with any of the above versions by minor circuit modifications and moving the leading EXCLUSIVE OR functions into the preceding clock cycle in the data source path which requires at most 13 extra latches with complementary outputs.

Figure 63:
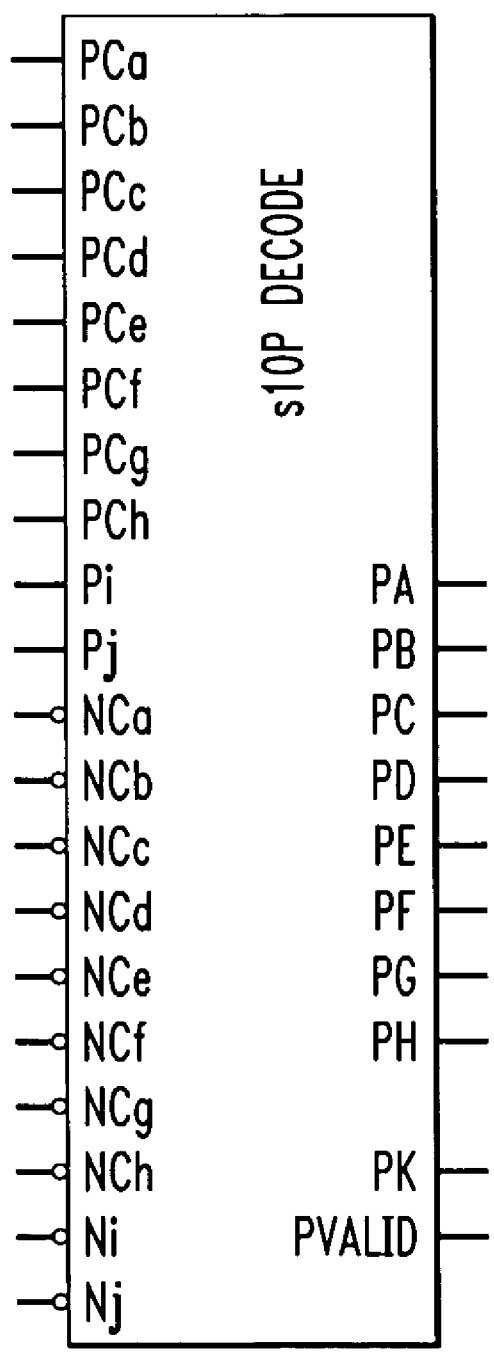
FIG. 63 is a block diagram of a decoding circuit according to an exemplary embodiment of the present invention.
Figure 64A:
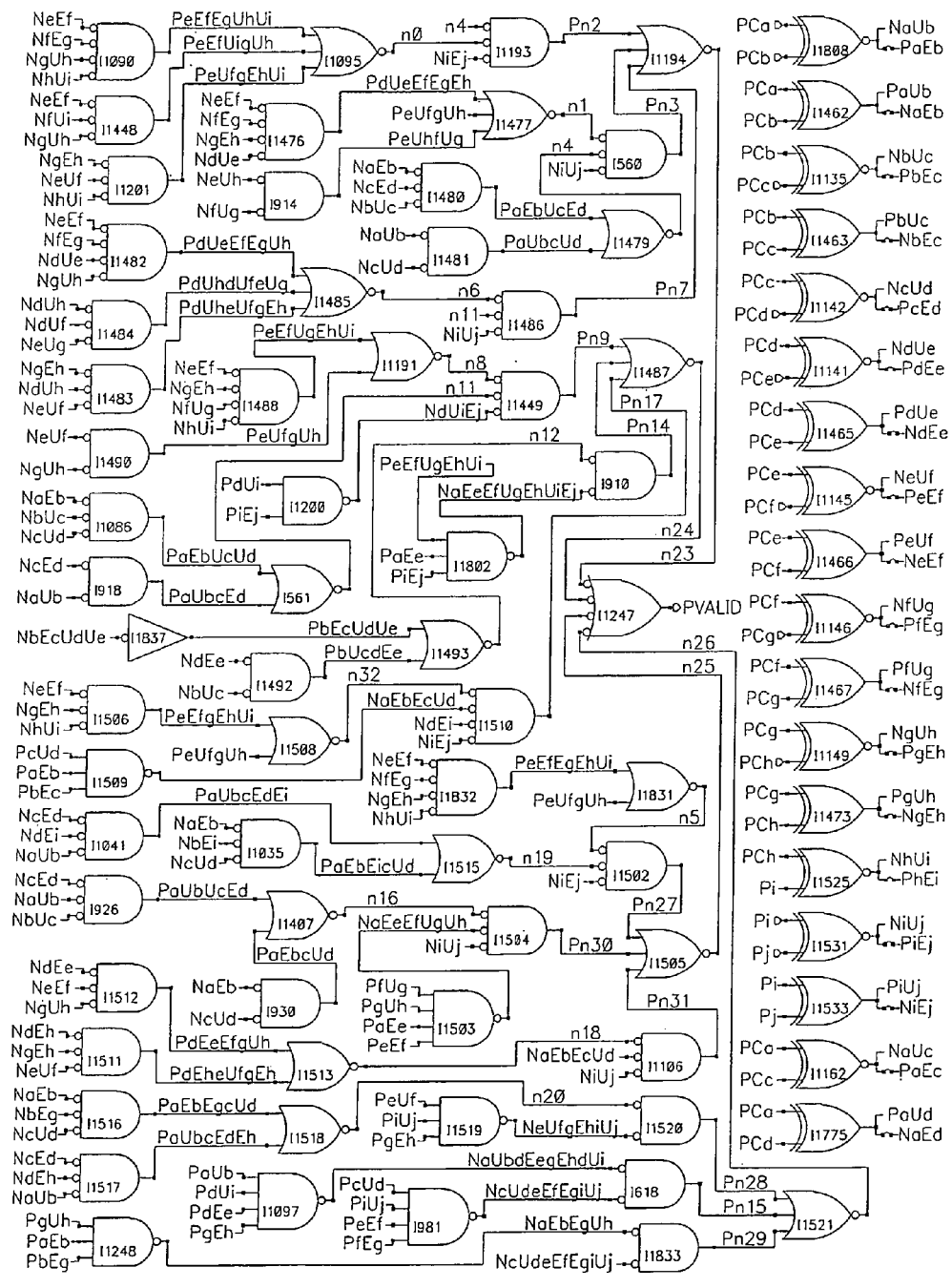
FIGS. 64A, B and C are logic gate diagrams of the decoding circuit of FIG. 63 according to an embodiment of the present invention.
Figure 64B:
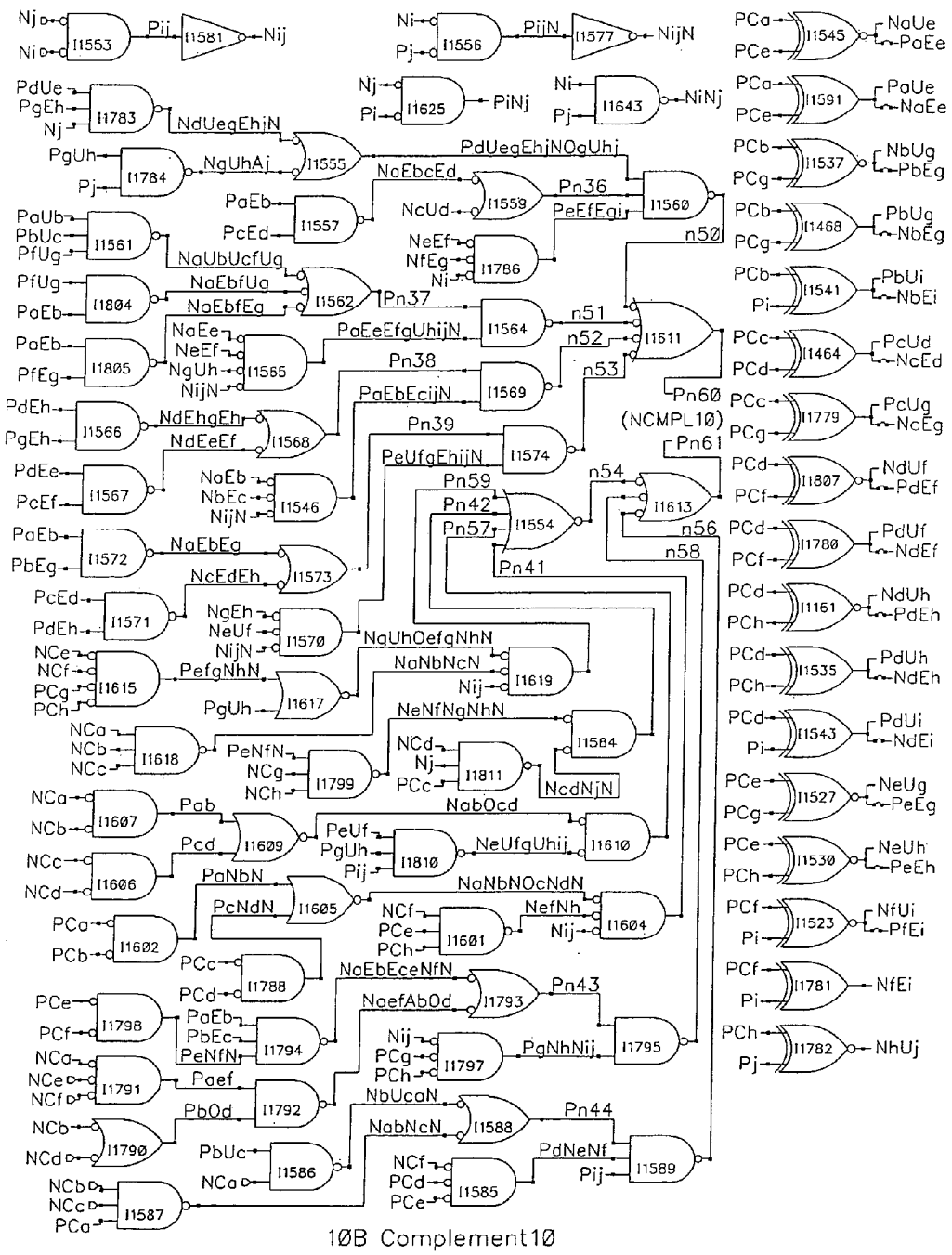
Figure 64C:
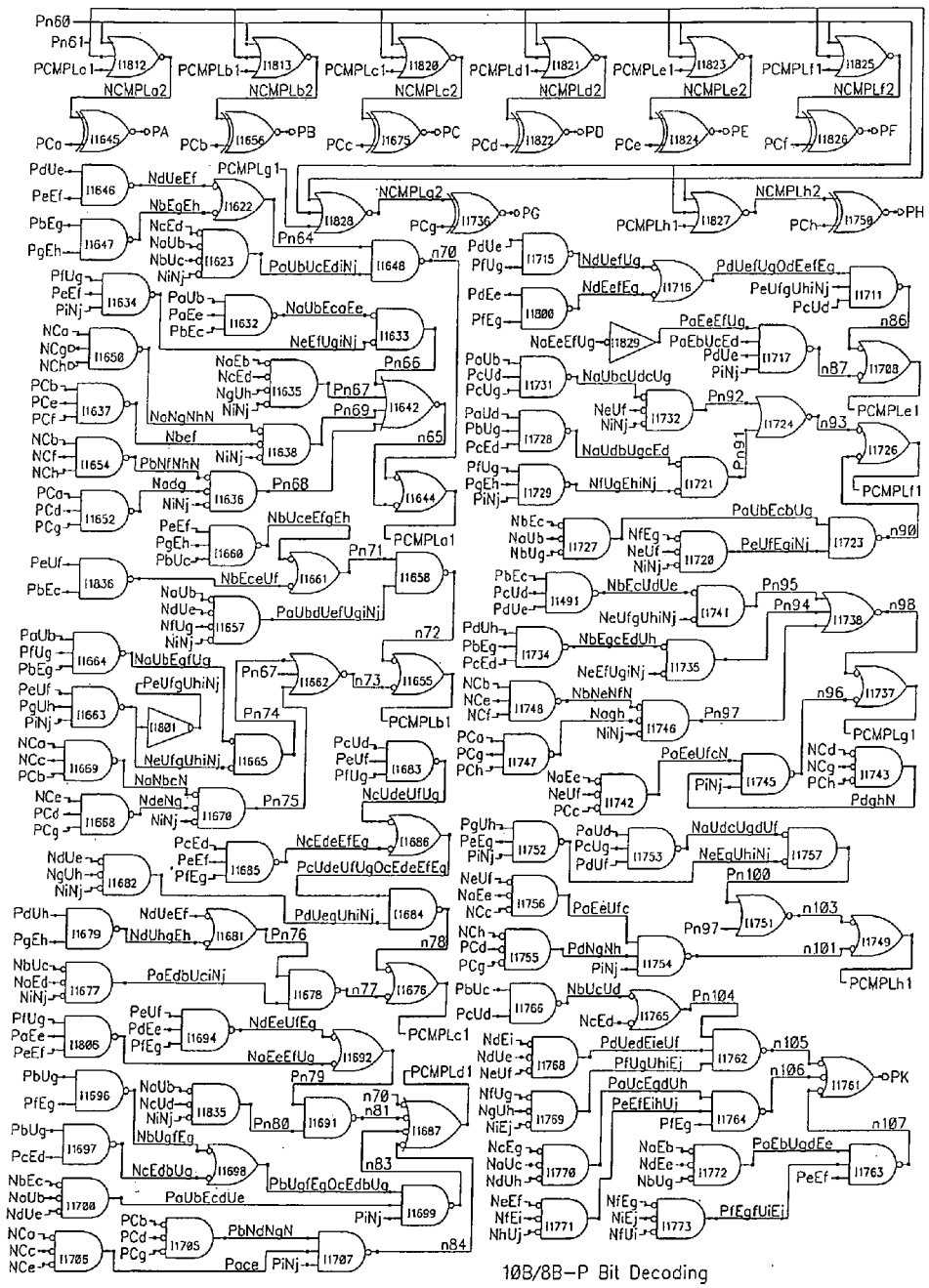

The block diagram for an exemplary decoding circuit with all inputs and outputs is shown in FIG. 63. A gate-level circuit diagram of the decoder is shown in. FIGS. 64A–C, representing a single circuit with net sharing. FIG. 64A shows the vector validity checks. The circuit which controls the vector complementation signal (COMPL10) is shown in FIG. 64B. The shared EXCLUSIVE OR functions of all 3 diagrams are shown at the right sides. Again, inverters can be substituted for some of these gates depending on speed requirements. FIG. 64C shows the implementation of the equations for the complementation of individual bits (a, b, c, d, e, f, g, h) to restore the original values (A, B, C, D, E, F, G, H). At the bottom right side, the control bit K is generated. At the top, the tailing two gating levels are shown for the eight data bits.

The decoder includes 275 gates. No logic path exceeds seven gates, all of the inverting type except some XOR gates. The VALID path can be reduced to six logic levels by replacing the inverter I1837 with a NAND3 gate, and the PK path is five logic levels.

For fast operation, the circuit presented has been structured for easy forward pipe-lining at the cost of a few extra gates similar to the encoding circuit. For a reduction to six logic levels in the first step, the eight trailing EXCLUSIVE OR functions generating the bits A through H at the top of FIG. 64C are moved into a second step, which requires an extra 16 latches plus two latches to align the PK and PVALID signals. For a reduction to five levels, the OR functions immediately before the XNOR and the trailing gate of the VALID path are also moved to the second step and the K-value is carried forward; this version of pipelining requires 23 extra latches. For a reduction of the first step to four gating levels, a total of 48 pipelining latches are required (12 for Valid, 7 for CMPL10, 3 for K, 18 for the inputs of the gates generating the signals PCMPLa1 through PCMPLh1, and 8 for the bits PCa thorough PCh).

Again, a further delay reduction to three levels can be accomplished by minor circuit modifications and moving the leading EXCLUSIVE OR functions into the preceding clock cycle which requires at most 23 extra latches with complementary outputs.

For verification purposes, a soft, technology independent macro was written in VHDL. The encoder generated all the expected outputs with correct disparity. The decoder restored all the original vector values. A random sequence of all possible 10-bit patterns applied to the decoder input identified all invalid inputs and correctly decoded the valid inputs.

Figure 65:
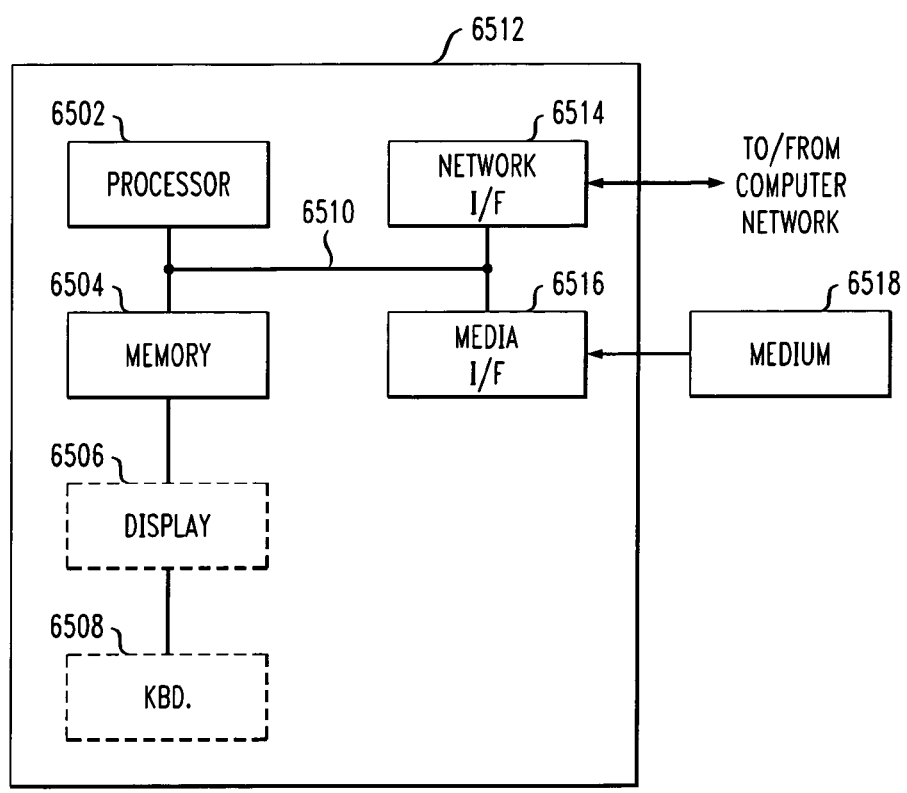
FIG. 65 is a system diagram of an exemplary computer system on which one or more embodiments of the present invention can be implemented.

As noted above, a variety of techniques utilizing dedicated hardware, general purpose processors, firmware, software, or a combination of the foregoing may be employed to implement the present invention, in addition to the preferred implementation in hardware using logic gates. With reference to FIG. 65, such alternate implementations might employ, for example, a processor 6502, a memory 6504, and an input/output interface formed, for example, by a display 6506 and a keyboard 6508. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (e.g., bard drive), a removable memory device (e.g., diskette), a flash memory and the like. In addition, the phrase "input/output interface" as used herein, is intended to include, for example, one or more mechanisms for inputting data to the processing unit (e.g., mouse), and one or more mechanisms for providing results associated with the processing unit (e.g., printer). The processor 6502, memory 6504, and input/output interface such as display 6506 and keyboard 6508 can be interconnected, for example, via bus 6510 as part of a data processing unit 6512. Suitable interconnections, for example via bus 6510, can also be provided to a network interface 6514, such as a network card, which can be provided to interface with a computer network, and to a media interface 6516, such as a diskette or CD-ROM drive, which can be provided to interface with medium 6518.

Accordingly, computer software including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU. Such software could include, but is not limited to, firmware, resident software, microcode, and the like. Note that implementations of one or more embodiments of the present invention involving software may take advantage of the potential for parallelism described above to employ, for example, a vectorized or parallelized solution.

Furthermore, the invention can take the form of a computer program product accessible from a computer-usable or computer-readable medium. (e.g., medium 6518) providing program code for use by or in connection with a computer or any instruction execution system. For the purposes of this description, a computer usable or computer readable medium can be any apparatus for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory (e.g. memory 6504), magnetic tape, a removable computer diskette (e.g. media 6518), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 6502 coupled directly or indirectly to memory elements 6504 through a system bus 6510. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 6508, displays 6506, pointing devices, and the like) can be coupled to the system either directly (such as via bus 6510) or through intervening I/O controllers (omitted for clarity).

Network adapters such as network interface 6514 may also be coupled to the system to enable the data processing system to become coupled to other data processing systems or remote printers or storage devices through intervening private or public networks. Modems, cable modem and Ethernet cards are just a few of the currently available types of network adapters.

In any case, it should be understood that the components illustrated herein may be implemented in various forms of hardware, software, or combinations thereof, e.g., application specific integrated circuit(s) (ASICS), functional circuitry, one or more appropriately programmed general purpose digital computers with associated memory, one or more programmable logic arrays (PLAs), combinational logic as described herein, and the like. Given the teachings of the invention provided herein, one of ordinary skill in the related art will be able to contemplate other implementations of the components of the invention. It should of course be noted that an encoding scheme can be implemented via a look-up table.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of encoding N-binary symbol (NB) source data vectors into M-binary symbol (MB) encoded vectors, $M>N>0$, comprising the steps of:

obtaining a plurality of NB source data vectors; and encoding said NB source data vectors into a plurality of MB encoded vectors according to an encoding scheme, said encoding scheme mapping at least a first portion of said NB source data vectors into MB encoded vectors comprising disparity independent encoded vectors, said encoding scheme mapping at least a second portion of said NB source data vectors into MB encoded vectors comprising disparity dependent encoded vectors having primary representations and alternate representations complementary to said primary representations, said MB encoded vectors having M-N binary symbols appended thereto by said encoding scheme, a fraction of said MB encoded vectors having binary symbol changes, other than whole-vector complementation, compared to corresponding ones of said NB source data vectors;

wherein said encoding scheme is preselected to perform at least one of:

(i) reducing, compared to at least some other possible NB to MB encoding schemes, and (ii) substantially eliminating an amount of said disparity dependent encoded vectors that fall within said fraction of said MB encoded vectors having said binary symbol changes, other than whole-vector complementation, compared to said corresponding ones of said NB source data vectors.

2. The method of claim 1, wherein $N=8$, $M=10$, and said encoding scheme substantially eliminates said amount of said disparity dependent encoded vectors that fall within said fraction of said MB encoded vectors having said binary symbol changes, other than whole-vector complementation, compared to said corresponding ones of said NB source data vectors.

3. The method of claim 2, wherein:
said encoding scheme produces a DC-balanced transmission code; and
said first portion of said NB source data vectors comprises at least 60 balanced source data vectors having a leading run-length no greater than 2 that are appended with a complementary pair of appended binary symbols, corresponding to said M-N binary symbols, when encoded into corresponding ones of said disparity independent encoded vectors.

4. The method of claim 3, wherein said fraction of said MB encoded vectors having binary symbol changes compared to said corresponding ones of said NB source data vectors correspond to those of said disparity independent encoded vectors having 8 binary symbols identical to said corresponding ones of said disparity independent encoded vectors and 2 binary symbols that are complements of said pair of appended binary symbols.

5. The method of claim 4, wherein:
said encoding scheme assigns a majority of said NB source data vectors corresponding to said fraction of said MB encoded vectors having binary symbol changes, in complementary pairs of said majority, to corresponding pairs of said disparity independent MB encoded vectors that are complementary in all binary symbol positions except said appended binary symbols;
said encoding scheme assigns at least eight vectors of said first portion of said NB source data vectors, having a leading run of four followed by two pairs of complementary binary symbols, to selected ones of said fraction of said MB encoded vectors having two leading binary symbols complemented with respect to corresponding ones of said eight vectors;
said encoding scheme assigns at least eight vectors of said first portion of said NB source data vectors, having a leading run of four followed by a single binary symbol in four subsequent binary symbols, where said single binary symbol matches binary symbols in said leading run of four, to selected ones of said fraction of said MB encoded vectors having a third binary symbol complemented with respect to corresponding ones of said eight vectors; and
said encoding scheme assigns at least eight vectors of said first portion of said NB source data vectors, having a leading run of four followed by a single binary symbol in four subsequent binary symbols, where said single binary symbol does not match binary symbols in said leading run of four, to selected ones of said fraction of said MB encoded vectors having a first, third and fourth binary symbols complemented with respect to corresponding ones of said eight vectors.

6. The method of claim 2, wherein:
said encoding scheme produces a DC-balanced transmission code;
said first portion of said NB source data vectors comprises:
27 source data vectors having an overall disparity of plus 2, and
27 source data vectors having an overall disparity of minus 2,
and having a running disparity of at most 2 after any given binary symbol position, that are appended with binary symbols 00, for those 27 source data vectors having an overall disparity of plus 2, and binary symbols 11, for those of said 27 source data vectors having an overall disparity of minus 2, when encoded into corresponding ones of said disparity independent encoded vectors; and
said second portion of said NB source data vectors comprises:
at least 19 source data vectors having a disparity of plus 2 and satisfying at least one of:
ending in binary symbols 11001;
starting with binary symbols 1110 and ending with binary symbol 1; and
ending with binary symbols 10 and having one of: (i) at most three leading ones, and (ii) at most one leading zero;
said 19 NB source data vectors being mapped to 19 disparity dependent balanced encoded vectors having a required negative starting disparity, said encoded vectors having binary symbols identical to said source data vectors with two zeroes appended thereto;
at least 4 balanced source data vectors starting with binary symbols 1110, said 4 balanced source data vectors starting with binary symbols 1110 being mapped to 4 disparity dependent balanced encoded vectors having a required negative starting disparity and having binary symbols identical to said 4 balanced source data vectors with binary symbols 01 appended thereto; and
at least 4 balanced source data vectors starting with binary symbols 0001, said 4 balanced source data vectors starting with binary symbols 0001 being mapped to 4 disparity dependent balanced encoded vectors having a required positive starting disparity and having binary symbols identical to said source data vectors with binary symbols 01 appended thereto.

7. The method of claim 6, wherein said second portion of said NB source data vectors further comprises:
at least 18 source data vectors having a disparity of plus 4 and satisfying one of:
trailing 4 binary symbols comprise a complementary pair of binary symbols followed by binary symbols 11;
trailing 4 bay symbols are 1111 and leading 4 binary symbols are one of: (i) two pairs of complementary binary symbols, and (ii) 1100;
leading binary symbol is 1 and trailing 4 binary symbols are 1101; and
leading two binary symbols are 1 and trailing 4 binary symbols are 1110;
said 18 NB source data vectors being mapped to 18 encoded vectors having a disparity of plus 4 and a required negative starting disparity, said encoded vectors having binary symbols identical to said 18 source data vectors with 01 appended thereto;
at least one source data vector in the form 11101111, said one source data vector being mapped to one encoded vector having a disparity of plus 4 and a required negative starting disparity, said encoded vector having the form 1110111100;
at least 21 vectors having a disparity of minus 2 and satisfying one of:
trailing 4 binary symbols comprise 01 followed by a pair of complementary binary symbols;
trailing binary symbols are one of 1001 and 11010;
leading binary symbol is 0 and trailing 4 binary symbols are 0011;
trailing 5 binary symbols are 10001; and
trailing 6 binary symbols are 100001;

said 21 NB source data vectors being mapped to 21 encoded vectors having a disparity of minus 4 and a required positive starting disparity, said 21 encoded vectors having binary symbols identical to said 21 source data vectors with binary symbols 00 appended thereto; and at least 15 vectors having a disparity of minus 4 and satisfying one of:

trailing 4 binary symbols comprise a pair of complementary binary symbols followed by binary symbols 00;

first binary symbol is 0 and last 5 binary symbols are 10000;

leading binary symbol is 0 and trailing 4 binary symbols are 0010; and leading two binary symbols are 00 and trailing 4 binary symbols are 0001;

said 15 NB source data vectors being mapped to 15 encoded vectors having a disparity of minus 4 and a required positive starting disparity, said 15 encoded vectors having binary symbols identical to said 15 source data vectors with binary symbols 01 appended thereto.

8. The method of claim 2, wherein:

said encoding scheme produces a DC-balanced transmission code; and said encoding scheme further assigns at least 7 NB vectors, as control vectors, to at least 7 MB disparity dependent corresponding encoded control vectors having primary representations and alternate representations complementary to said primary representations, said encoded control vectors comprising said 7 NB vectors plus two appended binary symbols, said primary representations of said 7 MD corresponding encoded control vectors satisfying at least one of:

(i) disparity equals minus four, (ii) required starting disparity is positive, (iii) third, fifth, sixth, seventh and ninth binary symbols have a value of zero and first binary symbol has a value of one, (iv) fourth and eighth binary symbols are complementary, and (v) eighth and tenth binary symbols are complementary;

(i) disparity equals minus four, (ii) required starting disparity is positive, (iii) fourth, sixth, eight, ninth and tenth binary symbols have a value of zero and fifth and seventh binary symbols have a value of one;

(i) disparity equals zero, (ii) required starting disparity is negative, (iii) first two binary symbols and last two binary symbols have a value of zero and third, fourth, fifth, sixth and seventh binary symbols have a value of one; and (i) disparity equals zero, (ii) required starting disparity is positive, (iii) first two binary symbols and last two binary symbols have a value of zero and fourth, firth, sixth and seventh and eighth binary symbols have a value of one.

9. The method of claim 8, wherein each of said 7 NB control vectors and each of said 7 MB corresponding encoded control vectors has a complementary alternate vector.

10. The method of claim 2, wherein:

said encoding scheme produces a DC-balanced transmission code; and said primary representations of said disparity dependent encoded vectors end with one of two 2-binary symbol patterns.

11. The method of claim 1, wherein said encoding step comprises the sub-steps of:

appending M-N binary symbols to said NB source data vectors to obtain augmented vectors;

complementing M binary symbols of a given one of said augmented vectors to obtain one of said alternate representations of one of said MB encoded vectors corresponding to a given one of said NB source data vectors, of said second portion of said NB source data vectors, from which said given one of said augmented vectors was obtained, said complementation of said M binary symbols being at least in part responsive to a determination that said one of said MB encoded vectors comprises one of said disparity dependent encoded vectors and a current running disparity does not match a required starting disparity for said one of said MB encoded vectors; and complementing less than N binary symbols of another given one of said NB source data vectors to obtain a corresponding portion of another given one of said MB encoded vectors corresponding to said other given one of said NB source data vectors, said complementation of said less than N binary symbols being at least in part responsive to a determination that said other given one of said MB encoded vectors comprises one of said disparity-independent encoded vectors, said less than N binary symbol complementing and said N binary symbol complementing steps being performed substantially in parallel.

12. A method of decoding M-binary symbol (MB) encoded vectors into decoded N-binary symbol (NB) source data vectors, M>N>0, comprising the steps of:

obtaining a plurality of MB encoded vectors that were encoded from a plurality of NB source data vectors according to an encoding scheme, said encoding scheme mapping at least a first portion of said NB source data vectors into MB encoded vectors comprising disparity independent encoded vectors, said encoding scheme mapping at least a second portion of said NB source data vectors into MB encoded vectors comprising disparity dependent encoded vectors having primary representations and alternate representations complementary to said primary representations, said MB encoded vectors having M-N binary symbols appended thereto by said encoding scheme, a fraction of said MB encoded vectors having binary symbol changes, other than whole-vector complementation, compared to corresponding ones of said NB source data vectors, said encoding scheme being preselected to perform at least one of:

(i) reducing, compared to at least some other possible NB to MB encoding schemes, and (ii) substantially eliminating an amount of said disparity dependent encoded vectors that fall within said fraction of said MB encoded vectors having said binary symbol changes, other than whole-vector complementation, compared to said corresponding ones of said NB source data vectors; and decoding said MB encoded vectors into a plurality of NB source data vectors according to decoding rules of said encoding scheme.

13. The method of claim 12, wherein N=8, M=10, and said encoding scheme substantially eliminates said amount of said disparity dependent encoded vectors that fall within said fraction of said MB encoded vectors having said binary symbol changes, other than whole-vector complementation, compared to said corresponding ones of said NB source data vectors.

14. The method of claim 13, wherein:
said encoding scheme produces a DC-balanced transmission code; and
said primary representations of said disparity dependent encoded vectors end with one of two 2-binary symbol patterns.

15. The method of claim 12, wherein said decoding step comprises the sub-steps of:
complementing at least N binary symbols of a given one of said MB encoded vectors to recover a given one of said NB source data vectors, of said second portion of said NB source data vectors, corresponding to said given one of said MB encoded vectors, said complementation of said at least N binary symbols being at least in part responsive to a determination that said given one of said MB encoded vectors comprises one of said alternate versions of one of said disparity-dependent encoded vectors; and
complementing less than N binary symbols of another given one of said MB encoded vectors to recover a corresponding portion of another given one of said NB source data vectors, of said first portion of said NB source data vectors, corresponding to said other given one of said MB encoded vectors, said complementation of said less than N binary symbols being at least in part responsive to a determination that said other given one of said MB encoded vectors comprises one of said disparity-independent encoded vectors, said less than N binary symbol complementing and said N binary symbol complementing being performed substantially in parallel.

16. An apparatus for encoding N-binary symbol (NB) source data vectors into M-binary symbol (MB) encoded vectors, M>N>0, at least some of said MB encoded vectors comprising disparity-dependent encoded vectors having primary representations and alternate representations complementary to said primary representations, said apparatus comprising:
a binary symbol appending module configured to append M-N binary symbols to said NB source data vectors to obtain augmented vectors;
a full vector complementing module configured to complement M binary symbols of a given one of said augmented vectors to obtain one of said alternate representations of one of said MB encoded vectors corresponding to a given one of said NB source data vectors from which said given one of said augmented vectors was obtained, said complementation of said M binary symbols being at least in part responsive to a determination that said one of said MB encoded vectors comprises one of said disparity dependent encoded vectors and a current running disparity does not match a required starting disparity for said one of said MB encoded vectors; and
a binary symbol complementing module configured to complement less than N binary symbols of another given one of said NB source data vectors to obtain a corresponding portion of another given one of said MB encoded vectors corresponding to said other given one of said NB source data vectors, said complementation of said less than N binary symbols being at least in part responsive to a determination that said other given one of said MB encoded vectors comprises a disparity-independent encoded vector, said binary symbol complementing module and said full vector complementing module being configured to operate substantially in parallel, said binary symbol complementing module and said full vector complementing module being coupled to each other and being configured to implement an encoding scheme wherein, in assignment of MB encoded vectors having binary symbol changes compared to corresponding ones of said NB source data vectors, preference is given to MB encoded vectors that are balanced and disparity-independent.

17. The apparatus of claim 16, wherein N=8, M=10, and said encoding scheme assigns substantially all of said MB encoded vectors having binary symbol changes compared to corresponding ones of said NB source data vectors to MB encoded vectors that are balanced and disparity independent.

18. The apparatus of claim 16, further comprising a disparity monitoring module coupled to said full vector complementing module, said disparity classifier being configured to determine current running disparity for use in assigning proper ones of said disparity dependent encoded vectors to given ones of said NB source data vectors.

19. The apparatus of claim 16, wherein said apparatus is implemented as an array of logic gates.

20. An apparatus for decoding M-binary symbol (MB) encoded vectors into N-binary symbol (NB) source data vectors, M>N>0, at least some of said MB encoded vectors comprising disparity-dependent encoded vectors having primary representations and alternate representations complementary to said primary representations, said apparatus comprising:
a full vector complementing module configured to complement at least N binary symbols of a given one of said MB encoded vectors to recover a given one of said NB source data vectors corresponding to said given one of said MB encoded vectors, said complementation of said at least N binary symbols being at least in part responsive to a determination that said given one of said MB encoded vectors comprises one of said alternate versions of one of said disparity-dependent encoded vectors; and
a binary symbol complementing module coupled to said full vector complementing module and configured to complement less than N binary symbols of another given one of said MB encoded vectors to recover a corresponding portion of another given one of said NB source data vectors corresponding to said other given one of said MB encoded vectors, said complementation of said less than N binary symbols being at least in part responsive to a determination that said other given one of said MB encoded vectors comprises a disparity-independent encoded vector, said binary symbol complementing module and said full vector complementing module being configured to operate substantially in parallel, said binary symbol complementing module and said full vector complementing module being configured to implement an encoding scheme wherein, in assignment of MB encoded vectors having binary symbol changes compared to corresponding ones of said NB source data vectors, preference is given to MB encoded vectors that are balanced and disparity-independent.

21. The apparatus of claim 20, further comprising a validity check module coupled to said full vector complementing module and said binary symbol complementing module, said validity checker being configured to obtain putative encoded vectors and to determine whether given ones of said putative encoded vectors are valid ones of said MB encoded vectors.

22. The apparatus of claim 20, wherein N=8, M=10, and said encoding scheme assigns substantially all of said MB encoded vectors having binary symbol changes compared to corresponding ones of said NB source data vectors to MB encoded vectors that are balanced and disparity independent.

23. The apparatus of claim 20, wherein said apparatus is implemented as an array of logic gates.

24. A method for encoding N-binary symbol (NB) source data vectors into M-binary symbol (MB) encoded vectors, M>N>0, at least some of said MB encoded vectors comprising disparity-dependent encoded vectors having primary representations and alternate representations complementary to said primary, said method comprising the steps of:
  appending M-N binary symbols to said NB source data vectors to obtain augmented vectors;
  complementing M binary symbols of a given one of said augmented vectors to obtain one of said alternate representations of one of said NB encoded vectors corresponding to a given one of said NB source data vectors from which said given one of said augmented vectors was obtained, said complementation of said M binary symbols being at least in part responsive to a determination that said one of said MB encoded vectors comprises one of said disparity dependent encoded vectors and a current running disparity does not match a required starting disparity for said one of said MB encoded vectors; and
  complementing less than N binary symbols of another given one of said NB source data vectors to obtain a corresponding portion of another given one of said MB encoded vectors corresponding to said other given one of said NB source data vectors, said complementation of said less than N binary symbols being at least in part responsive to a determination that said other given one of said MB encoded vectors comprises a disparity-independent encoded vector, said less than N binary symbol complementing and said N binary symbol complementing steps being performed substantially in parallel and implementing an encoding scheme wherein, in assignment of MB encoded vectors having binary symbol changes compared to corresponding ones of said NB source data vectors, preference is given to MB encoded vectors that are balanced and disparity-independent.

25. The method of claim 24, wherein N=8, M=10, and said encoding scheme assigns substantially all of said MB encoded vectors having binary symbol changes compared to corresponding ones of said NB source data vectors to MB encoded vectors that are balanced and disparity independent.

26. A method for decoding M-binary symbol (MB) encoded vectors into N-binary symbol (NB) source data vectors, M>N>0, at least some of said MB encoded vectors comprising disparity-dependent encoded vectors having primary representations and alternate representations complementary to said primary representations, said method comprising:
  complementing at least N binary symbols of a given one of said MB encoded vectors to recover a given one of said NB source data vectors corresponding to said given one of said MB encoded vectors, said complementation of said at least N binary symbols being at least in part responsive to a determination that said given one of said MB encoded vectors comprises one of said alternate versions of one of said disparity-dependent encoded vectors; and
  complementing less than N binary symbols of another given one of said MB encoded vectors to recover a corresponding portion of another given one of said NB source data vectors corresponding to said other given one of said MB encoded vectors, said complementation of said less than N binary symbols being at least in part responsive to a determination that said other given one of said NB encoded vectors comprises a disparity-independent encoded vector, said less than N binary symbol complementing and said N binary symbol complementing being performed substantially in parallel and implementing an encoding scheme wherein, in assignment of MB encoded vectors having binary symbol changes compared to corresponding ones of said NB source data vectors, preference is given to MB encoded vectors that are balanced and disparity-independent.

27. The method of claim 26, wherein N=8, M=10, and said encoding scheme assigns substantially all of said MB encoded vectors having binary symbol changes compared to corresponding ones of said NB source data vectors to MB encoded vectors that are balanced and disparity independent.

28. A computer program product comprising a computer useable medium including computer usable program code for encoding N-binary symbol (NB) source data vectors into M-binary symbol (MB) encoded vectors, M>N>0, said computer program product including:
  computer usable program code for obtaining a plurality of NB source data vectors; and
  computer usable program code for encoding said NB source data vectors into a plurality of MB encoded vectors according to an encoding scheme, said encoding scheme mapping at least a first portion of said NB source data vectors into MB encoded vectors comprising disparity independent encoded vectors, said encoding scheme mapping at least a second portion of said NB source data vectors into MB encoded vectors comprising disparity dependent encoded vectors having primary representations and alternate representations complementary to said primary representations, said MB encoded vectors having M-N binary symbols appended thereto by said encoding scheme, a fraction of said MB encoded vectors having binary symbol changes, other than whole-vector complementation, compared to corresponding ones of said NB source data vectors;
  wherein said encoding scheme is preselected to perform at least one of:
    (i) reducing, compared to at least some other possible NB to MB encoding schemes, and
    (ii) substantially eliminating
  an amount of said disparity dependent encoded vectors that fall within said fraction of said MB encoded vectors having said binary symbol changes, other than whole-vector complementation, compared to said corresponding ones of said NB source data vectors.

29. A computer program product comprising a computer useable medium including computer usable program code for decoding M-binary symbol (MB) encoded vectors into decoded N-binary symbol (NB) source data vectors, M>N>0, said computer program product including:
  computer usable program code for obtaining a plurality of MB encoded vectors that were encoded from a plurality of NB source data vectors according to an encoding scheme, said encoding scheme mapping at least a first portion of said NB source data vectors into MB encoded vectors comprising disparity independent encoded vectors, said encoding scheme mapping at least a second portion of said NB source data vectors into MB encoded vectors comprising disparity dependent encoded vectors having primary representations and alternate representations complementary to said primary representations, said MB encoded vectors having M-N binary symbols appended thereto by said encoding scheme, a fraction of said MB encoded vectors having binary symbol changes, other than whole-vector complementation, compared to corresponding ones of said NB source data vectors, said encoding scheme being preselected to perform at least one of:

(i) reducing, compared to at least some other possible NB to MB encoding schemes, and (ii) substantially eliminating an amount of said disparity dependent encoded vectors that fall within said fraction of said MB encoded vectors having said binary symbol changes, other than whole-vector complementation, compared to said corresponding ones of said NB source data vectors; and computer usable program code for decoding said MB encoded vectors into a plurality of NB source data vectors according to decoding rules of said encoding scheme.

* * * * *